United States Patent
Asenjo et al.

(10) Patent No.: US 11,295,047 B2
(45) Date of Patent: *Apr. 5, 2022

(54) USING CLOUD-BASED DATA FOR INDUSTRIAL SIMULATION

(71) Applicant: Rockwell Automation Technologies, Inc., Mayfield Heights, OH (US)

(72) Inventors: Juan Asenjo, Timberlake, OH (US); John Strohmenger, Strongsville, OH (US); Stephen Nawalaniec, Southlake, TX (US); Bradford H. Hegrat, Montville, OH (US); Joseph A. Harkulich, Willoughby, OH (US); Jessica Lin Korpela, Milwaukee, WI (US); Jenifer Rydberg Wright, Renton, WA (US); Rainer Hessmer, Rancho Santa Margarita, CA (US); John Dyck, Chardon, OH (US); Edward Alan Hill, Chagrin Falls, OH (US); Sal Conti, Olmsted Township, OH (US)

(73) Assignee: Rockwell Automation Technologies, Inc., Mayfield Heights, OH (US)

(*) Notice: Subject to any disclaimer, the term of this patent is extended or adjusted under 35 U.S.C. 154(b) by 506 days.

This patent is subject to a terminal disclaimer.

(21) Appl. No.: 16/234,039

(22) Filed: Dec. 27, 2018

(65) Prior Publication Data
US 2019/0130057 A1    May 2, 2019

Related U.S. Application Data

(63) Continuation of application No. 15/599,921, filed on May 19, 2017, now Pat. No. 10,204,191, which is a
(Continued)

(51) Int. Cl.
*G06F 30/20* (2020.01)
*G06Q 10/06* (2012.01)

(52) U.S. Cl.
CPC ............ *G06F 30/20* (2020.01); *G06Q 10/06* (2013.01); *Y02P 90/80* (2015.11)

(58) Field of Classification Search
CPC .... G06Q 10/05; G06Q 10/06; G05B 19/4185; G06F 3/0484; G06F 3/048
See application file for complete search history.

(56) References Cited

U.S. PATENT DOCUMENTS

| 5,014,317 A | 5/1991 | Kita et al. |
| 5,122,948 A | 6/1992 | Zapolin |

(Continued)

FOREIGN PATENT DOCUMENTS

| CN | 1232553 A | 10/1999 |
| CN | 1529837 A | 9/2004 |

(Continued)

OTHER PUBLICATIONS

Notice of Allowance received for U.S. Appl. No. 15/714,333 dated Dec. 17, 2020, 59 pages.

(Continued)

*Primary Examiner* — Thai Q Phan
(74) *Attorney, Agent, or Firm* — Amin, Turocy & Watson, LLP

(57) ABSTRACT

A cloud-based simulation generation service collects industrial data from multiple industrial customers for storage and analysis on a cloud platform. The service employs a simulation generator component that analyzes data to facilitate generating a simulation model that simulates an industrial automation system, including simulating or emulating industrial devices, industrial processes, other industrial assets, or network-related assets or devices, and their respec- (Continued)

tive interrelationships with each other. The simulation generator component also analyzes modification data to facilitate generating a modified simulation model that simulates the industrial automation system based on the modification. The simulation generator component performs operation simulations using the simulation model or modified simulation model to facilitate determining whether making the modification is appropriate, determining or predicting performance of a modified industrial automation system, determining compatibility of a modification with an industrial automation system, or determining or predicting performance of the industrial automation system when processing a work order.

20 Claims, 19 Drawing Sheets

Related U.S. Application Data continuation of application No. 14/087,835, filed on Nov. 22, 2013, now Pat. No. 9,703,902.

(60) Provisional application No. 61/821,639, filed on May 9, 2013.

(56) References Cited

U.S. PATENT DOCUMENTS

| | | | |
|---|---|---|---|
| 5,199,009 A | 3/1993 | Svast | |
| 5,598,572 A | 1/1997 | Tanikoshi et al. | |
| 5,611,059 A | 3/1997 | Benton et al. | |
| 5,612,869 A | 3/1997 | Letzt et al. | |
| 5,682,460 A | 10/1997 | Hyziak et al. | |
| 5,710,885 A | 1/1998 | Bondi | |
| 5,844,794 A | 12/1998 | Keeley | |
| 5,845,149 A | 12/1998 | Husted et al. | |
| 5,856,931 A | 1/1999 | McCasland | |
| 5,957,985 A | 9/1999 | Wong et al. | |
| 5,966,301 A | 10/1999 | Cook et al. | |
| 5,970,430 A | 10/1999 | Burns et al. | |
| 5,978,568 A | 11/1999 | Abraham et al. | |
| 6,167,337 A | 12/2000 | Haack et al. | |
| 6,175,770 B1 | 1/2001 | Bladow | |
| 6,175,801 B1 | 1/2001 | Millington | |
| 6,199,068 B1 | 3/2001 | Carpenter | |
| 6,279,113 B1 | 8/2001 | Vaidya | |
| 6,282,455 B1 | 8/2001 | Engdahl | |
| 6,324,607 B1 | 11/2001 | Korowitz et al. | |
| 6,381,502 B1 | 4/2002 | Rudder et al. | |
| 6,400,996 B1 | 6/2002 | Hoffberg et al. | |
| 6,412,032 B1 | 6/2002 | Neet et al. | |
| 6,437,692 B1 | 8/2002 | Petite et al. | |
| 6,457,024 B1 | 9/2002 | Felsentein et al. | |
| 6,463,338 B1 | 10/2002 | Neet | |
| 6,466,972 B1 | 10/2002 | Paul et al. | |
| 6,529,780 B1 | 3/2003 | Soergel et al. | |
| 6,535,926 B1 | 3/2003 | Esker | |
| 6,578,005 B1 | 6/2003 | Lesaint et al. | |
| 6,624,388 B1 | 9/2003 | Blankenship et al. | |
| 6,640,145 B2 | 10/2003 | Hoffberg et al. | |
| 6,651,062 B2 | 11/2003 | Ghannam et al. | |
| 6,675,226 B1 | 1/2004 | Nair et al. | |
| 6,686,838 B1 | 2/2004 | Rezvani et al. | |
| 6,691,159 B1 | 2/2004 | Grewal et al. | |
| 6,705,229 B2 | 3/2004 | Frankenberger | |
| 6,708,074 B1 | 3/2004 | Chi et al. | |
| 6,708,385 B1 | 3/2004 | Lemelson | |
| 6,714,974 B1 | 3/2004 | Machida | |
| 6,728,262 B1 | 4/2004 | Woram | |
| 6,732,165 B1 | 5/2004 | Jennings, III | |
| 6,732,191 B1 | 5/2004 | Baker et al. | |
| 6,757,897 B1 | 6/2004 | Shi et al. | |
| 6,774,598 B1 | 8/2004 | Kohler et al. | |
| 6,801,920 B1 | 10/2004 | Wischinski | |
| 6,819,960 B1 | 11/2004 | McKelvey et al. | |
| 6,891,850 B1 | 5/2005 | Vandesteeg et al. | |
| 6,895,532 B2 | 5/2005 | Raynham | |
| 6,904,600 B1 | 6/2005 | James et al. | |
| 6,907,302 B2 | 6/2005 | Karbassi | |
| 6,920,502 B2 | 7/2005 | Araujo et al. | |
| 6,952,680 B1 | 10/2005 | Melby et al. | |
| 6,965,802 B2 | 11/2005 | Sexton | |
| 6,968,242 B1 | 11/2005 | Hwu et al. | |
| 6,970,913 B1 | 11/2005 | Albert et al. | |
| 6,982,953 B1 | 1/2006 | Swales | |
| 7,032,045 B2 | 4/2006 | Kostadinov | |
| 7,085,814 B1 | 8/2006 | Gandhi et al. | |
| 7,103,428 B2 | 9/2006 | Varone et al. | |
| 7,133,900 B1 | 11/2006 | Szeto | |
| 7,149,792 B1 | 12/2006 | Hansen et al. | |
| 7,151,966 B1 | 12/2006 | Baier et al. | |
| 7,203,560 B1 | 4/2007 | Wylie et al. | |
| 7,210,095 B1 | 4/2007 | Mor | |
| 7,233,830 B1 | 6/2007 | Callaghan et al. | |
| 7,242,009 B1 | 7/2007 | Wilson et al. | |
| 7,275,037 B2 | 9/2007 | Lauer | |
| 7,277,865 B1 | 10/2007 | Silverstone et al. | |
| 7,289,994 B2 | 10/2007 | Nixon et al. | |
| 7,298,275 B2 | 11/2007 | Brandt et al. | |
| 7,310,344 B1 | 12/2007 | Sue | |
| 7,383,155 B2 | 6/2008 | Rosam et al. | |
| 7,412,548 B2 | 8/2008 | Sichner | |
| 7,428,495 B2 | 9/2008 | Dhar et al. | |
| 7,478,010 B2 | 1/2009 | Hashemian | |
| 7,480,728 B2 | 1/2009 | Evans | |
| 7,539,724 B1 | 5/2009 | Callaghan | |
| 7,734,590 B2 | 6/2010 | Chand et al. | |
| 7,827,122 B1 | 11/2010 | Campbell, Jr. et al. | |
| 7,831,317 B2 | 11/2010 | McGreevy et al. | |
| 8,150,959 B1 | 4/2012 | Bezdicek et al. | |
| 8,266,066 B1 | 9/2012 | Wezter et al. | |
| 8,353,012 B2 | 1/2013 | Del Real | |
| 8,392,845 B2 | 3/2013 | Cahill et al. | |
| 8,451,753 B2 | 5/2013 | Vanga et al. | |
| 8,468,272 B2 | 6/2013 | Giroti | |
| 8,484,250 B2 | 7/2013 | Chand et al. | |
| 8,686,871 B2 | 4/2014 | Jensen et al. | |
| 8,914,300 B2 | 12/2014 | Sustaeta et al. | |
| 8,924,328 B1 | 12/2014 | Kozlovsky et al. | |
| 9,024,955 B2 | 5/2015 | Ramarao et al. | |
| 9,117,076 B2 | 8/2015 | Devost | |
| 9,438,648 B2 | 9/2016 | Asenjo et al. | |
| 9,507,807 B1 | 11/2016 | Florissi et al. | |
| 9,685,053 B2 | 6/2017 | Palmeri | |
| 9,690,669 B2 | 6/2017 | Bernal et al. | |
| 9,703,902 B2 * | 7/2017 | Asenjo | G06Q 10/06 |
| 9,709,978 B2 * | 7/2017 | Asenjo | G05B 19/4185 |
| 10,026,049 B2 | 7/2018 | Asenjo et al. | |
| 10,054,914 B2 | 8/2018 | Vartiainen et al. | |
| 2001/0035729 A1 | 11/2001 | Graiger et al. | |
| 2002/0004798 A1 | 1/2002 | Babula et al. | |
| 2002/0016839 A1 | 2/2002 | Smith et al. | |
| 2002/0042756 A1 | 4/2002 | Kumar et al. | |
| 2002/0046239 A1 | 4/2002 | Stawikowski et al. | |
| 2002/0049833 A1 | 4/2002 | Kikinis | |
| 2002/0065898 A1 | 5/2002 | Leontiev et al. | |
| 2002/0068983 A1 | 6/2002 | Sexton | |
| 2002/0068984 A1 | 6/2002 | Alexander et al. | |
| 2002/0073236 A1 | 6/2002 | Helgeson et al. | |
| 2002/0077711 A1 | 6/2002 | Nixon et al. | |
| 2002/0078432 A1 | 6/2002 | Charisius et al. | |
| 2002/0082966 A1 | 6/2002 | O'Brien et al. | |
| 2002/0094588 A1 | 7/2002 | Fan et al. | |
| 2002/0096077 A1 | 7/2002 | Frankenberger | |
| 2002/0107904 A1 | 8/2002 | Talluri et al. | |
| 2002/0138378 A1 | 9/2002 | Leskuski | |
| 2002/0156872 A1 | 10/2002 | Brown | |
| 2002/0156926 A1 | 10/2002 | Batke et al. | |
| 2002/0161745 A1 | 10/2002 | Call | |
| 2002/0169993 A1 | 11/2002 | Woods et al. | |
| 2003/0004937 A1 | 1/2003 | Salmenkaita et al. | |
| 2003/0009253 A1 | 1/2003 | McIntyre et al. | |

(56) References Cited

U.S. PATENT DOCUMENTS

| | | |
|---|---|---|
| 2003/0009572 A1 | 1/2003 | Thurner |
| 2003/0011467 A1 | 1/2003 | Suomela |
| 2003/0014149 A1 | 1/2003 | Kreidler et al. |
| 2003/0023336 A1 | 1/2003 | Kreidler et al. |
| 2003/0033179 A1 | 2/2003 | Katz et al. |
| 2003/0041089 A1 | 2/2003 | Mauro |
| 2003/0051074 A1 | 3/2003 | Edwards |
| 2003/0056224 A1 | 3/2003 | Stone |
| 2003/0069002 A1 | 4/2003 | Hunter et al. |
| 2003/0084016 A1 | 5/2003 | Norgaard et al. |
| 2003/0105535 A1 | 6/2003 | Rammler |
| 2003/0105585 A1 | 6/2003 | Ukita |
| 2003/0109942 A1 | 6/2003 | Yeh et al. |
| 2003/0120817 A1 | 6/2003 | Ott et al. |
| 2003/0150908 A1 | 8/2003 | Pokorny et al. |
| 2003/0156639 A1 | 8/2003 | Liang |
| 2003/0167238 A1 | 9/2003 | Zeif |
| 2003/0167449 A1 | 9/2003 | Warren et al. |
| 2003/0177169 A1 | 9/2003 | Nutt et al. |
| 2003/0177201 A1 | 9/2003 | Shen |
| 2003/0183456 A1 | 10/2003 | Hatzor |
| 2003/0198188 A1 | 10/2003 | Castlebury et al. |
| 2003/0208545 A1 | 11/2003 | Eaton et al. |
| 2003/0217100 A1 | 11/2003 | Kronk |
| 2003/0224769 A1 | 12/2003 | Solve et al. |
| 2003/0236576 A1 | 12/2003 | Resnick et al. |
| 2004/0024572 A1 | 2/2004 | Pagnano et al. |
| 2004/0025173 A1 | 2/2004 | Levonai et al. |
| 2004/0032935 A1 | 2/2004 | Mills et al. |
| 2004/0083165 A1 | 4/2004 | Lawrence |
| 2004/0111512 A1 | 6/2004 | Barth |
| 2004/0148039 A1 | 7/2004 | Farchmin et al. |
| 2004/0148187 A1 | 7/2004 | Boettcher et al. |
| 2004/0148383 A1 | 7/2004 | Gonsalves et al. |
| 2004/0159113 A1 | 8/2004 | Singh et al. |
| 2004/0199573 A1 | 10/2004 | Schwartz et al. |
| 2004/0203895 A1 | 10/2004 | Balasuriya |
| 2004/0214566 A1 | 10/2004 | Suzuki et al. |
| 2004/0215551 A1 | 10/2004 | Eder |
| 2004/0225629 A1 | 11/2004 | Eder |
| 2004/0267729 A1 | 12/2004 | Swaminathan et al. |
| 2005/0005093 A1 | 1/2005 | Bartels et al. |
| 2005/0021158 A1 | 1/2005 | De meyer et al. |
| 2005/0038528 A1 | 2/2005 | McKelvey et al. |
| 2005/0055429 A1 | 3/2005 | Abele et al. |
| 2005/0080799 A1 | 4/2005 | Harnden et al. |
| 2005/0091410 A1 | 4/2005 | Gibart et al. |
| 2005/0120112 A1 | 6/2005 | Wing et al. |
| 2005/0125441 A1 | 6/2005 | Clemens et al. |
| 2005/0137735 A1 | 6/2005 | Loy et al. |
| 2005/0149922 A1 | 7/2005 | Vincent |
| 2005/0203869 A1 | 9/2005 | Minamino et al. |
| 2005/0209902 A1 | 9/2005 | Iwasaki et al. |
| 2005/0257204 A1 | 11/2005 | Bryant et al. |
| 2005/0278441 A1 | 12/2005 | Bond et al. |
| 2006/0022048 A1 | 2/2006 | Johnson |
| 2006/0026193 A1 | 2/2006 | Hood |
| 2006/0046712 A1 | 3/2006 | Shamp et al. |
| 2006/0077095 A1 | 4/2006 | Tucker et al. |
| 2006/0078859 A1 | 4/2006 | Mullin |
| 2006/0149813 A1 | 7/2006 | Janik |
| 2006/0153089 A1 | 7/2006 | Silverman |
| 2006/0173873 A1 | 8/2006 | Prompt et al. |
| 2006/0190106 A1 | 8/2006 | Kay et al. |
| 2006/0236374 A1 | 10/2006 | Hartman |
| 2006/0253205 A1 | 11/2006 | Gardiner |
| 2006/0259154 A1 | 11/2006 | Hood et al. |
| 2006/0259472 A1 | 11/2006 | MacClellan |
| 2006/0282432 A1 | 12/2006 | Cassidy et al. |
| 2007/0008129 A1 | 1/2007 | Soliman |
| 2007/0019641 A1 | 1/2007 | Pai et al. |
| 2007/0021968 A1 | 1/2007 | Amir et al. |
| 2007/0050206 A1 | 3/2007 | Whikehart et al. |
| 2007/0061018 A1 | 3/2007 | Callaghan et al. |
| 2007/0073850 A1 | 3/2007 | Callaghan et al. |
| 2007/0078525 A1 | 4/2007 | Chand |
| 2007/0078536 A1 | 4/2007 | Gordon et al. |
| 2007/0078537 A1 | 4/2007 | Chand et al. |
| 2007/0078736 A1 | 4/2007 | Chand et al. |
| 2007/0078862 A1 | 4/2007 | Chand et al. |
| 2007/0095907 A1 | 5/2007 | Robinson et al. |
| 2007/0112801 A1 | 5/2007 | McGreevy et al. |
| 2007/0118560 A1 | 5/2007 | Bomhoevd et al. |
| 2007/0130112 A1 | 6/2007 | Lin |
| 2007/0168057 A1 | 7/2007 | Blevins et al. |
| 2007/0192213 A1 | 8/2007 | Wu et al. |
| 2007/0194097 A1 | 8/2007 | Jones et al. |
| 2007/0213989 A1 | 9/2007 | Cooksy et al. |
| 2007/0244892 A1 | 10/2007 | Narancic |
| 2007/0245169 A1 | 10/2007 | Farchmin et al. |
| 2007/0247789 A1 | 10/2007 | Benson et al. |
| 2007/0255431 A1 | 11/2007 | Kinsey |
| 2008/0004739 A1 | 1/2008 | Varadhan et al. |
| 2008/0027704 A1 | 1/2008 | Kephart et al. |
| 2008/0049013 A1 | 2/2008 | Nasle |
| 2008/0065243 A1 | 3/2008 | Fallman et al. |
| 2008/0077512 A1 | 3/2008 | Grewal |
| 2008/0082186 A1 | 4/2008 | Hood et al. |
| 2008/0109099 A1 | 5/2008 | Moshier |
| 2008/0125887 A1 | 5/2008 | Case |
| 2008/0155064 A1 | 6/2008 | Kosuge et al. |
| 2008/0162688 A1 | 7/2008 | Reumann et al. |
| 2008/0189637 A1 | 8/2008 | Krajewski et al. |
| 2008/0208365 A1 | 8/2008 | Grgic et al. |
| 2008/0209211 A1 | 8/2008 | Grgic et al. |
| 2008/0214104 A1 | 9/2008 | Baumert et al. |
| 2008/0263514 A1 | 10/2008 | DeMesa et al. |
| 2008/0303472 A1 | 12/2008 | John et al. |
| 2009/0024440 A1 | 1/2009 | Spahn |
| 2009/0037378 A1 | 2/2009 | Moor et al. |
| 2009/0037872 A1 | 2/2009 | Schnabele et al. |
| 2009/0063258 A1 | 3/2009 | Mueller et al. |
| 2009/0065578 A1 | 3/2009 | Peterson et al. |
| 2009/0070163 A1 | 3/2009 | Angell et al. |
| 2009/0083204 A1 | 3/2009 | Baier et al. |
| 2009/0086692 A1 | 4/2009 | Chen |
| 2009/0088875 A1 | 4/2009 | Baier et al. |
| 2009/0089032 A1 | 4/2009 | Sturrock et al. |
| 2009/0089233 A1 | 4/2009 | Gach et al. |
| 2009/0089359 A1 | 4/2009 | Siorek et al. |
| 2009/0089682 A1 | 4/2009 | Baier et al. |
| 2009/0109889 A1 | 4/2009 | Budampati et al. |
| 2009/0125460 A1 | 5/2009 | Hewison et al. |
| 2009/0127325 A1 | 5/2009 | Macurek et al. |
| 2009/0132458 A1 | 5/2009 | Edwards et al. |
| 2009/0182689 A1 | 7/2009 | Chiles et al. |
| 2009/0204234 A1 | 8/2009 | Sustaeta et al. |
| 2009/0210071 A1 | 8/2009 | Agrusa et al. |
| 2009/0210814 A1 | 8/2009 | Agrusa et al. |
| 2009/0216341 A1 | 8/2009 | Enkerud et al. |
| 2009/0265157 A1 | 10/2009 | Piepenbrock et al. |
| 2009/0300151 A1 | 12/2009 | Friedman et al. |
| 2009/0316977 A1 | 12/2009 | Juncker et al. |
| 2009/0319831 A1 | 12/2009 | Kruchinin et al. |
| 2010/0010859 A1 | 1/2010 | Ratakonda et al. |
| 2010/0023562 A1 | 1/2010 | Kreuch et al. |
| 2010/0057660 A1 | 3/2010 | Kato |
| 2010/0076575 A1 | 3/2010 | Vasko et al. |
| 2010/0082127 A1 | 4/2010 | Plache et al. |
| 2010/0082129 A1 | 4/2010 | McGreevy et al. |
| 2010/0082142 A1 | 4/2010 | Usadi et al. |
| 2010/0082314 A1 | 4/2010 | Pritchard et al. |
| 2010/0082453 A1 | 4/2010 | Speers et al. |
| 2010/0082669 A1 | 4/2010 | Obitko et al. |
| 2010/0083232 A1 | 4/2010 | Chouinard et al. |
| 2010/0118895 A1 | 5/2010 | Radulescu |
| 2010/0146014 A1 | 6/2010 | Ionescu et al. |
| 2010/0153487 A1 | 6/2010 | Greven et al. |
| 2010/0192144 A1 | 7/2010 | Schmit |
| 2010/0211509 A1 | 8/2010 | Jacobs |
| 2010/0219950 A1 | 9/2010 | Kong et al. |
| 2010/0223212 A1 | 9/2010 | Manolescu et al. |
| 2010/0241260 A1 | 9/2010 | Kilibarda et al. |
| 2010/0256795 A1 | 10/2010 | McLaughlin et al. |

(56) References Cited

U.S. PATENT DOCUMENTS

| | | |
|---|---|---|
| 2010/0257227 A1 | 10/2010 | McLaughlin et al. |
| 2010/0257228 A1 | 10/2010 | Staggs et al. |
| 2010/0306377 A1 | 12/2010 | DeHaan et al. |
| 2010/0318392 A1 | 12/2010 | Cassels et al. |
| 2010/0318837 A1 | 12/2010 | Murphy et al. |
| 2010/0324855 A1 | 12/2010 | Parker |
| 2010/0332008 A1 | 12/2010 | Knipfer et al. |
| 2011/0004446 A1 | 1/2011 | Dorn et al. |
| 2011/0016058 A1 | 1/2011 | Pinchuk |
| 2011/0035253 A1 | 2/2011 | Mason et al. |
| 2011/0047230 A1 | 2/2011 | McGee |
| 2011/0078300 A9 | 3/2011 | Grelewicz et al. |
| 2011/0093308 A1 | 4/2011 | Majeed |
| 2011/0161378 A1 | 6/2011 | Williamson |
| 2011/0173127 A1 | 7/2011 | Ho et al. |
| 2011/0257766 A1 | 10/2011 | Sundaram et al. |
| 2011/0265020 A1 | 10/2011 | Fields et al. |
| 2011/0276498 A1 | 11/2011 | Madhok |
| 2011/0288667 A1 | 11/2011 | Noda et al. |
| 2011/0295634 A1 | 12/2011 | Bhamidipaty et al. |
| 2012/0005242 A1 | 1/2012 | Feng et al. |
| 2012/0022700 A1 | 1/2012 | Dress et al. |
| 2012/0054246 A1 | 3/2012 | Fischer |
| 2012/0072597 A1 | 3/2012 | Teather et al. |
| 2012/0079461 A1 | 3/2012 | Copass et al. |
| 2012/0083906 A1 | 4/2012 | Weatherhead et al. |
| 2012/0084400 A1 | 4/2012 | Almadi et al. |
| 2012/0089920 A1 | 4/2012 | Eick |
| 2012/0095808 A1 | 4/2012 | Kattapuram et al. |
| 2012/0101801 A1 | 4/2012 | Van Dorsselaer |
| 2012/0143374 A1 | 6/2012 | Mistry et al. |
| 2012/0147894 A1 | 6/2012 | Mulligan et al. |
| 2012/0191439 A1 | 7/2012 | Meagher et al. |
| 2012/0197911 A1 | 8/2012 | Banka et al. |
| 2012/0232876 A1 | 9/2012 | Misra |
| 2012/0257544 A1 | 10/2012 | Schein et al. |
| 2012/0262069 A1 | 10/2012 | Reed |
| 2012/0290104 A1 | 11/2012 | Holt et al. |
| 2012/0290266 A1 | 11/2012 | Jain et al. |
| 2012/0297249 A1 | 11/2012 | Yang et al. |
| 2012/0304007 A1 | 11/2012 | Hanks et al. |
| 2012/0306620 A1 | 12/2012 | Karaffa et al. |
| 2012/0311387 A1 | 12/2012 | Santhosh et al. |
| 2013/0004281 A1 | 1/2013 | Anders et al. |
| 2013/0012220 A1 | 1/2013 | Waris et al. |
| 2013/0018696 A1 | 1/2013 | Meldrum |
| 2013/0024542 A1 | 1/2013 | Keller et al. |
| 2013/0031158 A1 | 1/2013 | Salsburg |
| 2013/0036198 A1 | 2/2013 | Galm et al. |
| 2013/0041705 A1 | 2/2013 | Hampapur et al. |
| 2013/0097563 A1 | 4/2013 | Pacheco Rodrigues Velho et al. |
| 2013/0097710 A1 | 4/2013 | Basavapatna et al. |
| 2013/0104236 A1 | 4/2013 | Ray et al. |
| 2013/0107772 A1 | 5/2013 | Splitz et al. |
| 2013/0111019 A1 | 5/2013 | Tjew et al. |
| 2013/0111034 A1 | 5/2013 | Upadhya |
| 2013/0117064 A1 | 5/2013 | Sadeghi et al. |
| 2013/0117806 A1 | 5/2013 | Parthasarathy et al. |
| 2013/0125233 A1 | 5/2013 | Bush et al. |
| 2013/0138812 A1 | 5/2013 | Assuncao et al. |
| 2013/0138818 A1 | 5/2013 | Wolf |
| 2013/0145033 A1 | 6/2013 | Polla et al. |
| 2013/0159500 A1 | 6/2013 | Reus et al. |
| 2013/0182107 A1 | 7/2013 | Anderson |
| 2013/0191106 A1 | 7/2013 | Kephart et al. |
| 2013/0204982 A1 | 8/2013 | Kim et al. |
| 2013/0211546 A1 | 8/2013 | Lawson et al. |
| 2013/0211547 A1 | 8/2013 | Buchdunger et al. |
| 2013/0211555 A1 | 8/2013 | Lawson et al. |
| 2013/0211559 A1 | 8/2013 | Lawson et al. |
| 2013/0211870 A1 | 8/2013 | Lawson et al. |
| 2013/0212420 A1 | 8/2013 | Lawson et al. |
| 2013/0212521 A1 | 8/2013 | Fedoseyeva et al. |
| 2013/0218971 A1 | 8/2013 | Sasaki et al. |
| 2013/0237204 A1 | 9/2013 | Buck et al. |
| 2013/0257627 A1 | 10/2013 | Rafael |
| 2013/0262654 A1 | 10/2013 | Masli et al. |
| 2013/0274899 A1 | 10/2013 | Hamzaoui et al. |
| 2013/0283265 A1 | 10/2013 | Acharya et al. |
| 2013/0304237 A1 | 11/2013 | Schroeder et al. |
| 2013/0311827 A1 | 11/2013 | Drory et al. |
| 2013/0325545 A1 | 12/2013 | Mordvinova et al. |
| 2013/0347003 A1 | 12/2013 | Whitmore |
| 2014/0013100 A1 | 1/2014 | Menzel et al. |
| 2014/0046618 A1 | 2/2014 | Arunachalam et al. |
| 2014/0046977 A1 | 2/2014 | Gopalakrishnan et al. |
| 2014/0047107 A1 | 2/2014 | Maturana et al. |
| 2014/0052499 A1 | 2/2014 | Wagner et al. |
| 2014/0059056 A1 | 2/2014 | Chaney et al. |
| 2014/0067360 A1 | 3/2014 | Bhamidipaty et al. |
| 2014/0081691 A1 | 3/2014 | Wendell |
| 2014/0095231 A1 | 4/2014 | Cherusseri et al. |
| 2014/0095654 A1 | 4/2014 | Finnerty et al. |
| 2014/0121789 A1 | 5/2014 | Brandes et al. |
| 2014/0137257 A1 | 5/2014 | Martinez et al. |
| 2014/0156032 A1 | 6/2014 | Jenkins et al. |
| 2014/0156584 A1 | 6/2014 | Motukuri et al. |
| 2014/0215487 A1 | 7/2014 | Cherkasova et al. |
| 2014/0250153 A1 | 9/2014 | Nixon et al. |
| 2014/0250337 A1 | 9/2014 | Yamaji et al. |
| 2014/0278738 A1 | 9/2014 | Feit et al. |
| 2014/0279201 A1 | 9/2014 | Iyoob et al. |
| 2014/0279641 A1 | 9/2014 | Singh et al. |
| 2014/0279948 A1 | 9/2014 | Mahate et al. |
| 2014/0282015 A1 | 9/2014 | Nixon et al. |
| 2014/0282257 A1 | 9/2014 | Nixon et al. |
| 2014/0297354 A1 | 10/2014 | kogiso et al. |
| 2014/0306533 A1 | 10/2014 | Paquin et al. |
| 2014/0316794 A1 | 10/2014 | Goll et al. |
| 2014/0335480 A1 | 11/2014 | Asenjo et al. |
| 2014/0336785 A1 | 11/2014 | Asenjo et al. |
| 2014/0336786 A1 | 11/2014 | Asenjo et al. |
| 2014/0336791 A1 | 11/2014 | Asenjo et al. |
| 2014/0336795 A1 | 11/2014 | Asenjo et al. |
| 2014/0337000 A1 | 11/2014 | Asenjo et al. |
| 2014/0337086 A1 | 11/2014 | Asenjo et al. |
| 2014/0358606 A1 | 12/2014 | Hull |
| 2014/0372347 A1 | 12/2014 | Cohen et al. |
| 2015/0012763 A1 | 1/2015 | Cohen et al. |
| 2015/0019191 A1 | 1/2015 | Maturana et al. |
| 2015/0032242 A1 | 1/2015 | Schouwenburg et al. |
| 2015/0032886 A1 | 1/2015 | Wang |
| 2015/0048952 A1 | 2/2015 | Murphy |
| 2015/0235161 A1 | 8/2015 | Azar et al. |
| 2015/0278407 A1 | 10/2015 | Vennelakanti et al. |
| 2015/0304193 A1 | 10/2015 | Ishii et al. |
| 2015/0378356 A1 | 12/2015 | Hefeeda et al. |
| 2016/0154693 A1 | 6/2016 | Uhde et al. |
| 2016/0217378 A1 | 7/2016 | Bellala et al. |
| 2016/0217410 A1 | 7/2016 | Santos et al. |
| 2017/0019483 A1 | 1/2017 | Maturana et al. |
| 2017/0236391 A1 | 8/2017 | Palmeri |
| 2018/0157995 A1 | 6/2018 | O'Malley |
| 2018/0205803 A1 | 7/2018 | Asenjo et al. |

FOREIGN PATENT DOCUMENTS

| | | |
|---|---|---|
| CN | 1605958 A | 4/2005 |
| CN | 1690685 A | 11/2005 |
| CN | 1833424 A | 9/2006 |
| CN | 101086760 A | 12/2007 |
| CN | 101091195 A | 12/2007 |
| CN | 100362442 C | 1/2008 |
| CN | 101114160 A | 1/2008 |
| CN | 101326471 A | 12/2008 |
| CN | 101536002 A | 9/2009 |
| CN | 101553763 A | 10/2009 |
| CN | 201444256 U | 4/2010 |
| CN | 101739007 A | 6/2010 |
| CN | 101776862 A | 7/2010 |
| CN | 102435870 A | 5/2012 |
| CN | 102449567 A | 5/2012 |
| CN | 102483837 A | 5/2012 |
| CN | 102640475 A | 8/2012 |

(56) References Cited

FOREIGN PATENT DOCUMENTS

| | | | |
|---|---|---|---|
| CN | 102830666 A | 12/2012 |
| CN | 102927937 A | 2/2013 |
| CN | 103019102 A | 4/2013 |
| CN | 103403753 A | 11/2013 |
| CN | 104142629 A | 11/2014 |
| CN | 104142630 A | 11/2014 |
| CN | 104142662 A | 11/2014 |
| CN | 104142664 A | 11/2014 |
| CN | 104142679 A | 11/2014 |
| CN | 104144204 A | 11/2014 |
| DE | 198 34 456 A1 | 2/2000 |
| DE | 10 2014 102 844 A1 | 9/2014 |
| EP | 1 209 558 A2 | 5/2002 |
| EP | 1 491 977 A2 | 12/2004 |
| EP | 1 531 373 A2 | 5/2005 |
| EP | 1 686 442 A1 | 8/2006 |
| EP | 1 868 152 A1 | 12/2007 |
| EP | 1 933 214 A2 | 6/2008 |
| EP | 2 189 900 A1 | 5/2010 |
| EP | 2 293 164 A1 | 3/2011 |
| EP | 2 453 326 A1 | 5/2012 |
| EP | 2 469 466 A1 | 6/2012 |
| EP | 2 509 042 A1 | 10/2012 |
| EP | 2 660 667 A2 | 11/2013 |
| EP | 2 704 401 A1 | 3/2014 |
| EP | 2 778 816 A1 | 9/2014 |
| EP | 2 790 101 A1 | 10/2014 |
| EP | 2 801 935 A1 | 11/2014 |
| EP | 2 801 936 A1 | 11/2014 |
| EP | 2 801 938 A1 | 11/2014 |
| EP | 2 801 940 A1 | 11/2014 |
| EP | 2 801 941 A1 | 11/2014 |
| EP | 3 037 901 A2 | 6/2016 |
| EP | 3 070 550 B1 | 7/2018 |
| JP | 2001-242931 A | 9/2001 |
| WO | 01/11586 A1 | 2/2001 |
| WO | 01/69329 A2 | 9/2001 |
| WO | 02/17131 A2 | 2/2002 |
| WO | 02/057856 A2 | 7/2002 |
| WO | 03/007097 A1 | 1/2003 |
| WO | 03/058506 A1 | 7/2003 |
| WO | 2008/133715 A2 | 11/2008 |
| WO | 2009/046095 A1 | 4/2009 |
| WO | 2011/050482 A1 | 5/2011 |
| WO | 2013/007866 A1 | 1/2013 |
| WO | 2014/090310 A1 | 6/2014 |
| WO | 2016/001718 A1 | 1/2016 |

OTHER PUBLICATIONS

Final Office Action received for U.S. Appl. No. 15/714,333 dated Nov. 4, 2020, 62 pages.
Summons to attend oral proceedings pursuant to Rule 115(1) EPC received for EP Patent Application Serial No. 16160611.6 dated Oct. 30, 2020, 05 pages.
Notification of Reexamination received for Chinese Application No. 201610149635.7, dated Nov. 5, 2020, 17 pages.
Notification of Reexamination received for Chinese Application No. 201610149668.1, dated Oct. 20, 2020, 3 pages.
Final Office Action received for U.S. Appl. No. 16/129,116 dated Jul. 2, 2020, 58 pages.
Final Office Action received for U.S. Appl. No. 15/714,333 dated Jul. 22, 2020, 40 pages.
Non-Final Office Action received for U.S. Appl. No. 14/658,365 dated Jul. 13, 2020, 72 pages.
Non-Final Office Action received for U.S. Appl. No. 14/658,394 dated Aug. 5, 2020, 59 pages.
Final Office Action received for U.S. Appl. No. 10/234,504 dated Feb. 7, 2007, 12 pages.
Final Office Action received for U.S. Appl. No. 10/234,504 dated May 1, 2007, 12 pages.
Non-Final Office Action received for U.S. Appl. No. 10/162,314 dated Dec. 15, 2005, 17 pages.
Final Office Action received for U.S. Appl. No. 10/162,314 dated Jun. 5, 2006, 23 pages.
Non-Final Office Action received for U.S. Appl. No. 10/162,314 dated Nov. 16, 2006, 20 pages.
Final Office Action received for U.S. Appl. No. 10/162,314 dated Apr. 30, 2007, 35 pages.
Non-Final Office Action received for U.S. Appl. No. 10/162,314 dated Oct. 25, 2007, 28 pages.
Final Office Action received for U.S. Appl. No. 10/162,314 dated May 5, 2008, 31 pages.
Non-Final Office Action received for U.S. Appl. No. 10/161,848 dated Nov. 15, 2005, 15 pages.
Final Office Action received for U.S. Appl. No. 10/161,848 dated Mar. 27, 2006, 13 pages.
Non-Final Office Action received for U.S. Appl. No. 10/161,848 dated Sep. 5, 2006, 15 pages.
Final Office Action received for U.S. Appl. No. 10/161,848 dated Feb. 23, 2007, 17 pages.
Non-Final Office Action received for U.S. Appl. No. 10/161,848 dated May 7, 2007, 14 pages.
Final Office Action received for U.S. Appl. No. 10/161,848 dated Oct. 17, 2007, 15 pages.
Non-Final Office Action received for U.S. Appl. No. 10/161,848 dated Feb. 7, 2008, 14 pages.
Final Office Action received for U.S. Appl. No. 10/161,848 dated Sep. 9, 2008, 17 pages.
Non-Final Office Action received for U.S. Appl. No. 12/410,632 dated Feb. 1, 2011, 56 pages.
Final Office Action received for U.S. Appl. No. 12/410,632 dated May 17, 2011, 17 pages.
Non-Final Office Action received for U.S. Appl. No. 12/410,632 dated Sep. 2, 2011, 11 pages.
Non-Final Office Action received for U.S. Appl. No. 10/298,366 dated Apr. 20, 2006, 13 pages.
Final Office Action received for U.S. Appl. No. 10/298,366 dated Sep. 29, 2006, 16 pages.
Non-Final Office Action received for U.S. Appl. No. 10/298,366 dated Jan. 31, 2007, 12 pages.
Final Office Action received for U.S. Appl. No. 10/298,366 dated Jul. 18, 2007, 14 pages.
Non-Final Office Action received for U.S. Appl. No. 10/298,366 dated Dec. 17, 2007, 10 pages.
Non-Final Office Action received for U.S. Appl. No. 10/298,366 dated Jun. 11, 2008, 24 pages.
Final Office Action received for U.S. Appl. No. 10/298,366 dated Nov. 18, 2008, 20 pages.
Notice of Allowance received for U.S. Appl. No. 10/298,366 dated Feb. 2, 2009, 23 pages.
Non-Final Office Action received for U.S. Appl. No. 13/615,195, dated Aug. 19, 2014, 24 pages.
Communication pursuant to Article 96(2) EPC for EP Application Serial No. 03026339.6 dated Apr. 6, 2006, 6 pages.
Communication pursuant to Article 96(2) EPC for EP Application Serial No. 13166670.3 dated Dec. 14, 2018, 4 pages.
Chinese Third Office Action for Chinese Application No. 201410196114.8 dated Apr. 12, 2017, 25 pages (Including English Translation).
Chinese Fourth Office Action for Chinese Application No. 201410196114.8 dated Aug. 15, 2017, 24 pages (Including English Translation).
Chinese Second Office Action for Chinese Application No. 201410196198.5 dated Dec. 21, 2016, 10 pages (Including English Translation).
Chinese Third Office Action for Chinese Application No. 201410196198.5 dated Mar. 28, 2017, 10 pages (Including English Translation).
Chinese Second Office Action for Chinese Application No. 201410196525.7 dated Dec. 21, 2016, 8 pages (Including English Translation).
Chinese Second Office Action for Chinese Application No. 201410196775.0 dated Dec. 7, 2016, 8 pages (Including English Translation).

(56) References Cited

OTHER PUBLICATIONS

Chinese Third Office Action for CN Application Serial No. 201410196150.4, dated Nov. 29, 2017, 10 pages (Including English Translation).
Communication pursuant to Article 94(3) EPC for EP Application Serial No. 14167511.6 dated Jan. 23, 2019, 7 pages.
Communication pursuant to Article 94(3) EPC for EP Application Serial No. 14167703.9 dated Jan. 23, 2019, 6 pages.
Anonymous: "Hash function—Wikipedia", Wikipedia, Apr. 19, 2009, URL:https://en.wikipedia.org/w/index.php?title=Hash_function&oldid=284890279, 9 pages.
Communication pursuant to Article 94(3) EPC for EP Application Serial No. 16160611.6 dated Apr. 5, 2017, 5 pages.
Communication pursuant to Article 94(3) EPC for EP Application Serial No. 16160611.6 dated May 10, 2017, 5 pages.
Chinese Second Office Action received for Chinese Patent Application Serial No. 201610151417.7 dated Jan. 22, 2019, 7 pages (Including English Translation).
Communication pursuant to Article 94(3) EPC for EP Application Serial No. 16160604.1 dated Jun. 13, 2017, 6 pages.
Summons to attend oral proceedings pursuant to Rule 115(1) EPC received for EP Patent Application Serial No. 14167706.2 dated Dec. 13, 2018, 65 pages.
Chinese Second Office Action received for Chinese Patent Application Serial No. 201410196150.4 dated Aug. 3, 2017, 10 pages (Including English Translation).
Extended European Search Report received for European Application No. 16160610.8 dated Sep. 8, 2016, 9 pages.
Non-Final Office Action received for U.S. Appl. No. 13/725,543 dated Oct. 9, 2014, 10 pages.
Final Office Action received for U.S. Appl. No. 13/725,543 dated May 20, 2015, 15 pages.
Final Office Action received for U.S. Appl. No. 13/615,195 dated Jan. 20, 2015, 22 pages.
Non-Final Office Action received for U.S. Appl. No. 15/714,333 dated Jul. 17, 2019, 113 pages.
Notice of Allowance received for U.S. Appl. No. 15/621,206 dated Aug. 19, 2019, 52 pages.
Non-Final Office Action received for U.S. Appl. No. 14/658,394 dated Aug. 19, 2019, 70 pages.
First Office Action received for Chinese Patent Application Serial No. 201710778822.6 dated Jun. 24, 2019, 29 pages (Including English Translation).
Second Office Action received for Chinese Patent Application Serial No. 201710339669.7 dated Jul. 2, 2019, 20 pages (Including English Translation).
Chinese First Office Action for Chinese Application No. 20170339669.7 dated Dec. 11, 2018, 25 pages (Including English Translation).
Communication pursuant to Article 94(3) EPC received for European Application No. 14167707.0-1955 dated Sep. 22, 2015, 9 pages.
Extended European search report received for European Application No. 14167714.6 dated Aug. 11, 2014, 5 pages.
Extended European search report received for European Application No. 14167706.2 dated Aug. 11, 2014, 7 pages.
Extended European search report received for European Application No. 14167626.2 dated Aug. 11, 2014, 9 pages.
Extended European search report received for European Application No. 14167627.0 dated Aug. 11, 2014, 6 pages.
Extended European search report received for European Application No. 14167703.9 dated Aug. 11, 2014, 7 pages.
Extended European search report received for European Application No. 14167707.0 dated Aug. 11, 2014, 7 pages.
Extended European search report received for European Application No. 14167708.8 dated Aug. 11, 2014, 5 pages.
Extended European search report received for European Application No. 14167712.0 dated Aug. 11, 2014, 5 pages.
Extended European search report received for European Application No. 14167511.6 dated Aug. 11, 2014, 6 pages.

Non-Final Office Action received for U.S. Appl. No. 10/162,315 dated Dec. 27, 2004, 10 pages.
Final Office Action received for U.S. Appl. No. 10/162,315 dated Jun. 15, 2005, 11 pages.
Non-Final Office Action received for U.S. Appl. No. 10/162,315 dated Sep. 9, 2005, 22 pages.
Vasudevan Venu., "A Web Services Primer", http://webservices.XML.com/pub/a/ws/2001/04/04/webservices/index.html, XML.com, Apr. 4, 2001, 10 pages.
Non-Final Office Action received for U.S. Appl. No. 10/162,315 dated Mar. 6, 2006, 10 pages.
W3C, "Web Services Description Language (WSDL) 1.1", http://www.w3.org/TR/wsdl, Mar. 15, 2001, 35 pages.
European Search Report dated Apr. 6, 2004 for European Patent Application No. 03026339, 3 Pages.
Compuquest, Inc., SPM-IM-lnstant Messaging Client for SpreadMsg Wireless Messaging Software, http://www.compuquestinc.com/spmim.html, Aug. 13, 2002, 4 pages.
Compuquest, Inc., SpreadMsg Lite—Data Capture, Scanning, Extraction & Rule Based Instant Messaging Software, http://web.archive.org/web/20020813080848/ http://www.compuquestinc.com/spmsgl.html, retrieved Jul. 21, 2006, 6 pages.
International Business Machines Corporation, Cross platform instant messaging using web services, Research Disclosure, Kenneth Mason Publications, Hampshire, GB, vol. 458, No. 156, Jun. 2002.
Non-Final Office Action received for U.S. Appl. No. 13/725,578 dated Jun. 18, 2014, 13 pages.
Non-Final Office Action received for U.S. Appl. No. 13/615,195 dated Aug. 19, 2014, 22 pages.
Final Office Action received for U.S. Appl. No. 13/725,578 dated Dec. 12, 2014, 24 pages.
Third Party Submission under 37 CFR 1.290 received for U.S. Appl. No. 14/087,873 dated Nov. 21, 2014, 26 pages.
Non-final Office Action received for U.S. Appl. No. 13/608,821 dated Jun. 1, 2015, 44 pages.
Non-Final Office Action recevied for U.S. Appl. No. 13/608,850 dated Jun. 1, 2015, 38 pages.
Non-Final Office Action received for U.S. Appl. No. 13/677,060 dated Apr. 24, 2015, 54 pages.
Non-Final Office Action received for U.S. Appl. No. 13/725,619, dated Jul. 17, 2015, 45 pages.
Non-Final Office Action received for U.S. Appl. No. 13/725,660 dated Aug. 18, 2015, 131 pages.
Colombo et al., "Factory of the Future: A Service-Oriented System of Modular, Dynamic Reconfigurable and Collaborative Systems," Artificial Intelligence Techniques for Networked Manufacturing Enterprises Management, Springer Series in Advanced Manufacuring 2010, pp. 459-481.
Colombo et al., "Towards the Factory of the Future: A Service-Oriented Cross-layer Infrastructure," ICT Shaping the World: A Scientific View, 2009, pp. 65-81.
Notice of Allowance received for U.S. Appl. No. 13/725,578, dated Apr. 24, 2015, 23 pages.
Final Office Action received for U.S. Appl. No. 13/677,060, dated Oct. 20, 2015, 48 pages.
Non-Final Office Action received for U.S. Appl. No. 13/615,195, dated Sep. 21, 2015, 19 pages.
Final Office Action received for U.S. Appl. No. 13/725,660, dated Oct. 26, 2015, 79 pages.
Non-Final Office Action received for U.S. Appl. No. 14/087,873 dated Nov. 25, 2015, 57 pages.
Final Office Action received for U.S. Appl. No. 13/725,619, dated Dec. 4, 2015, 21 pages.
Final Office Action recevied for U.S. Appl. No. 13/608,821, dated Dec. 7, 2015, 39 pages.
Final Office Action received for U.S. Appl. No. 13/615,195, dated Feb. 11, 2016, 19 pages.
Non-Final Office Action received for U.S. Appl. No. 13/725,543, dated Feb. 2, 2016, 15 pages.
Non-Final Office Action received for U.S. Appl. No. 13/725,660, dated Jan. 21, 2016, 72 pages.
Final Office Action received for U.S. Appl. No. 13/608,850, dated Dec. 9, 2015, 25 pages.

(56) References Cited

OTHER PUBLICATIONS

Communication pursuant to Article 94(3) EPC received for European Application No. 14167706.2-1955 dated Nov. 24, 2015, 8 pages.
Communication pursuant to Article 94(3) EPC received for European Application No. 14167626.2-1955 dated Nov. 24, 2015, 8 pages.
Notice of Allowance received for U.S. Appl. No. 13/725,619, dated Mar. 31, 2016, 26 pages.
Non-Final Office Action recieved for U.S. Appl. No. 13/677,060 dated Mar. 10, 2016, 66 pages.
Notice of Allowance received for U.S. Appl. No. 13/725,660 dated Feb. 3, 2016, 47 pages.
Non-Final Office Action received for U.S. Appl. No. 16/129,116 dated Nov. 16, 2020, 51 pages.
Final Office Action received for U.S. Appl. No. 14/658,365 dated Jan. 21, 2021, 96 pages.
Non-Final Office Action received for U.S. Appl. No. 14/658,394 dated Feb. 20, 2020, 67 pages.
Third Office Action received for Chinese Patent Application Serial No. 201710778822.6 dated Mar. 3, 2020, 43 pages (Including English Translation).
Communication pursuant to Article 94(3) EPC received for EP Patent Application Serial No. 14167627.0 dated Jan. 23, 2020, 6 pages.
Summons to attend oral proceedings pursuant to Rule 115(1) EPC received for EP Patent Application Serial No. 14167703.9 dated Feb. 6, 2020, 8 pages.
Notification of Grant of Patent for Invention received for Chinese Patent Application Serial No. 201710339669.7 dated Dec. 31, 2019, 7 pages (Including English Translation).
Summons to attend oral proceedings pursuant to Rule 115(1) EPC received for EP Patent Application Serial No. 16160611.6 dated Dec. 19, 2019, 26 pages.
Final Office Action received for U.S. Appl. No. 15/714,333 dated Oct. 25, 2019, 36 pages.
Non-Final Office Action received for U.S. Appl. No. 15/970,932 dated Nov. 14, 2019, 122 pages.
Second Office Action received for Chinese Patent Application Serial No. 201710778822.6 dated Sep. 20, 2019, 5 pages.
Final Office Action received for U.S. Appl. No. 14/658,345 dated Nov. 26, 2019, 48 pages.
Final Office Action received for U.S. Appl. No. 14/658,365 dated Nov. 29, 2019, 48 pages.
Supplementary Search Report received for Chinese Patent Application Serial No. 201710339669.7 dated Sep. 18, 2019, 2 pages.
Non-Final Office Action for U.S. Appl. No. 14/087,730 dated Mar. 11, 2016, 81 pages.
Non-Final Office Action received for U.S. Appl. No. 14/087,821 dated Mar. 2, 2016, 86 pages.
Non-Final Office Action received for U.S. Appl. No. 14/087,977 dated Mar. 17, 2016, 83 pages.
Recursion Software, "SCADA-Aware Mobile", Frisco, TX, Aug. 29, 2012 (accessed from<<http://www.emsenergyautomation.com/brochures/scada.pdf on Feb. 11, 2016).
Ars Technica, "Windows 7 themes: how to unlock them or create your own", Nov. 12, 2009 (accessed from http://arstechnica.com/information-technology/2009/11/unlock-hidden-windows-7-themes/ on Mar. 8, 2016).
Non-Final Office Action received for U.S. Appl. No. 14/088,014 dated Mar. 22, 2016, 98 pages.
"Microsoft," "Sharing Outlook 2010 Contact\Notes/Field?", microsoft.com, Jun. 23, 2011 (accessed on Mar. 11, 2016 from http://answers.microsoft.com/en-us/office/forum/office_2010-outlook/sharing-outlook-2010-contactnotes-field/c7e74273-ff60-4da3-a3aa-ccb6cadcd25e?auth=1).
Notice of Allowance received for U.S. Appl. No. 13/608,850 dated Apr. 12, 2016, 37 pages.
Notice of Allowance received for U.S. Appl. No. 14/087,873 dated Apr. 18, 2016, 26 pages.
Chinese First Office Action received for Chinese Application No. 201410196198.5, dated Mar. 29, 2016, 18 pages (Including English Translation).
Non-Final Office Action received for U.S. Appl. No. 14/088,011 dated May 12, 2016, 96 pages.
Chinese First Office Action received for Chinese Application No. 201410198289.2, dated Apr. 5, 2016, 18 pages (Including English Translation).
Chinese First Office Action received for Chinese Application No. 201410196905.0, dated Apr. 5, 2016, 20 pages (Including English Translation).
Chinese First Office Action received for Chinese Application No. 201410196127.5, dated Apr. 7, 2016, 22 pages (Including English Translation).
Chinese Office Action for Chinese Application No. 201410196114.8 dated Apr. 25, 2016, 20 pages (Including English Translation).
Chinese First Office Action received for Chinese Application No. 201410196775.0, dated May 5, 2016, 14 pages (Including English Translation).
Chinese First Office Action received for Chinese Application No. 201410196525.7, dated May 5, 2016, 13 pages (Including English Translation).
Non-Final Office Action received for U.S. Appl. No. 13/615,195, dated Jun. 21, 2016, 29 pages.
Final Office Action received for U.S. Appl. No. 13/725,543, dated Jun. 17, 2016, 19 pages.
Non-final Office Action received for U.S. Appl. No. 14/087,970 dated Jun. 17, 2016, 36 pages.
Chinese First Office Action received for Chinese Application Serial No. 201410195780.X, dated May 26, 2016, 16 pages (Including English Translation).
Final Office Action received for U.S. Appl. No. 14/087,977 dated Jul. 13, 2016, 59 pages.
Final Office Action received for U.S. Appl. No. 14/088,014 dated Jul. 15, 2016, 65 pages.
Non-Final Office Action received for U.S. Appl. No. 14/087,922 dated Jul. 19, 2016, 120 pages.
Extended European Search Report received for European Application No. 16160604.1 dated Aug. 17, 2016, 9 pages.
Extended European Search Report received for European Application No. 16160611.6 dated Aug. 24, 2016, 10 pages.
Final Office Action received for U.S. Appl. No. 14/087,730 dated Aug. 24, 2016, 113 pages.
Extended European Search Report received for European Application No. 16160602.5 dated Sep. 2, 2016, 9 pages.
Non-Final Office Action received for U.S. Appl. No. 14/087,835 dated Sep. 23, 2016, 82 pages.
Final Office Action recieved for U.S. Appl. No. 14/087,821 dated Sep. 9, 2016, 97 pages.
Extended European Search Report received for European Application No. 13166670.3 dated Jun. 14, 2016, 10 pages.
Cloud Computing, "Whatis.com", Oct. 27, 2009, http://searchcloudcomputing.techtarget.com/sDefinition/0,,sid201_gci1287881,00.html, 2 pages.
Mell et al., "The NIST Definition of Cloud Computing," Oct. 7, 2009, http://csrc.nist.gov/groups/SNS/cloud/computing/index.html, 2 pages.
European Office Action for EP Patent Application Serial No. 16160611.6, dated Sep. 26, 2016, 2 pages.
European Office Action for EP Patent Application Serial No. 13166670.3, dated Jul. 18, 2016, 2 pages.
European Office Action for EP Patent Application Serial No. 16160604.1, dated Sep. 26, 2016, 2 pages.
Final Office Action received for U.S. Appl. No. 13/615,195 dated Oct. 21, 2016, 44 pages.
Final Office Action received for U.S. Appl. No. 14/088,011 dated Nov. 1, 2016, 79 pages.
Communication pursuant to Rule 69 EPC received for European Application Serial No. 16160610.8 dated Oct. 17, 2016, 2 pages.
Communication pursuant to Rule 69 EPC received for European Application Serial No. 16160602.5 dated Oct. 10, 2016, 2 pages.
Non-Final Office Action received for U.S. Appl. No. 14/088,014, dated Nov. 17, 2016, 61 pages.

(56) References Cited

OTHER PUBLICATIONS

Chinese second Office Action received for Chinese Application Serial No. 201410196114.8, dated Nov. 9, 2016, 19 pages (Including English Translation).
Chinese Second Office Action received for Chinese Application Serial No. 201410196905.0, dated Nov. 18, 2016, 6 pages (Including English Translation).
Final Office Action received for U.S. Appl. No. 14/087,922, dated Nov. 25, 2016, 65 pages.
Non-Final Office Action for U.S. Appl. No. 14/087,730, dated Feb. 9, 2017, 78 pages.
Chinese Second Office Action received for Chinese Application Serial No. 201410198289.2, dated Dec. 15, 2016, 21 pages (Including English Translation).
Chinese Second Office Action received for Chinese Application Serial No. 201410196127.5 dated Nov. 30, 2016, 24 pages (Including English Translation).
Chinese Second Office Action received for Chinese Application Serial No. 201410195780.X, dated Feb. 3, 2017, 25 pages (Including English Translation).
Non-Final Office Action received for U.S. Appl. No. 14/658,365 dated Mar. 23, 2017, 100 pages.
Chinese First Office Action received for Chinese Application Serial No. 201410196150.4, dated Mar. 2, 2017, 20 pages (Including English Translation).
Non-Final Office Action received for U.S. Appl. No. 16/129,116 dated Apr. 1, 2020, 142 pages.
Non-Final Office Action received for U.S. Appl. No. 15/714,333 dated Apr. 15, 2020, 44 pages.
Final Office Action received for U.S. Appl. No. 15/970,932 dated Apr. 13, 2020, 37 pages.
Non-Final Office Action received for U.S. Appl. No. 14/658,345 dated May 14, 2020, 83 pages.
Communication pursuant to Article 94(3) EPC received for EP Patent Application Serial No. 16160602.5 dated May 19, 2020, 07 pages.
Communication pursuant to Article 94(3) EPC received for EP Patent Application Serial No. 16160610.8 dated May 27, 2020, 08 pages.
Non-Final Office Action received for U.S. Appl. No. 15/621,206 dated Mar. 22, 2019, 118 pages.
Non-Final Office Action received for U.S. Appl. No. 14/658,345 dated May 13, 2019, 78 pages.
Non-Final Office Action received for U.S. Appl. No. 14/658,365 dated Jun. 3, 2019, 70 pages.
Third Office Action received for Chinese Patent Application Serial No. 201610149635.7 dated Apr. 26, 2019, 23 pages including English Translation).
Notice of Opposition received for EP Patent Application Serial No. 16160611.6 dated Apr. 11, 2019, 789 pages.
Wen et al., "Current Trends and Perspectives in Wireless Virtualization", 2013 International Conference on Selected Topics in Mobile and Wireless Networking (MoWNeT), 2013, 6 pages.
Wang et al., "The Research of Chemical Plant Monitoring Base on the Internet of Things and 3D Visualization Technology", Proceeding of the IEEE International Conference on Information and Automation, Aug. 2013, 5 pages.
Notice of Allowance received for U.S. Appl. No. 14/658,394 dated Feb. 9, 2021, 92 pages.
Advisory Office Action received for U.S. Appl. No. 14/658,365 dated Mar. 25, 2021, 09 pages.
Summons to attend oral proceedings pursuant to Rule 115(1) EPC received for European Patent Application Serial No. 14167708.8 dated Mar. 18, 2021, 09 pages.
Non-Final Office Action received for U.S. Appl. No. 16/900,022 dated May 27, 2021, 146 pages.
Communication Pursuant to Rules 94(3) EPC received for EP Patent Application Serial No. 16160602.5 dated May 11, 2021, 07 pages.
Non-Final Office Action received for U.S. Appl. No. 14/658,345 dated Jun. 24, 2021, 73 pages.
Non-Final Office Action received for U.S. Appl. No. 14/658,365 dated Jul. 30, 2021, 108 pages.
Communication pursuant to Article 94(3) EPC received for European application No. 16160610.8 dated May 27, 2021, 9 pages.
First Office Action received for Chinese application No. 201810240055.8 dated Jun. 25, 2021, 22 pages (Including English Translation).
Final Office Action received for U.S. Appl. No. 14/087,970 dated Apr. 12, 2017, 59 pages.
Non-Final Office Action received for U.S. Appl. No. 14/658,394 dated Apr. 21, 2017, 97 pages.
Non-Final Office Action recevied for U.S. Appl. No. 15/388,260 dated Apr. 24, 2017, 101 pages.
Non-Final Office Action received for U.S. Appl. No. 14/658,345 dated Mar. 17, 2017, 95 pages.
Non-Final Office Action received for U.S. Appl. No. 14/658,327 dated May 1, 2017, 99 pages.
Givehchi et al., "Control-as-a-Service from the Cloud: A Case Study for using Virtualized PLCs," 2014 10th IEEE Workshop on Factory Communication Systems (WFCS 2014), May 5, 2014 IEEE, 4 pages.
Non-Final Office Action received for U.S. Appl. No. 14/088,011 dated May 17, 2017, 57 Pages.
Rouse et al. "Definition Industrial Control System (ICS," whatis.techtarget.com, ed. Mar. 2016 (accessed from <<http://whatis.techtarget.com/definition/industrial-control-system-ICS>> on Jan. 11, 2017), 1 page.
Examiner Answer to Appeal Brief for U.S. Appl. No. 14/087,977, dated Jun. 5, 2017, 10 pages.
Communication pursuant to Article 94(3) EPC received for European Application Serial No. 16160604.1-1802 dated May 17, 2017, 6 pages.
Final Office Action received for U.S. Appl. No. 14/658,365 dated Sep. 8, 2017, 59 pages.
Non-Final Office Action received for U.S. Appl. No. 14/087,821 dated Sep. 7, 2017, 63 pages.
Final Office Action received for U.S. Appl. No. 14/087,730 dated Aug. 18, 2017, 72 pages.
Non-Final Office Action received for U.S. Appl. No. 15/214,583 dated Aug. 28, 2017, 80 pages.
Final Office Action received for U.S. Appl. No. 14/658,345 dated Sep. 25, 2017, 52 pages.
Final Office Action received for U.S. Appl. No. 15/388,260 dated Oct. 18, 2017, 76 pages.
Non-Final Office Action received for U.S. Appl. No. 15/206,744 dated Nov. 6, 2017, 48 pages.
Final Office Action received for U.S. Appl. No. 14/658,327 dated Oct. 30, 2017, 33 pages.
Final Office Action for U.S. Appl. No. 14/658,394 dated Nov. 16, 2017, 49 pages.
Non-Final Office Action received for U.S. Appl. No. 15/490,076 dated Dec. 20, 2017, 37 pages.
Non-Final Office Action received for U.S. Appl. No. 15/278,139 dated Jan. 11, 2018, 103 pages.
Final Office Action received for U.S. Appl. No. 14/087,821 dated Dec. 14, 2017, 37 pages.
Final Office Action received for U.S. Appl. No. 14/088,011 dated Nov. 22, 2017, 77 pages.
Non-Final Office Action received for U.S. Appl. No. 14/087,970 dated Feb. 12, 2018, 69 pages.
Chinese Fifth Office Action received for Chinese Application Serial No. 201410196114.8, dated Dec. 13, 2017, 26 pages (Including English Translation).
Non-Final Office Action received for U.S. Appl. No. 15/143,733 dated Mar. 8, 2018, 141 pages.
Final Office Action received for U.S. Appl. No. 15/490,076 dated Apr. 2, 2018, 23 pages.
Non-Final Office Action received for U.S. Appl. No. 14/658,327 dated Apr. 10, 2018, 43 pages.
Non-Final Office Action received for U.S. Appl. No. 14/658,345 dated Mar. 14, 2018, 56 pages.
Non-Final Office Action received for U.S. Appl. No. 14/658,365, dated Apr. 5, 2018, 64 pages.

(56) References Cited

OTHER PUBLICATIONS

Non-Final Office Action received for U.S. Appl. No. 14/658,394, dated Apr. 6, 2018, 40 pages.
Final Office Action received for U.S. Appl. No. 15/143,733, dated Jun. 18, 2018, 76 pages.
Non-Final Office Action received for U.S. Appl. No. 15/599,921, dated Jun. 29, 2018, 75 pages.
Final Office Action received for U.S. Appl. No. 14/087,970, dated Aug. 1, 2018, 68 pages.
Wikipedia; "PID Controller"; Jul. 20, 2018; https://en.wikipedia.org/wiki/PID_controller (Year: 2018).
Communication pursuant to Article 94(3) EPC for EP Application Serial No. 14167714.6 dated Aug. 3, 2018, 5 pages.
Communication pursuant to Article 94(3) EPC for EP Application Serial No. 14167708.8 dated Aug. 3, 2018, 5 pages.
Communication pursuant to Article 94(3) EPC for EP Application Serial No. 14167712.0 dated Aug. 3, 2018, 5 pages.
Chinese Search Report received for Chinese Application Serial No. 201610149668.1 dated Apr. 2, 2018, 1 pages (Including English Translation).
Chinese Search Report received for Chinese Application Serial No. 201610149635.7 dated Apr. 2, 2018, 1 pages (Including English Translation).
Chinese First Office Action received for Chinese Patent Application Serial No. 201610151380.8, dated Jul. 17, 2018, 65 pages (Including English Translation).
Final Office Action received for U.S. Appl. No. 14/658,345 dated Sep. 13, 2018, 49 pages.
Final Office Action received for U.S. Appl. No. 14/658,365 dated Oct. 16, 2018, 42 pages.
Notice of Allowance received for U.S. Appl. No. 15/923,127 dated Nov. 21, 2018, 85 pages.
Non-Final Office Action received for U.S. Appl. No. 14/658,327 dated Nov. 1, 2018, 58 pages.
Final Office Action received for U.S. Appl. No. 14/658,394 dated Nov. 1, 2018, 51 pages.
Chinese Second Office Action received for Chinese Application Serial No. 201610149668.1, dated Oct. 24, 2018, 18 pages (Including English Translation).
Chinese Second Office Action received for Chinese Application Serial No. 201610149635.7, dated Oct. 24, 2018, 24 pages (Including English Translation).
Chinese First Office Action received for Chinese Application Serial No. 201610151417.7, dated Sep. 18, 2018, 28 pages (Including English Translation).
Non-Final Office Action received for U.S. Appl. No. 10/234,504 dated Oct. 18, 2006, 15 pages.
Final Office Action received for U.S. Appl. No. 14/658,365 dated Jan. 24, 2022, 38 pages.
Non-Final Office Action received for U.S. Appl. No. 16/599,276 dated Dec. 3, 2021,172 sages.
Communication pursuant to Article 94(3) EPC received for European Application Serial No. 11152520.0-1205 dated Nov. 8, 2021, 8 pages.
European Office Action for EP Patent Application Serial No. 14167708.8, dated Oct. 20, 2021,10pages.
Final Office Action received for U.S. Appl. No. 16/900,022 dated Dec. 30, 2021,66 pages.

* cited by examiner

USING CLOUD-BASED DATA FOR INDUSTRIAL SIMULATION

RELATED APPLICATIONS

This application is a continuation of, and claims priority to each of, U.S. patent application Ser. No. 15/599,921 (now U.S. Pat. No. 10,204,191), filed May 19, 2017, and entitled "USING CLOUD-BASED DATA FOR INDUSTRIAL SIMULATION," which is a continuation of, and claims priority to each of, U.S. patent application Ser. No. 14/087,835 (now U.S. Pat. No. 9,703,902), filed Nov. 22, 2013, and entitled "USING CLOUD-BASED DATA FOR INDUSTRIAL SIMULATION," which claims priority to U.S. Provisional Patent Application Ser. No. 61/821,639, filed on May 9, 2013, and entitled "REMOTE SERVICES AND ASSET MANAGEMENT SYSTEMS AND METHODS," the entireties of which applications are hereby incorporated herein by reference.

TECHNICAL FIELD

The subject application relates generally to industrial automation, and, more particularly, to using cloud-based data to perform industrial simulation of industrial systems.

BACKGROUND

Industrial controllers and their associated input/output (I/O) devices can be useful to the operation of modern automation systems. These industrial controllers can interact with field devices on the plant floor to control automated processes relating to such objectives as product manufacture, material handling, batch processing, supervisory control, and other such applications. Industrial controllers can store and execute user-defined control programs to effect decision-making in connection with the controlled process. Such programs can include, but are not limited to, ladder logic, sequential function charts, function block diagrams, structured text, or other such programming structures. In general, industrial controllers can read input data from sensors and metering devices that can provide discreet and telemetric data regarding one or more states of the controlled system, and can generate control outputs based on these inputs in accordance with the user-defined program.

In addition to industrial controllers and their associated I/O devices, some industrial automation systems also can include low-level control systems, such as vision systems, barcode marking systems, variable frequency drives, industrial robots, and the like, which can perform local control of portions of the industrial process, or which can have their own localized control systems.

The collection of industrial devices, industrial processes, other industrial assets, and network-related assets that makeup a given industrial automation system is typically in flux. As a result of system expansions, maintenance concerns, and device upgrades, industrial devices or other assets frequently can be added, removed, switched, replaced, reconfigured, or updated; industrial processes frequently can be modified; network-related components (e.g., network-related devices or software) frequently can be added, removed, switched, replaced, reconfigured, or updated; etc. Such modifications to the industrial automation system potentially can have positive or negative impacts on the performance of the industrial automation system.

The above-described deficiencies of today's industrial control and business systems are merely intended to provide an overview of some of the problems of conventional systems, and are not intended to be exhaustive. Other problems with conventional systems and corresponding benefits of the various non-limiting embodiments described herein may become further apparent upon review of the following description.

SUMMARY

The following presents a simplified summary in order to provide a basic understanding of some aspects described herein. This summary is not an extensive overview nor is intended to identify key/critical elements or to delineate the scope of the various aspects described herein. Its sole purpose is to present some concepts in a simplified form as a prelude to the more detailed description that is presented later.

Various aspects and embodiments of the disclosed subject matter relate to the use of data analysis in a cloud platform to facilitate simulating operations of industrial automation systems. A cloud-based simulation generation service can collect industrial data (e.g., data relating to industrial automation systems) from industrial automation systems associated with one or more industrial customers for storage and analysis on a cloud platform. The service can employ a simulation generator component that can analyze the industrial data to facilitate generating a simulation model that can simulate or emulate an industrial automation system, including simulating or emulating industrial devices, industrial processes, other industrial assets, or network-related assets or devices, and their respective interrelationships (e.g., functional and/or communicative interrelationships) with each other. The simulation generator component also can analyze modification data (e.g., industrial data relating to a modification to the industrial automation system that is under consideration) to facilitate generating a modified simulation model that can simulate or emulate the industrial automation system based on the modification.

The simulation generator component can perform operation simulations using the simulation model and/or modified simulation model to facilitate determining the response of the simulation model and/or modified simulation model to a set of operation data (e.g., test data, historical operation data, etc.). The simulation generator component can determine or predict a response (e.g., real-world response) of the corresponding industrial automation system and/or corresponding modified automation system based on the responses (e.g., simulation response data) obtained from the operation simulations performed using the simulation model and/or modified simulation model. The simulation generator component can evaluate the results of the operation simulations to facilitate determining whether making the modification to the industrial automation system is appropriate, determining which, if any, modification or combination of modifications of a set of modification is appropriate, determining or predicting performance of a modified industrial automation system, determining compatibility of a modification or combination of modifications with an industrial automation system, or determining or predicting performance of the industrial automation system when processing a work order.

To the accomplishment of the foregoing and related ends, certain illustrative aspects are described herein in connection with the following description and the annexed drawings. These aspects are indicative of various ways which can be practiced, all of which are intended to be covered herein. Other advantages and novel features may become apparent from the following detailed description when considered in conjunction with the drawings.

DETAILED DESCRIPTION

Figure 1:
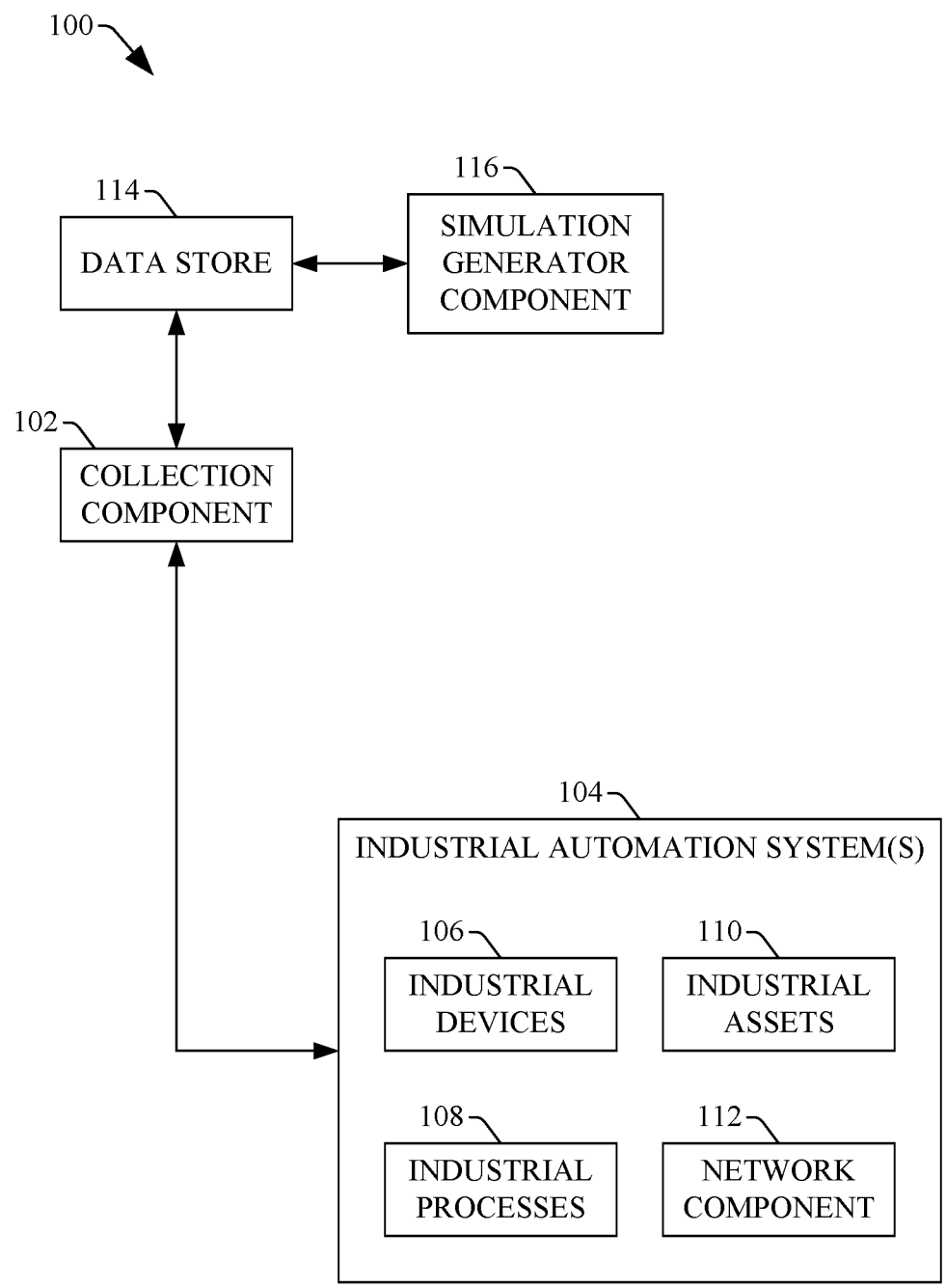
FIG. 1 illustrates a block diagram of an example system (e.g., simulation generation system) that can facilitate generation of a simulation model of an industrial automation system associated with an industrial enterprise based on cloud-based data relating to the industrial enterprise, in accordance with various implementations and embodiments of the disclosed subject matter.

The subject disclosure is now described with reference to the drawings, wherein like reference numerals are used to refer to like elements throughout. In the following description, for purposes of explanation, numerous specific details are set forth in order to provide a thorough understanding thereof. It may be evident, however, that the subject disclosure can be practiced without these specific details. In other instances, well-known structures and devices are shown in block diagram form in order to facilitate a description thereof.

Industrial automation systems can perform various processes to produce desired products or processed materials. An industrial control system can comprise various industrial devices, industrial processes, other industrial assets, and network-related assets (e.g., communication network devices and software). The collection of industrial devices, industrial processes, other industrial assets, and network-related assets that makeup a given industrial automation system typically can be in flux. As a result of system expansions, maintenance concerns, and device upgrades, industrial devices or other assets frequently can be added, removed, switched, replaced, reconfigured, or updated; industrial processes frequently can be modified; network-related components (e.g., network-related devices or software) frequently can be added, removed, switched, replaced, reconfigured, or updated; etc. Such modifications to an industrial automation system potentially can have positive or negative impacts on the performance of the industrial automation system.

To that end, presented are various systems, methods, and techniques of the disclosed subject matter that relate to the use of data analysis (e.g., big data analysis) in a cloud platform to facilitate simulating operations of industrial automation systems. A cloud-based simulation generation service (e.g., employing a collection component) can collect industrial data (e.g., data relating to industrial automation systems) from industrial automation systems associated with one or more industrial customers (e.g., industrial enterprises) for storage (e.g., in a cloud-based data store) and analysis on a cloud platform. The simulation generation service can employ a simulation generator component that can analyze the industrial data to facilitate generating a simulation model that can simulate or emulate an industrial automation system, including simulating or emulating industrial devices, industrial processes, other industrial assets, or network-related assets or devices (e.g., network communication or routing devices, network switches, network-related software or operating systems, etc.), and their respective interrelationships (e.g., functional and/or communicative interrelationships) with each other. When a modification to the industrial automation system is under consideration, the simulation generator component can analyze modification data (e.g., industrial data relating to a modification to the industrial automation system that is under consideration), along with the industrial data relating to the industrial automation system, to facilitate generating a modified simulation model that can simulate or emulate the industrial automation system, including simulation or emulation of the modification, based on the modification.

The simulation generator component can perform operation simulations using the simulation model and/or modified simulation model to facilitate determining the response of the simulation model and/or modified simulation model to a set of operation data (e.g., test data, historical operation data, data representative of a work order, etc.). The simulation generator component can determine or predict a response (e.g., a real-world response) of the corresponding industrial automation system and/or corresponding modified automation system based on the responses (e.g., simulation response data) obtained from the operation simulations performed using the simulation model and/or modified simulation model. The simulation generator component can evaluate the results of the operation simulations to facilitate determining whether making the modification to the industrial automation system is appropriate, determining which, if any, modification or combination of modifications of a set of modification is appropriate (e.g., most preferred based on a set of defined operation criteria), determining or predicting performance of a modified industrial automation system, determining compatibility of a modification or combination of modifications with an industrial automation system, or determining or predicting performance of the industrial automation system when processing a work order, among other features or implementations disclosed herein.

As used in this application, the terms "component," "system," "platform," "layer," "controller," "terminal," "station," "node," "interface" are intended to refer to a computer-related entity or an entity related to, or that is part of, an operational apparatus with one or more specific functionalities, wherein such entities can be either hardware, a combination of hardware and software, software, or software in execution. For example, a component can be, but is not limited to being, a process running on a processor, a processor, a hard disk drive, multiple storage drives (of optical or magnetic storage medium) including affixed (e.g., screwed or bolted) or removably affixed solid-state storage drives; an object; an executable; a thread of execution; a computer-executable program, and/or a computer. By way of illustration, both an application running on a server and the server can be a component. One or more components can reside within a process and/or thread of execution, and a component can be localized on one computer and/or distributed between two or more computers. Also, components as described herein can execute from various computer readable storage media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that provides at least in part the functionality of the electronic components. As further yet another example, interface(s) can include input/output (I/O) components as well as associated processor, application, or Application Programming Interface (API) components. While the foregoing examples are directed to aspects of a component, the exemplified aspects or features also apply to a system, platform, interface, layer, controller, terminal, and the like.

As used herein, the terms "to infer" and "inference" refer generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Furthermore, the term "set" as employed herein excludes the empty set; e.g., the set with no elements therein. Thus, a "set" in the subject disclosure includes one or more elements or entities. As an illustration, a set of controllers includes one or more controllers; a set of data resources includes one or more data resources; etc. Likewise, the term "group" as utilized herein refers to a collection of one or more entities; e.g., a group of nodes refers to one or more nodes.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches also can be used.

FIG. 1 illustrates a block diagram of an example system 100 (e.g., simulation generation system) that can facilitate generation of a simulation model of an industrial automation system associated with an industrial enterprise based on cloud-based data relating to the industrial enterprise, in accordance with various implementations and embodiments of the disclosed subject matter. The system 100 can comprise a collection component 102 (e.g., data collection component) that can be associated with an industrial automation system 104 associated with an industrial enterprise. The industrial automation system 104 can comprise one or more industrial devices 106, industrial processes 108, or other industrial assets 110 that can be distributed throughout an industrial facility(ies) in accordance with a desired industrial-automation-system configuration. The industrial automation system 104 can perform industrial processes or other actions to facilitate producing desired products, processed materials, etc., as an output.

The industrial automation system 104 also can include a network component 112 that can be associated with (e.g., interfaced with, communicatively connected to) the various industrial devices 106, processes 108, and/or other assets 110 of the industrial automation system 104 to facilitate communication of information (e.g., command or control information, status information, production information, etc.) between the various industrial devices 106, processes 108, and/or other assets 110 via the network component 112. The network component 112 can be associated with (e.g., interfaced with, communicatively connected to) the collection component 102 to facilitate the communication of data between the industrial automation system 104 and the collection component 102.

The collection component 102 can monitor or track the operation of the industrial automation system 104. The collection component 102 can receive, obtain, detect, or collect data relating to the operation of the industrial automation system 104 and the network component 112. For example, the collection component 102 can receive data relating to the industrial devices 106 (e.g., operation or status of the industrial devices, properties or characteristics of the industrial devices, maintenance records of the industrial devices, configurations of the industrial devices, etc.), industrial processes 108 (e.g., operation or status of the industrial processes, properties or characteristics of the industrial processes, maintenance records associated with the industrial processes, configurations of the industrial processes, etc.), and the other industrial assets 110 (e.g., operation or status of the industrial assets, properties or characteristics of the industrial assets, maintenance records associated with the industrial assets, configurations of the industrial assets, etc.). The collection component 102 also can receive or collect data relating to operation of the components of the network component 112 (e.g., operation or status of the network devices or assets, communication conditions associated with a communication channel, total bandwidth of a communication channel, available bandwidth of a communication channel, properties or characteristics of the network devices or assets, maintenance records associated with the network devices or assets, configurations of the network devices or assets, etc.).

The system 100 also can comprise a data store 114 that can be associated with (e.g., interfaced with, communicatively connected to) the collection component 102. The collection component 102 can provide (e.g., communicate, write, etc.) the data received or collected from the industrial automation system 104 and the network component 112 to the data store 114 for storage in the data store 114.

The system 100 further can include a simulation generator component 116 (e.g., simulation builder component) that can generate a simulation model that can emulate, model, or simulate the operation of the industrial automation system 104 and the associated network component 112. The simulation generator component 116 can be associated with (e.g., interfaced with, communicatively connected to) the data store 114 to facilitate obtaining data associated with the industrial automation system 104 and network component 112 to facilitate generating a simulation model of the industrial automation system 104.

In some implementations, the simulation generator component 116, collection component 102, and/or the data store 114 can be located in a cloud platform that can be interfaced with the industrial automation system 104. In accordance with various other implementations, one or more of the simulation generator component 116, collection component 102, and/or the data store 114 can be located at the plant or original equipment manufacturer (OEM) level associated with the industrial automation system 104, or can be located in a different platform or level.

The simulation generator component 116 can generate simulation models of the industrial automation system 104 for a number of desired purposes. For example, the simulation generator component 116 can generate a simulation model to facilitate determining or predicting whether the industrial automation system 104 will operate desirably (e.g., adequately, properly, optimally, etc.) under a set of defined conditions, in accordance with a set of defined operation criteria. The simulation generator component 116 also can generate a simulation model (e.g., of a modified industrial automation system) to facilitate determining or predicting whether a modification of the industrial automation system that is being considered is desirable (e.g., will improve the system 104, will not underperform, will not harm the system 104, etc.), in accordance with the set of defined operation criteria. The simulation generator component 116 also can generate simulation models (e.g., of various modifications to the industrial automation system 104) to facilitate determining or predicting whether one or more of the modifications under consideration are desirable, in accordance with the set of defined operation criteria.

In still another example, the simulation generator component 116 can generate a simulation model of a modification to the industrial automation system 104, and can apply a set of historical operation data to the simulation model, to facilitate determining or predicting whether the industrial automation system 104, with the modification, can desirably respond to the set of historical operation data or to determine what the determined or predicted difference in response there is between the response of the modified simulation model of the modified industrial automation system and the response of the industrial automation system based on the set of historical operation data. In yet another example, in relation to a work order for products or processed materials, the simulation generator component 116 can apply a set of operation data relating to the work order to the simulation model of the industrial automation system 104 to facilitate determining or predicting whether the industrial automation system 104 can desirably process or fulfill the work order, in accordance with the set of defined operation criteria. For instance, the simulation generator component 116 can perform a simulation of the processing of the work order by the industrial automation system 104 to facilitate determining or predicting whether the industrial automation system 104 will be able to satisfy a set of order completion parameters (e.g., time constraints, fiscal constraints, product quality constraints, etc.) associated with the work order, the purchaser, or the manufacturer associated with the industrial enterprise, based on the set of defined operation criteria.

To facilitate generating a simulation model of the industrial automation system 104, the simulation generator component 116 can access the data store 114 (e.g., cloud-based data store) to obtain a set of data relating to the industrial automation system 104 and/or another industrial automation system (e.g., another system comprising an industrial device(s), process(es), and/or asset(s) that can be the same or similar to an industrial device(s) 106, process(es) 108, and/or asset(s) 110 of the industrial automation system 104). The set of data can comprise information relating to, for example, the respective properties, characteristics, functions, configurations, etc., of respective industrial devices 106, industrial processes 108, other industrial assets 110, or network-related devices of the network component 112; or the configuration of industrial devices 106, industrial processes, or other assets in relation to each other. For example, the properties or characteristics for industrial devices 104 or industrial processes 106 can comprise mechanical or process properties or characteristics associated with industrial devices or processes (e.g., mechanical latency, process cycle times, operating schedules, etc., associated with industrial devices). As another example, the properties or characteristics for network-related devices can comprise communication properties or characteristics (e.g., wireless and/or wireline communication functionality, type(s) of network or communication protocol(s), network or communication specifications, total bandwidth, etc.) of the respective network-related devices.

The set of data also can comprise information relating to, for example, the configuration of the network-related devices in relation to each other, or the configuration of network-related devices in relation to the industrial devices 106, industrial processes 108, and/or other industrial assets 110; software, firmware, and/or operating system utilized by the industrial automation system 104 (e.g., type(s), version(s), revision(s), configuration(s), etc., of the software, firmware, and/or operating system); functional and communicative relationships between industrial devices 106, industrial processes 108, industrial assets 110, network-related devices of the network component 112, etc. (e.g., communication connections or conditions between industrial devices, types of connections between industrial devices, communication connections between industrial devices and network-related devices, etc.). The set of data further can include information relating to, for example, human behavior or interaction in connection with the industrial automation system 104 (e.g., maintenance schedules, shift-specific or operator-specific behavior or interaction of operators with the industrial automation system); production or process flows of the industrial automation system 104 at particular times or in connection with particular projects; and/or other aspects or features of the industrial automation system 104.

The simulator generator component 116 can analyze the set of data relating to the industrial automation system 104 and/or the other industrial automation system to facilitate simulating or emulating the industrial automation system 104 and its constituent devices, processes, and other assets. Based at least in part on the results of the analysis of the set of data, the simulation generator component 116 can simulate or emulate (e.g., determine and/or generate a simulation or an emulation for) the industrial automation system 104, including determining respectively simulating or emulating the respective industrial devices 106, industrial processes 108, other assets 110, and network-related devices of the network component 112, simulating or emulating the interrelationships (e.g., system configuration, connections, etc.) between the respective industrial devices 106, industrial processes 108, other industrial assets 110, and network-related devices of the network component 112, and/or simulating or emulating the properties, characteristics, functions, etc., of the respective devices, processes, and/or assets of the industrial automation system 104, etc.

The simulation generator component 116 can generate a simulation model of the industrial automation system 104 based on the simulation or emulation of the industrial automation system 104, including the respective simulations or emulations of the respective industrial devices 106, industrial processes 108, other assets 110, and network-related devices of the network component 112, simulations or emulations of the interrelationships (e.g., system configuration, connections, etc.) between the respective industrial devices 106, industrial processes 108, other industrial assets 110, and network-related devices of the network component 112, etc.

When a set of operation data is applied to the simulation model, a response or behavior of the simulation model can be generated. The simulation generator component 116 can utilize the response or behavior produced by the simulation model in response to the application of the set of operation data to the simulation model to facilitate determining or predicting how the industrial automation system 104 will respond (or is expected to respond) when the set of operation data is applied to the industrial automation system 104. The simulation generator component 116 can store the simulation model of the industrial automation system 104, and/or response information relating to determined or predicted responses based on the simulation model, in the data store 114.

In some instances, it can be desired to modify the industrial automation system 104 to improve the performance of the industrial automation system 104, re-configure the industrial automation system 104 in connection with a particular work project, perform updates on portions (e.g., software, firmware, operating system, etc.) of the industrial automation system 104, etc. The system 100 (e.g., simulation generation system) can facilitate modeling or simulating the modification(s) to the industrial automation system 104, for example, prior to implementing the modification(s) to determine or predict the response of the industrial automation system 104 (as modified), determine or predict whether performance of the industrial automation system 104 will be improved by the modification(s), determine or predict which modification or combination of modifications of a set of potential modifications is the most preferred modification(s) of the set, and/or determine or predict a response of the industrial automation system 104 (as modified) based on application of a set of historical operation data to the system 104, etc.

For instance, if a modification(s) to the industrial automation system 104 is being considered, and/or if a request to generate a modified simulation model of a modified industrial automation system is received by the simulation generator component 116, the simulation generator component 116 can access the data store 114 to obtain a subset of modification data relating to the modification(s) being considered. The subset of modification data can comprise information relating to the properties, characteristics, functionality, configuration, version, etc., of the device(s), process(es), and/or asset(s) associated with the modification(s).

The simulation generator component 116 can analyze the subset of modification data associated with the modification(s) and the set of data associated with the industrial automation system 104. Based at least in part on the analysis results, the simulation generator component 116 can simulate or emulate the industrial automation system 104 (e.g., modified industrial automation system 104), including simulating or emulating the modification(s) to the industrial automation system 104 in relation to (e.g., in connection with) the industrial automation system 104, based on the set of data associated with the industrial automation system 104 and the subset of modification data associated with the modification(s). The simulation generator component 116 can generate the modified simulation model that can correspond to a modified industrial automation system 104 based on the simulation or emulation of the modified industrial automation system 104.

In some implementations, the simulation generator component 116 can evaluate the respective responses of the simulation model of the industrial automation system 104 (without modification) and the modified simulation of the modified industrial automation system 104. For instance, the simulation generator component 116 can apply a set of operation data to each of the simulation model and the modified simulation model to produce respective responses or behaviors (e.g., respective output or response data). The simulation generator component 116 can compare the response or behavior (e.g., response data) of the simulation model to the response or behavior (e.g., response data) of the modified simulation model, and can determine or identify any difference(s) in the respective responses.

Based on the comparison and identified difference(s) between the responses, the simulation generator component 116 can determine or predict whether performance of the industrial automation system 104 will be improved by implementing the modification(s), and/or determine or predict which modification or combination of modifications of a set of potential modifications is the most preferred modification(s) of the set, based on the set of defined operation criteria. For example, if, based on the response of the modified simulation model, the comparison, and/or identified difference(s) between the responses, the simulation generator component 116 determines that the implementation of a modification will improve the performance of the industrial automation system 104 and/or the improvement in the performance satisfies a defined level of improvement over the current (unmodified) industrial automation system 104 or satisfies a defined performance target that justifies the modification (e.g., satisfies fiscal or other constraints (e.g., the benefit (e.g., financial or other benefit) of implementing the modification exceeds the cost of the modification), satisfies performance or production requirements or targets, etc.), based on the set of defined operation criteria, the simulation generator component 116 can determine that the modification is to be implemented to modify the industrial automation system 104. The set of defined operation criteria also can relate to business-level criteria or factors (e.g., return on investment or profit associated with the modification, etc.). If, based on the response of the modified simulation model, the comparison, and/or identified difference(s) between the responses, the simulation generator component 116 determines or predicts that the implementation of a modification will not improve the performance of the industrial automation system 104 and/or the improvement in the performance does not satisfy a defined level of improvement over the current (unmodified) industrial automation system 104 or does not satisfy the defined performance target that justifies the modification, based on the set of defined operation criteria, the simulation generator component 116 can determine that the modification is not to be implemented, or at least is not recommended to be implemented, to modify the industrial automation system 104.

If there are two or more modifications of a set of potential modifications that are being considered, based on the evaluation results of the respective responses of the simulation model and modified simulation model, the simulation generator component 116 can determine or predict which modification, if any, of the two or more modifications is the most preferred, in accordance with the set of defined operation criteria, and/or can determine or predict which combination of modifications, if any, of the set of potential modifications is the most preferred, in accordance with the set of defined operation criteria.

The simulation generator component 116 can employ the simulation model and/or modified simulation model(s) associated with the industrial automation system 104 to facilitate performing various desired types of "what if" analyses. As an example, a set of historical operation data can be applied to a modified simulation model to facilitate determining or predicting how a corresponding modified industrial automation system 104 will respond or behave when subjected to the set of historical data. The simulation generator component 116 can evaluate the response (e.g., the simulation response data). Based on the evaluation, the simulation generator component 116 can facilitate determining whether a modified industrial automation system is predicted to perform differently (e.g., better or worse) than the industrial automation system 104 (or a prior version thereof) performed based on the set of historical operation data, determining or predicting an effect on (e.g., an amount of change in) production output that may result than the historical response (e.g., the historical output) of the industrial automation system 104 (or prior version thereof) in response to the set of historical operation data, and/or determining or predicting whether the modification can satisfy the defined set of operation criteria. The set of defined operation criteria also can comprise or relate to system performance criteria, user preferences or requirements (e.g., preferences or requirements of the industrial enterprise entity, preferences or requirements of a purchaser of the product, etc.), and/or business-level criteria or factors (e.g., return on investment or profit associated with the modification, material costs relating to production, current or predicted demand for a product, etc.)

The simulation generator component 116 also can employ a simulation model of an industrial automation system 104 to perform (e.g., run) work order simulations. The work order simulation can facilitate determining whether the industrial automation system 104 is capable of desirably satisfying the work order, in accordance with the set of defined operation criteria.

A set of operation data relating to the work order can be obtained from the data store 114 and/or received from a user (e.g., operator) via an interface component (e.g., a human machine interface (HMI)). For example, the simulation generator component 116 can facilitate providing a user a set of simulation tools via the interface component that can allow the user to enter all or a portion of the set of operation data relating to the work order. The work-order-related data can indicate various aspects or parameters relating to the work order, such as, for example, the type of product to be produced by the industrial automation system, the amount of product to be produced or number of pieces of the product to be produced, the start date or time for production of the product, the end date or time for completion of the production of the product, properties or characteristics associated with the product, components of the product, etc.

The simulation generator component 116 can apply the set of operation data relating to the work order to the simulation model to facilitate determining or predicting how the industrial automation system 104 will respond if or when it processes the work order. The simulation generator component 116 can evaluate the response (e.g., simulation response data) of the simulation model to the application of the set of operation data to the simulation model. The simulation generator component 116 can determine or predict a response or behavior of the industrial automation system 104 in connection with processing the work order based on the response of the simulation model to the applying of the operation data relating to the work order.

The simulation generator component 116 can evaluate the determined or predicted response or behavior of the industrial automation system in connection with the information relating to the work order that relates to order completion parameters (e.g., time constraints (e.g., production start date, intermediate order deadline(s), order completion deadline, etc.), fiscal constraints (e.g., production cost constraints, profit constraints, constraints relating to the cost of operating the industrial automation system to process the work order, etc.), product quality constraints (e.g., product or material quality constraints, engineering or error tolerances, etc.), etc.) based on the set of defined operation criteria. Based on the results of this evaluation, the simulation generator component 116 can determine whether the industrial automation system 104 can satisfy the order completion parameters based on the set of defined operation criteria, wherein the criteria can comprise or relate to preferences or requirements of the purchaser and/or preferences or requirements of the industrial enterprise entity associated with the industrial automation system 104. The set of defined operation criteria also can relate to business-level criteria or factors (e.g., return on investment or profit associated with the work order, material costs of processing the work order, current or predicted demand for the product that is the subject of the work order, etc.)

The simulation generator component 116 can generate a report, which can indicate whether the industrial automation system 104 can process and complete the work order to satisfy the order completion parameters in accordance with the set of defined operation criteria. The simulation generator component 116 can provide (e.g., transmit) the report as an output (e.g., via a communication channel, an HMI, printer, etc.) for review or analysis by another component associated with the industrial enterprise or by an operator or manager. The report also can include information relating to expected turn-around times for processing the work order, predicted overtime costs associated with running additional shifts desired to meet the workload associated with the work order, return on investment associated with the work order, etc.

Figure 2:
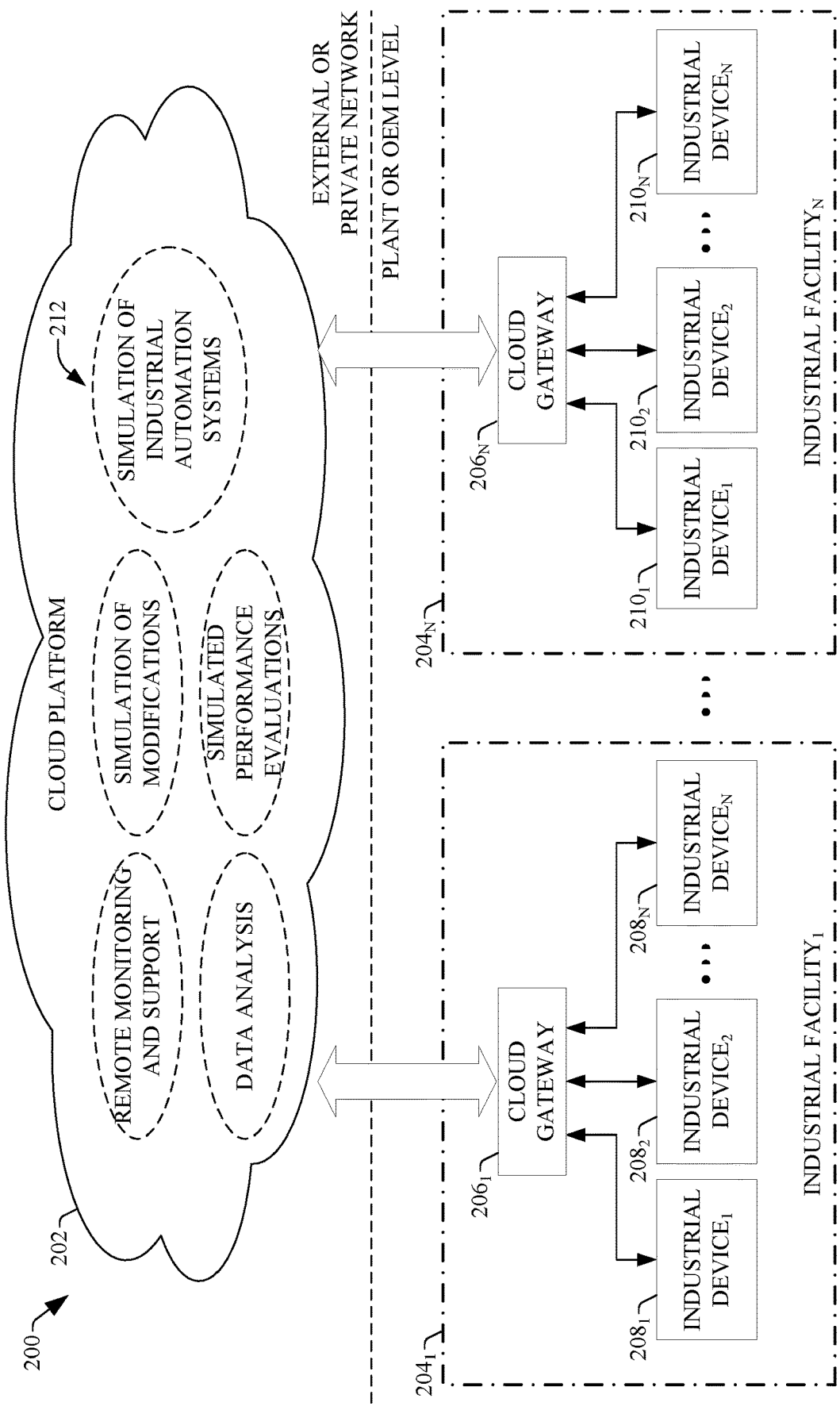
FIG. 2 is a diagram of a high-level overview of an example industrial enterprise that can leverage cloud-based services, including simulation generation services, data collection services, and data storage services, in accordance with various aspects and embodiments of the disclosed subject matter.

As disclosed herein, the simulation generation system 100, or a portion thereof, can be located in a cloud platform. To provide a general context for the cloud-based simulation generation system and services described herein, FIG. 2 illustrates a block diagram of a high-level overview of an example industrial enterprise 200 that can leverage cloud-based services, including simulation generation services, data collection services, and data storage services, in accordance with various aspects and embodiments of the disclosed subject matter. The industrial enterprise 200 can comprise one or more industrial facilities, such as industrial facility$_1$ 204$_1$ up through industrial facility$_N$ 204$_N$, wherein each industrial facilitate can include a number of industrial devices in use. For example, industrial facility 204$_1$ can comprise industrial device$_1$ 208$_1$ up through industrial device$_N$ 208$_N$, and industrial facility$_N$ 204$_N$ can comprise industrial device$_1$ 210$_1$ up through industrial device$_N$ 210$_N$. The industrial devices (e.g., 208$_1$, 208$_N$, 210$_1$, 210$_N$, etc.) can make up one or more automation systems that can operate within the respective industrial facilities (e.g., industrial facility$_1$ 204$_1$ up through industrial facility$_N$ 204$_N$). Exemplary industrial automation systems can include, but are not limited to, batch control systems (e.g., mixing systems), continuous control systems (e.g., proportional-integral-derivative (PID) control systems), or discrete control systems. Industrial devices (e.g., 208$_1$, 208$_N$, 210$_1$, 210$_N$, etc.) can include such industrial devices as industrial controllers (e.g., programmable logic controllers or other types of programmable automation controllers); field devices such as sensors and meters; motor drives; HMIs; industrial robots, barcode markers, and readers; vision system devices (e.g., vision cameras); smart welders; or other types of industrial devices.

Exemplary industrial automation systems can include one or more industrial controllers that can facilitate monitoring and controlling of their respective industrial processes. The industrial controllers can exchange data with the field devices using native hardwired input/output (I/O) or via a plant network, such as Ethernet/Internet Protocol (IP), Data Highway Plus, ControlNet, Devicenet, or the like. A given industrial controller typically can receive any combination of digital or analog signals from the field devices that can indicate a current state of the industrial devices and/or their associated industrial processes (e.g., temperature, position, part presence or absence, fluid level, etc.), and can execute a user-defined control program that can perform automated decision-making for the controlled industrial processes based on the received signals. The industrial controller can output appropriate digital and/or analog control signaling to the field devices in accordance with the decisions made by the control program. These outputs can include device actuation signals, temperature or position control signals, operational commands to a machining or material handling robot, mixer control signals, motion control signals, and the like. The control program can comprise any suitable type of code that can be used to process input signals read into the controller and to control output signals generated by the industrial controller, including, but not limited to, ladder logic, sequential function charts, function block diagrams, structured text, or other such platforms.

Although the exemplary overview illustrated in FIG. 2 depicts the industrial devices (e.g., 208$_1$, 208$_N$, 210$_1$, 210$_N$)

as residing in fixed-location industrial facilities (e.g., industrial facility$_1$ 204$_1$ up through industrial facility$_N$ 204$_N$, respectively), in some implementations, the industrial devices (e.g., 208$_1$, 208$_N$, 210$_1$, and/or 210$_N$) also can be part of a mobile control and/or monitoring application, such as a system contained in a truck or other service vehicle.

According to one or more embodiments of the disclosed subject matter, industrial devices (e.g., 208$_1$, 208$_N$, 210$_1$, 210$_N$, etc.) can be coupled to a cloud platform 202 to facilitate leveraging cloud-based applications and services (e.g., data collection services, data storage services, simulation generation services, etc.) associated with the cloud platform 202. That is, the industrial devices (e.g., 208$_1$, 208$_N$, 210$_1$, 210$_N$, etc.) can be configured to discover and interact with cloud-based computing services 212 that can be hosted by the cloud platform 202. The cloud platform 202 can be any infrastructure that can allow cloud services 212 (e.g., cloud-based computing services, shared computing services) to be accessed and utilized by cloud-capable devices. The cloud platform 202 can be a public cloud that can be accessible via a public network, such as the Internet, by devices having public network connectivity (e.g., Internet connectivity) and appropriate authorizations to utilize the cloud services 212. In some scenarios, the cloud platform 202 can be provided by a cloud provider as a platform-as-a-service (PaaS), and the cloud services 212 can reside and execute on the cloud platform 202 as a cloud-based service. In some such configurations, access to the cloud platform 202 and associated cloud services 212 can be provided to customers as a subscription service by an owner of the cloud services 212. Additionally and/or alternatively, the cloud platform 202 can be a private cloud that can be operated internally by the industrial enterprise 200 or an associated enterprise associated with a third-party entity. An exemplary private cloud platform can comprise a set of servers that can host the cloud services 212 and can reside on a private network (e.g., an intranet, a corporate network, etc.) that can be protected by a firewall.

The cloud services 212 can include, but are not limited to, data collection, data storage, data analysis, control applications (e.g., applications that can generate and deliver control instructions to industrial devices (e.g., 208$_1$, 208$_N$, 210$_1$, 210$_N$, etc.) based on analysis of real-time or near real-time system data or other factors), remote monitoring and support, simulations of industrial automation systems and modifications to industrial automation systems, performance evaluations of proposed modifications to industrial automation systems, or other applications or services relating to industrial automation. If the cloud platform 202 is a web-based cloud, industrial devices (e.g., 208$_1$, 208$_N$, 210$_1$, 210$_N$, etc.) at the respective industrial facilities 204 can interact with cloud services 212 via the public network (e.g., the Internet). In an exemplary configuration, the industrial devices (e.g., 208$_1$, 208$_N$, 210$_1$, 210$_N$, etc.) can access the cloud services 212 through separate cloud gateways (e.g., cloud gateway 206$_1$ up through cloud gateway 206$_N$) at the respective industrial facilities (e.g., industrial facility$_1$ 204$_1$ up through industrial facility$_N$ 204$_N$, respectively), wherein the industrial devices (e.g., 208$_1$, 208$_N$, 210$_1$, 210$_N$, etc.) can connect to the respective cloud gateways (e.g., cloud gateway 206$_1$ up through cloud gateway 206$_N$) through a physical (e.g., wireline) or wireless local area network or radio link. In another exemplary configuration, the industrial devices (e.g., 208$_1$, 208$_N$, 210$_1$, 210$_N$, etc.) can access the cloud platform 202 directly using an integrated cloud gateway service. Cloud gateways (e.g., cloud gateway 206$_1$ up through cloud gateway 206$_N$) also can comprise an integrated component of a network infrastructure device, such as a firewall box, router, or switch.

Providing industrial devices with cloud capability via the cloud gateways (e.g., cloud gateway 206$_1$ up through cloud gateway 206$_N$) can offer a number of advantages particular to industrial automation. For instance, cloud-based storage (e.g., cloud-based data store) offered by the cloud platform 202 can be easily scaled to accommodate the large quantities of data that can be generated daily by an industrial enterprise. Further, multiple industrial facilities (e.g., industrial facility 204$_1$ up through industrial facility$_N$ 204$_N$) at different geographical locations can migrate (e.g., communicate) their respective industrial automation data to the cloud platform 202 (e.g., via the collection component) for aggregation, collation, collective big data analysis, and enterprise-level reporting without the need to establish a private network between the respective industrial facilities. Industrial devices (e.g., 208$_1$, 208$_N$, 210$_1$, 210$_N$, etc.) and/or cloud gateways (e.g., cloud gateway 206$_1$ up through cloud gateway 206$_N$) having smart configuration capability can be configured to automatically detect and communicate with the cloud platform 202 upon installation at any facility, which can thereby simplify integration with existing cloud-based data storage, analysis, or reporting applications used by the industrial enterprise 200. In another exemplary application, cloud-based simulation applications (e.g., utilized by the simulation generation system comprising the simulation generator component) can access the data relating to an industrial automation system(s) stored in the cloud-based data store, can generate a simulation model that can simulate the operation of the industrial automation system(s), generate a modified simulation model relating to a proposed modification to the industrial automation system(s), and/or simulate operation of the simulation model and/or modified simulation model based on test operation data or historical operation data to facilitate determining or predicting a response of the corresponding industrial automation system(s) or corresponding modified industrial automation system(s), as more fully disclosed herein. These industrial cloud-computing applications are only intended to be exemplary, and the systems and methods described herein are not limited to these particular applications. As these examples demonstrate, the cloud platform 202, working with cloud gateways (e.g., cloud gateway 206$_1$ up through cloud gateway 206$_N$), can allow builders of industrial applications to provide scalable solutions as a service, removing the burden of maintenance, upgrading, and backup of the underlying infrastructure and framework.

Figure 3:
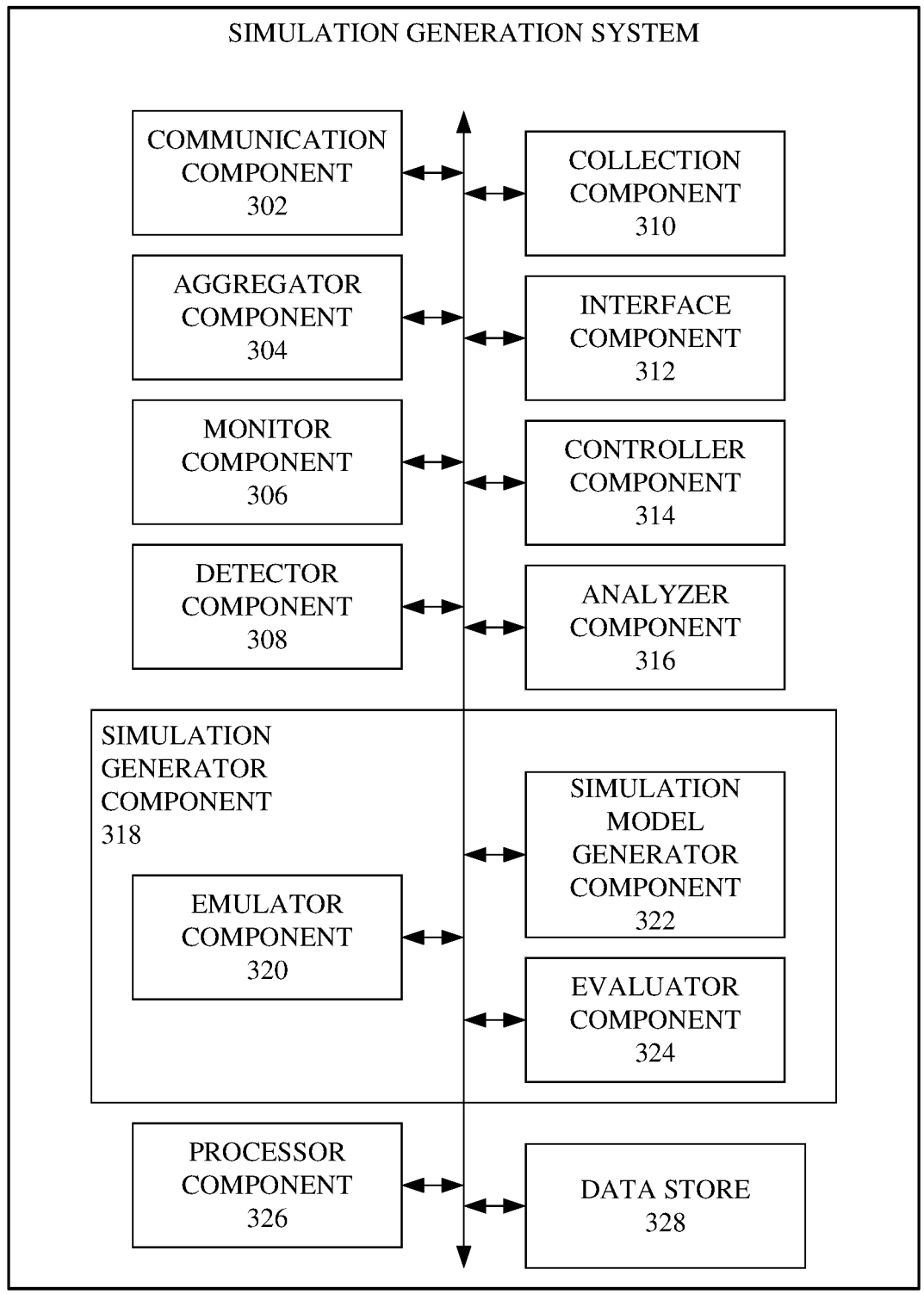
FIG. 3 presents a block diagram of an exemplary system (e.g., cloud-based, or partially cloud-based, simulation generation system) according to various implementations and embodiments of the disclosed subject matter.

FIG. 3 presents a block diagram of an exemplary system 300 (e.g., cloud-based, or partially cloud-based, simulation generation system) according to various implementations and embodiments of the disclosed subject matter. Aspects of the systems, apparatuses, or processes explained in this disclosure can constitute machine-executable components embodied within machine(s), e.g., embodied in one or more computer-readable mediums (or media) associated with one or more machines. Such components, when executed by one or more machines, e.g., computer(s), computing device(s), automation device(s), virtual machine(s), etc., can cause the machine(s) to perform the operations described.

The system 300 can comprise a communicator component 302 that can be used to communicate (e.g., transmit, receive) information between the system 300 and other components (e.g., industrial devices, other types of industrial assets that have communication functionality, other devices with communication functionality that are associated with industrial enterprises, cloud gateways, etc.). The information can include, for example, data relating to industrial automation systems, data relating to specifications, properties, or characteristics of industrial devices or other industrial assets, customer-related data, work-order-related data relating to work orders that will or may be handled by an industrial automation system, etc.

The system 300 can comprise an aggregator component 304 that can aggregate data received (e.g., obtained, collected, detected, etc.) from various entities (e.g., industrial devices, industrial assets, cloud gateways, other devices with communication functionality that are associated with industrial enterprises, processor component(s), user interface(s), data store(s), etc.). The aggregator component 304 can correlate respective items of data based at least in part on type of data, source of the data, time or date the data was generated or received, type of device or asset, identifier associated with a device or asset, customer associated with the data, industrial automation system associated with the data, industrial enterprise associated with the system, etc., to facilitate processing of the data (e.g., analyzing of the data, generating simulation models, etc.).

The system 300 also can include a monitor component 306 that can monitor device data, process data, asset data, system data, customer data, and/or other data in connection with the industrial automation systems. For instance, the monitor component 306 can monitor information (e.g., signals, device or process statuses, network communication of information, process flows, updates, modifications, etc.) associated with industrial automation systems, industrial enterprises, and/or systems or devices of customers associated with the industrial enterprises to facilitate detecting information associated with industrial automation systems that can facilitate simulating industrial automation systems. The monitor component 306 can be associated with sensors, meters, HMIs, communication monitoring components, or other components associated with industrial automation systems, industrial enterprises, and/or systems or devices of the customers to facilitate the monitoring of the industrial automation systems, industrial enterprises, and/or systems or devices of the customers.

The system 300 can comprise a detector component 308 that can detect desired information associated with industrial automation systems that can facilitate simulating industrial automation systems, in accordance with the defined operation criteria. For instance, the detector component 308 can detect desired device data, process data, asset data, system data, and/or customer data in connection with the industrial automation systems that can facilitate simulating industrial automation systems to facilitate collection of the desired data.

The system 300 also can include a collection component 310 that can receive, collect, or obtain data (e.g., desired device data, process data, asset data, system data, and/or customer data) to facilitate simulation industrial automation systems, as more fully disclosed herein. The data collected by the collection component 310 can be stored in the data store 328, and/or can be made available to other components (e.g., analyzer component 316, simulation generator component 318, etc.) to facilitate simulating industrial automation systems, evaluating operation of simulation models of industrial automation systems, and/or performing other desired functions using the data.

The system 300 can comprise an interface component 312 that can be employed to facilitate interfacing the system 300 with industrial automation systems and their constituent components (e.g., industrial devices or assets, network-related devices or assets, etc.) or processes, systems or devices associated with customers, systems or devices associated with device manufacturers, etc. For instance, the interface component 312 can be configured to receive industrial data (e.g., device data, process data, asset data, system data, configuration data, status data, process variable data, etc.) sent by one or more cloud-capable industrial devices, cloud gateways, or other sources of industrial data. The interface component 312 also can be configured to receive network-related data (e.g., data relating to communication conditions, network-status data, data identifying network-related devices, etc.) communicated by one or more network-related devices of the network component of an industrial automation system. The interface component 312 further can be configured to exchange data with one or more client or customer devices via an Internet connection. For example, the interface component 312 can receive customer profile data, requests for firmware upgrades, customer service selections, information relating to work orders for products, customer preferences or requirements with regard to a work order, or other such information from a client device (e.g., an Internet-capable client device, such as a phone, a computer, an electronic tablet or pad, or other suitable Internet-capable device). The interface component 312 also can deliver upgrade notifications, firmware upgrades, reports or notifications regarding the evaluation of and determinations regarding proposed modifications to an industrial automation system, notifications of impending device failures, identification of asset or system inefficiencies, configuration recommendations, or other such data to the client device.

The system also can contain a controller component 314 can control operations relating to processing data, generating simulation models that can simulate or emulate industrial automation systems, performing simulation operations using simulation models, determining or predicting responses of industrial automation systems based on corresponding simulation models, evaluating modifications to industrial automation systems that are under consideration, and/or other operations. The controller component 314 can facilitate controlling operations being performed by various components of the system 300, controlling data flow between various components of the system 300, controlling data flow between the system 300 and other components or systems associated with the system 300, etc.

The analyzer component 316 can analyze data (e.g., device data, process data, asset data, system data, customer data, and/or other data) to facilitate generating simulation models of industrial automation systems, evaluating modifications being considered for an industrial automation system, determining or predicting a response of an industrial automation system under a set of conditions based on a corresponding simulation model, etc. The analyzer component 316 can parse data to facilitate identifying data that is relevant to performing an operation (e.g., generating a simulation model, evaluating a modification, etc.) by the system 300. Based at least in part on the analysis of the data, the analyzer component 316 can generate analysis results that can be provided to another component (e.g., simulation generator component 318, processor component 326, etc.) to facilitate the performance of various operations by the system 300.

The system 300 also can comprise a simulation generator component 318 that can generate a simulation model that can simulate or emulate an industrial control system and can simulate operation of the industrial control system under a set of conditions based on the simulation model. The simulation generator component 318 can include an emulator component 320 that can emulate or facilitate simulating the industrial control system, including emulating or facilitating simulating the constituent components (e.g., industrial devices, industrial processes, industrial assets, network-related devices or assets, etc.) of the industrial control system, the interrelationships between respective constituent components, configurations of respective constituent components, etc., in accordance with the set of defined operation criteria, as more fully disclosed herein.

The simulation generator component 318 can comprise a simulation model generator component 322 that can generate a simulation model of the industrial automation system based on the simulation or emulation of the industrial control system, in accordance with the set of defined operation criteria. The simulation model generator component 322 can integrate the respective simulations or emulations of the constituent components of the industrial automation system, the interrelationships between respective constituent components, configurations of respective constituent components, etc., to facilitate generating the simulation model that can simulate or emulate the industrial automation system. When a modification to an industrial automation system is be considered or implemented, the emulator component 320 can emulate or facilitate simulating the modification and the interrelationship(s) of the modification with other constituent components of the industrial automation system to facilitate simulating or emulating a modified industrial automation system. The simulation model generator component 322 can generate the modified industrial automation system based on the simulation or emulation of the modification and the interrelationship(s) of the modification with other constituent components of the industrial automation system.

The simulation generator component 318 also can include an evaluator component 324 that can evaluate simulated operation of an industrial automation system (or modified industrial automation system) under a given set of conditions based on a corresponding simulation model (or corresponding modified simulation model) to facilitate determining or predicting a response of the industrial automation system (or modified industrial automation system) under the given set of conditions, determining or predicting whether an industrial automation system can adequately handle a work order for a product or processed materials based on a simulated operation and response of a corresponding simulation model, determining whether a proposed modification to an industrial automation system is suitable for implementation, determining which modification or combination of modifications is most suitable for implementation to modify an industrial automation system, and/or make other determinations or predictions relating to industrial automation systems, in accordance with the set of defined operation criteria.

The system 300 also can comprise a processor component 326 that can operate in conjunction with the other components (e.g., communicator component 302, aggregator component 304, monitor component 306, etc.) to facilitate performing the various functions and operations of the system 300. The processor component 326 can employ one or more processors (e.g., central processing units (CPUs), graphical processing units (GPUs), field-programmable gate arrays (FPGAs), etc.), microprocessors, or controllers that can process data, such as industrial data (e.g., device data, process data, asset data, system data, etc.) associated with industrial control systems, customer or client related data, data relating to parameters associated with the system 300 and associated components, etc., to facilitate generating simulation models of industrial automation systems, evaluating modifications to an industrial automation system based on simulation models of a modified industrial automation system, simulating operation of simulation models under a set of conditions to facilitate determining or predicting how the corresponding industrial automation system will respond under the set of conditions, etc.; and can control data flow between the system 300 and other components associated with the system 300.

In yet another aspect, the system 300 can contain a data store 328 that can store data structures (e.g., user data, metadata); code structure(s) (e.g., modules, objects, classes, procedures), commands, or instructions; industrial data or other data associated with industrial automation systems or industrial enterprises; customer or client related information; data relating to generation of simulation models of industrial automation systems; parameter data; algorithms (e.g., algorithm(s) relating to simulating or emulating industrial devices, industrial processes, industrial assets, network-related devices, interrelationships between such devices, processes, or assets, etc.); algorithm(s) relating to evaluating, determining, or predicting operation of an industrial automation system based on a corresponding simulation model or evaluating, determining, or predicting operation of a modified automation system based on a corresponding modified simulation model); a set of defined operation criteria; and so on. In an aspect, the processor component 326 can be functionally coupled (e.g., through a memory bus) to the data store 328 in order to store and retrieve data desired to operate and/or confer functionality, at least in part, to the communicator component 302, aggregator component 304, monitor component 306, etc., of the system 300 and/or substantially any other operational aspects of the system 300. It is to be appreciated and understood that the various components of the system 300 can communicate data, instructions, or signals between each other and/or between other components associated with the system 300 as desired to carry out operations of the system 300. It is to be further appreciated and understood that respective components (e.g., communicator component 302, aggregator component 304, monitor component 306, etc.) of the system 300 each can be a stand-alone unit, can be included within the system 300 (as depicted), can be incorporated within another component of the system 300 (e.g., within the simulator generator component 318) or a component separate from the system 300, and/or virtually any suitable combination thereof, as desired.

In accordance with various embodiments, one or more of the various components of the system 300 (e.g., communication component 302, aggregator component 304, monitor component 306, etc.) can be electrically and/or communicatively coupled to one another to perform one or more of the functions of the system 300. In some implementations, one or more components of the system 300 (e.g., communication component 302, aggregator component 304, monitor component 306, . . . , simulation generator component 318) can comprise software instructions that can be stored in the data store 328 and executed by the processor component 326. The system 300 also can interact with other hardware and/or software components not depicted in FIG. 3. For example, the processor component 326 can interact with one or more external user interface devices, such as a keyboard, a mouse, a display monitor, a touchscreen, or other such interface devices.

Figure 4:
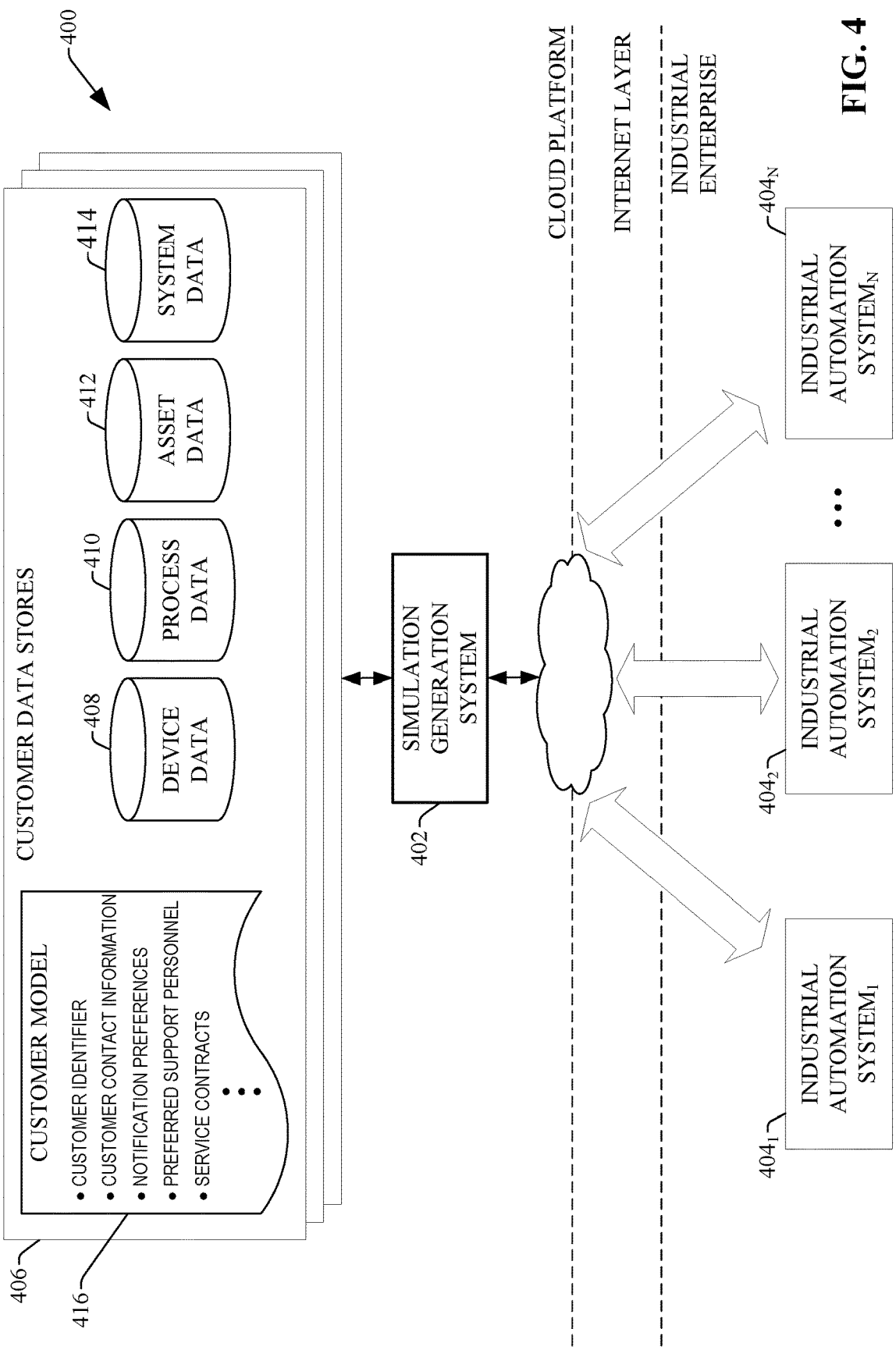
FIG. 4 illustrates a diagram of an example system that can facilitate generation of industrial simulations based at least in part collection of customer-specific industrial data by a cloud-based simulation generation system, in accordance with various aspects and embodiments of the disclosed subject matter.

FIG. 4 illustrates a diagram of an example system 400 that can facilitate generation of industrial simulations based at least in part collection of customer-specific industrial data by a cloud-based simulation generation system, in accordance with various aspects and embodiments of the disclosed subject matter. The system 400 can include a simulation generation system 402 that can execute as a cloud-based service on a cloud platform (e.g., cloud platform 202 of FIG. 2), and can collect data from multiple industrial automation systems, such as industrial automation systems $404_1$, industrial automation system$_2$ $404_2$, and/or (up through) industrial automation system$_N$ $404_N$. The industrial automation systems (e.g., $404_1$, $404_2$, $404_N$) can comprise different industrial automation systems within a given facility and/or different industrial facilities at diverse geographical locations. Industrial automation systems (e.g., $404_1$, $404_2$, $404_N$) also can correspond to different business entities (e.g., different industrial enterprises or customers), wherein the simulation generation system 402 can collect and maintain a distinct customer data store 406 for each customer or business entity.

The simulation generation system 402 can organize manufacturing data collected from the industrial automation systems (e.g., $404_1$, $404_2$, $404_N$) according to various classes. In the illustrated example, manufacturing data can be classified according to device data 408, process data 410, asset data 412, and system data 414.

Figure 5:
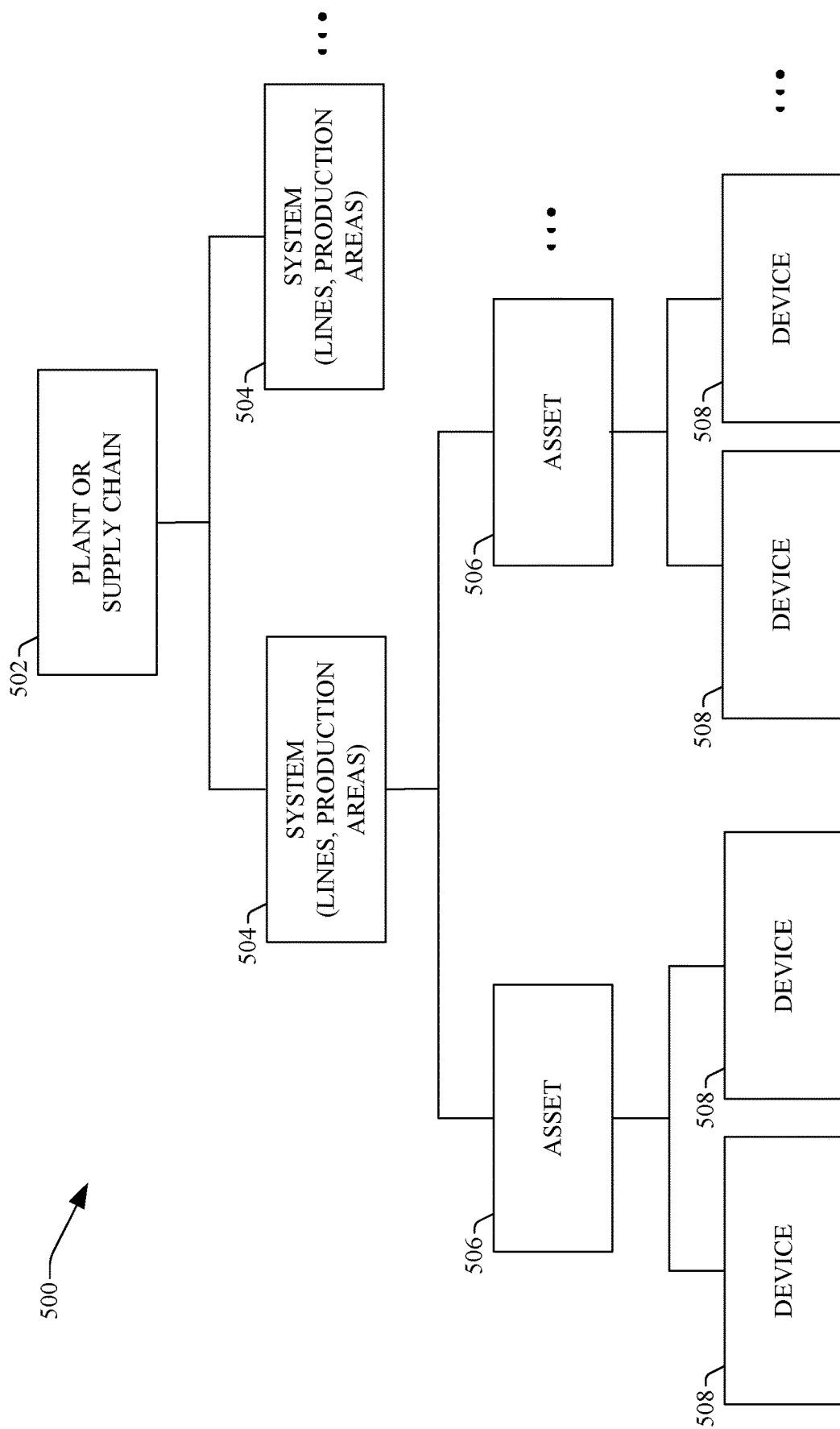
FIG. 5 illustrates a diagram of an example hierarchical relationship between these example data classes.

Referring briefly to FIG. 5, FIG. 5 illustrates a diagram of an example hierarchical relationship 500 between these example data classes. A given plant or supply chain 502 can comprise one or more industrial automation systems 504. The industrial automation systems 504 can represent the production lines or productions areas within a given plant facility or across multiple facilities of a supply chain. Each industrial automation system 504 can comprise a number of assets 506 that can represent the machines and equipment that make up the industrial automation system (e.g., the various stages of a production line). In general, each asset 506 can comprise one or more industrial devices 508, which can include, for example, the programmable controllers, motor drives, HMIs, sensors, meters, etc. comprising the asset 506. The various data classes depicted in FIGS. 4 and 5 are only intended to be exemplary, and it is to be appreciated that any organization of industrial data classes maintained by the simulation generation system 402 is within the scope of one or more embodiments of the disclosed subject matter.

Returning again to FIG. 4, the simulation generation system 402 can collect and maintain data from the various devices and assets that make up the industrial automation systems 504 and can classify the data according to the aforementioned classes for the purposes of facilitating analysis of the data, generation of simulation models of the industrial automation systems (e.g., $404_1$, $404_2$, $404_N$), and/or performing other operations by the simulation generation system 402. Device data 408 can comprise device-level information relating to the identity, configuration, and status of the respective devices comprising the industrial automation systems (e.g., $404_1$, $404_2$, $404_N$), including but not limited to device identifiers, device statuses, current firmware versions, health and diagnostic data, device documentation, identification and relationship of neighboring devices that interact with the device, etc.

The process data 410 can comprise information relating to one or more processes or other automation operations carried out by the devices; e.g., device-level and process-level faults and alarms, process variable values (speeds, temperatures, pressures, etc.), and the like.

The asset data 412 can comprise information generated, collected, determined, or inferred based on data that can be aggregated from various (e.g., multiple) industrial devices over time, which can yield higher asset-level views of the industrial automation systems (e.g., $404_1$, $404_2$, $404_N$). Example asset data 412 can include performance indicators (KPIs) for the respective assets, asset-level process variables, faults, alarms, etc. Since the asset data 412 can yield a relatively longer term view of asset characteristics relative to the device and process data, the simulation generation system 402 can leverage the asset data 412 to facilitate identifying operational patterns and correlations unique to each asset, among other types of analysis, and this can facilitate simulation or emulation of the respective assets and generation of a simulation model of an industrial control system based on the simulation or emulation of the respective assets associated with the industrial control system.

The system data 414 can comprise collected, determined, or inferred information that can be generated based on data that can be aggregated from various (e.g., multiple) assets over time. The system data 414 can characterize system behavior within a large system of assets, yielding a system-level view of each of the industrial automation systems (e.g., $404_1$, $404_2$, $404_N$). The system data 414 also can document the particular system configurations in use and industrial operations performed at each of the industrial automation systems (e.g., $404_1$, $404_2$, $404_N$). For example, the system data 414 can document the arrangement of assets, interconnections between devices, the product being manufactured at a given facility, an industrial process performed by the assets, a category of industry of each industrial system (e.g., automotive, oil and gas, food and drug, marine, textiles, etc.), or other relevant information. Among other functions, this data can be accessed by technical support personnel during a support session so that particulars of the customer's unique system and device configurations can be obtained without reliance on the customer to possess complete knowledge of their assets.

As an example, a given industrial facility can include a packaging line (e.g., the system), which in turn can comprise a number of individual assets (e.g., a filler, a labeler, a capper, a palletizer, etc.). Each asset can comprise a number of devices (e.g., controllers, variable frequency drives, HMIs, etc.). Using an architecture similar to that depicted in FIG. 2, the simulation generation system 402 can collect industrial data from the individual devices during operation and can classify the data in the customer data store 406 according to the aforementioned classifications. Note that some data may be duplicated across more than one class. For example, a process variable classified under process data 410 also can be relevant to the asset-level view of the system represented by the asset data 412. Accordingly, such process variables can be classified under both classes. Moreover, subsets of data in one classification can be derived, determined, or inferred based on data under another classification. For example, subsets of system data 414 that characterize certain system behaviors can be derived, determined, or inferred based on a long-term analysis of data in the lower-level classifications.

In addition to maintaining the data classes (e.g., 408, 410, 412, 414), each customer data store also can maintain a customer model 416 that can contain data specific to a given industrial entity or customer. The customer model 416 can contain customer-specific information and preferences, which can be leveraged by (e.g., used by) the simulation generation system 402 to facilitate generating a simulation model (or modified simulation model) that can be representative of an industrial automation system (or a modified simulation model), evaluating the performance or response of a simulation model (or modified simulation model) under a set of conditions, determining or predicting a response of an industrial automation system (or modified industrial automation system) based on the simulation model (or modified simulation model), etc. Example information that can be maintained in the customer model 416 can include a client identifier, client preferences or requirements with regard to production or work orders associated with an industrial automation system, client contact information specifying which plant personnel are to be notified in response to results of an evaluation of a simulation of an industrial automation system or modification thereof, notification preferences that can specify how plant personnel are to be notified (e.g., email, mobile phone, text message, etc.), service contracts that are active between the customer and the technical support entity, and other such information. The simulation generation system 402 can marry (e.g., associate, unite, map, etc.) data collected for each customer with the corresponding customer model 416 for identification and event handling purposes.

As noted above, industrial data can be migrated (e.g., communicated) from industrial devices to the cloud platform (e.g., 102) using cloud gateways. To this end, some devices can include integrated cloud gateways that can directly interface each device to the cloud platform. Additionally or alternatively, some configurations can utilize a cloud proxy device that can collect industrial data from multiple devices associated with the industrial automation systems (e.g., $404_1$, $404_2$, $404_N$) and can send (e.g., transmit) the data to the cloud platform. Such a cloud proxy can comprise a dedicated data collection device, such as a proxy server that can share a network (e.g., communication network) with the industrial devices. Additionally or alternatively, the cloud proxy can be a peer industrial device that can collect data from other industrial devices.

Figure 6:
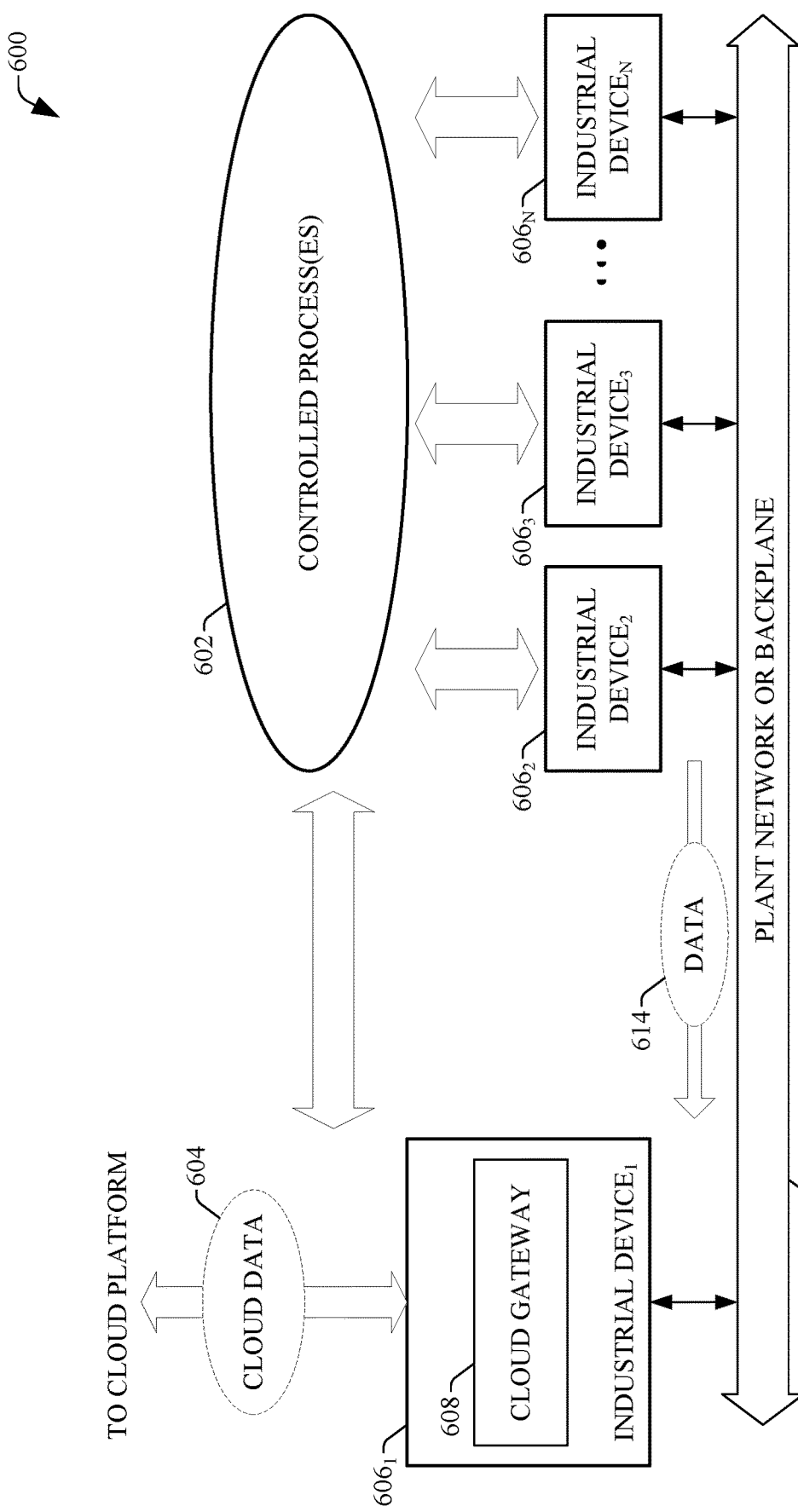
FIG. 6 depicts a block diagram of an example system that can be configured to comprise an industrial device that can act or operate as a cloud proxy for other industrial devices of an industrial automation system to facilitate migrating industrial data to the cloud platform for classification and analysis by the simulation generation system, in accordance with various aspects and implementations of the disclosed subject matter.
Figure 7:
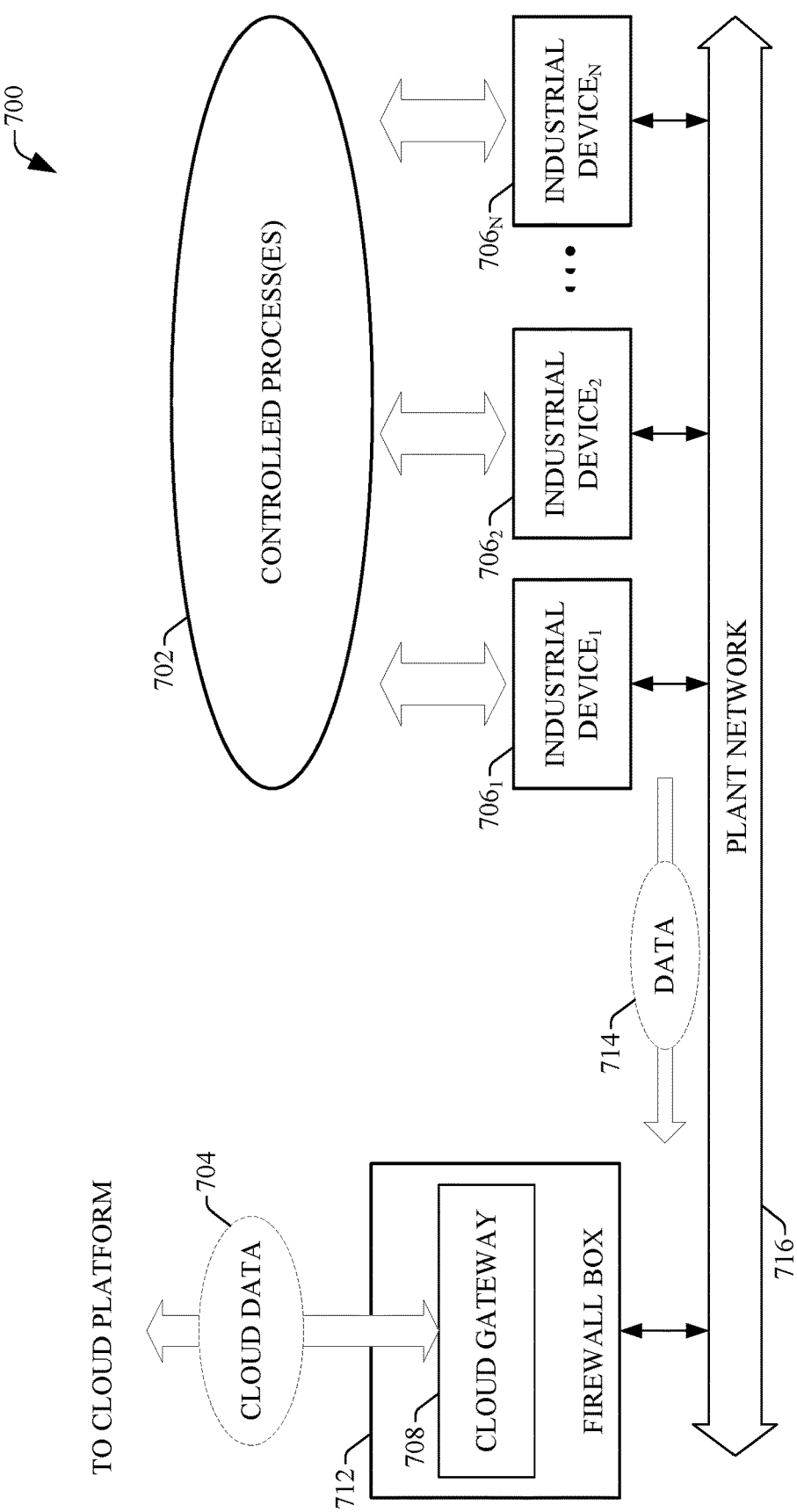
FIG. 7 illustrates a block diagram of an example system that can employ a firewall box that can serve as a cloud proxy for a set of industrial devices to facilitate migrating industrial data to the cloud platform for classification and analysis by the simulation generation system, in accordance with various aspects and implementations of the disclosed subject matter.

FIGS. 6 and 7 depict block diagrams of example systems 600 and 700, respectively, illustrating respective techniques that can facilitate migrating industrial data to the cloud platform via proxy devices for classification and analysis by the simulation generation system, in accordance with various aspects and implementations of the disclosed subject matter. FIG. 6 depicts the system 600 that can be configured to comprise an industrial device that can act or operate as a cloud proxy for other industrial devices of an industrial automation system. The industrial automation system can comprise a plurality of industrial devices, including industrial device$_1$ $606_1$, industrial device$_2$ $606_2$, industrial device$_3$ $606_3$, and/or (up through) industrial device$_N$ $606_N$, that collectively can monitor and/or control one or more controlled processes 602. The industrial devices $606_1$, $606_2$, $606_3$, and/or (up through) $606_N$ respectively can generate and/or collect process data relating to control of the controlled process(es) 602. For industrial controllers such as PLCs or other automation controllers, this can include collecting data from telemetry devices connected to an industrial controller's I/O, generating data internally based on measured process values, etc.

In the configuration depicted in FIG. 6, industrial device$_1$ $606_1$ can act, operate, or function as a proxy for industrial devices $606_2$, $606_3$, and/or (up through) $606_N$, whereby the data 614 from devices $606_2$, $606_3$, and/or (up through) $606_N$ can be sent (e.g., transmitted) to the cloud via proxy industrial device$_1$ $606_1$. Industrial devices $606_2$, $606_3$, and/or (up through) $606_N$ can deliver their respective data 614 to the proxy industrial device$_1$ $606_1$ over the plant network or backplane 612 (e.g., a Common Industrial Protocol (CIP) network or other suitable network protocol). Using such a configuration, it is only necessary to interface one industrial device to the cloud platform (via cloud gateway 608). In some embodiments, the cloud gateway 608 can perform preprocessing on the gathered data prior to migrating the data to the cloud platform (e.g., time stamping, filtering, formatting, normalizing, summarizing, compressing, etc.). The collected and processed data can be pushed (e.g., transmitted) to the cloud platform as cloud data 604 via cloud gateway 608. Once migrated to the cloud platform, the cloud-based simulation generation system can classify the data according to the example classifications described herein and/or can utilize the data to facilitate performing various operation relating to simulating industrial automation systems.

While the proxy device illustrated in FIG. 6 is depicted as an industrial device that itself can perform monitoring and/or control of a portion of controlled process(es) 602, other types of devices also can be configured to serve as cloud proxies for multiple industrial devices according to one or more implementations of the disclosed subject matter. For example, FIG. 7 illustrates an example system 700 that can comprise a firewall box 712 that can serve as a cloud proxy for a set of industrial devices $706_1$, $706_2$, and/or (up through) $706_N$. The firewall box 712 can act as a network infrastructure device that can allow the plant network 716 to access an outside network such as the Internet, while also providing firewall protection that can prevent unauthorized access to the plant network 716 from the Internet. In addition to these firewall functions, the firewall box 712 can include a cloud gateway 708 that can interface the firewall box 712 with one or more cloud-based services (e.g., simulation generation services, data collection services, data storage services, etc.). In a similar manner to the proxy industrial device $606_1$ of FIG. 6, the firewall box 712 of FIG. 7 can collect industrial data 714 from including industrial device$_1$ $706_1$, industrial device$_2$ $706_2$, and/or (up through) industrial device$_N$ $706_N$, which can monitor and control respective portions of controlled process(es) 702. Firewall box 712 can include a cloud gateway 708 that can apply appropriate pre-processing to the gathered industrial data 714 prior to pushing (e.g., communicating) the data to the cloud-based simulation generation system as cloud data 704. Firewall box 712 can allow industrial devices $706_1$, $706_2$, and/or (up through) $706_N$ to interact with the cloud platform without directly exposing the industrial devices to the Internet.

In some embodiments, the cloud gateway 608 of FIG. 6 or cloud gateway 708 of FIG. 7 can tag the collected industrial data (e.g., 614 or 714) with contextual metadata prior to pushing the data as cloud data (e.g., 604 or 704) to the cloud platform. Such contextual metadata can include, for example, a time stamp, a location of the device at the time the data was generated, or other contextual information. In another example, some cloud-aware devices can comprise smart devices capable of determining their own context within the plant or enterprise environment. Such devices can determine their location within a hierarchical plant context or device topology. Data generated by such devices can adhere to a hierarchical plant model that can define multiple hierarchical levels of an industrial enterprise (e.g., a workcell level, a line level, an area level, a site level, an enterprise level, etc.), such that the data can be identified (e.g., by the simulation generation system) in terms of these hierarchical levels. This can allow a common terminology to be used across an entire industrial enterprise to identify devices and their associated data. Cloud-based applications and services that model an enterprise according to such an organizational hierarchy can represent industrial controllers, devices, machines, or processes as data structures (e.g., type instances) within this organizational hierarchy to provide context for data generated by respective devices within the enterprise relative to the enterprise as a whole. Such a convention can replace the flat name structure that is employed by some industrial applications.

In some embodiments, the cloud gateway 608 of FIG. 6 or cloud gateway 708 of FIG. 7 can comprise uni-directional "data only" gateways that can be configured only to move data from the premises (e.g., industrial facility) to the cloud platform. Alternatively, the cloud gateways 608 and 708 can comprise bi-directional "data and configuration" gateways that additionally can be configured to receive configuration or instruction data from services running on the cloud platform. Some cloud gateways can utilize store-and-forward technology that can allow the gathered industrial data (e.g., 614 or 714) to be temporarily stored locally on storage associated with the cloud gateway (e.g., 608 or 708) in the event that communication between a gateway and the cloud platform is disrupted. In such events, the cloud gateway (e.g., 608 or 708) can forward (e.g., communicate) the stored data to the cloud platform when the communication link is re-established.

To ensure a rich and descriptive set of data for analysis purposes, the cloud-based simulation generation system can collect device data in accordance with one or more standardized device models. To this end, a standardized device model can be developed for each industrial device. Device models can profile the device data that is available to be collected and maintained by the simulation generation system.

Figure 8:
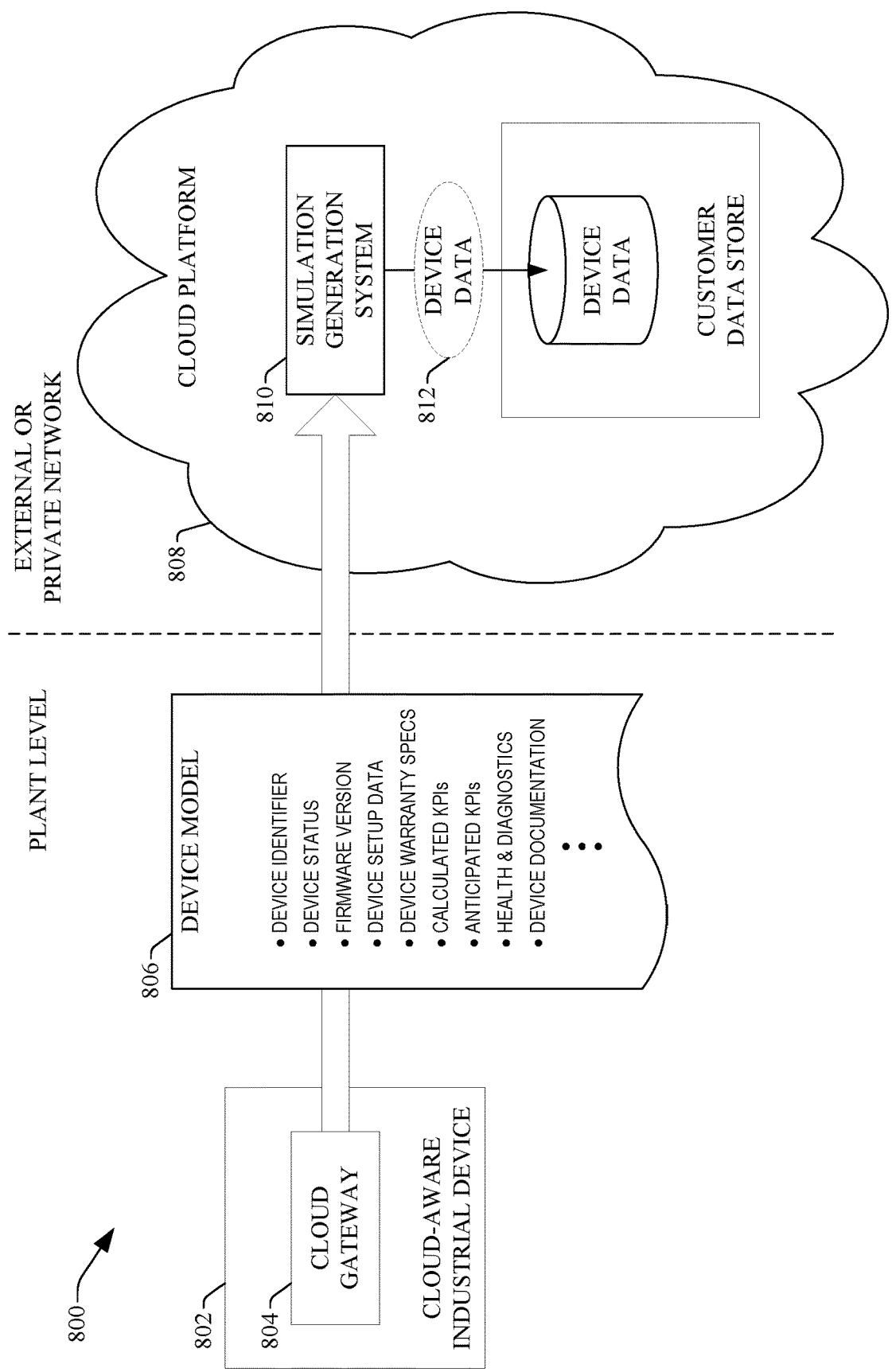
FIG. 8 illustrates a block diagram of an example device model according to various aspects and implementations of the disclosed subject matter.

FIG. 8 illustrates a block diagram of an example device model 800 according to various aspects and implementations of the disclosed subject matter. In the illustrated example model 800, the device model 806 can be associated with a cloud-aware industrial device 802 (e.g., a programmable logic controller, a variable frequency drive, an HMI, a vision camera, a barcode marking system, etc.). As a cloud-aware device, the industrial device 802 can be configured to automatically detect and communicate with the cloud platform 808 upon installation at a plant facility, simplifying integration with existing cloud-based data storage, analysis, and applications (e.g., as performed by the simulation generation system described herein). When added to an existing industrial automation system, the industrial device 802 can communicate with the cloud platform and can send identification and configuration information in the form of the device model 806 to the cloud platform 808. The device model 806 can be received by the simulation generation system 810, which can update the customer's device data 812 based on the device model 806. In this way, the simulation generation system 810 can leverage the device model 806 to facilitate integrating the new industrial device 802 into the greater system as a whole. This integration can include the simulation generation system 810 updating cloud-based applications or services to recognize the new industrial device 802, adding the new industrial device 802 to a dynamically updated data model of the customer's industrial enterprise or plant, modifying a simulation model of the industrial automation system to integrate, incorporate, or include a simulation or an emulation of the new industrial device 802 based on the identification and configuration information (or other data), determining or predicting a response of the modified industrial automation system based on a modified simulation model that integrates the new industrial device 802, making other devices on the plant floor aware of the new industrial device 802, or other desired integration functions. Once deployed, some data items comprising the device model 806 can be collected and monitored by the simulation generation system 810 on a real-time or near real-time basis.

The device model 806 can comprise such information as a device identifier (e.g., model and serial number) associated with the industrial device 802, status information for the industrial device 802, a currently installed firmware version associated with the industrial device 802, device setup data associated with the industrial device 802, warranty specifications associated with the industrial device 802, calculated and/or anticipated KPIs associated with the industrial device 802 (e.g., mean time between failures), health and diagnostic information associated with the industrial device 802, device documentation, or other such parameters.

Figure 9:
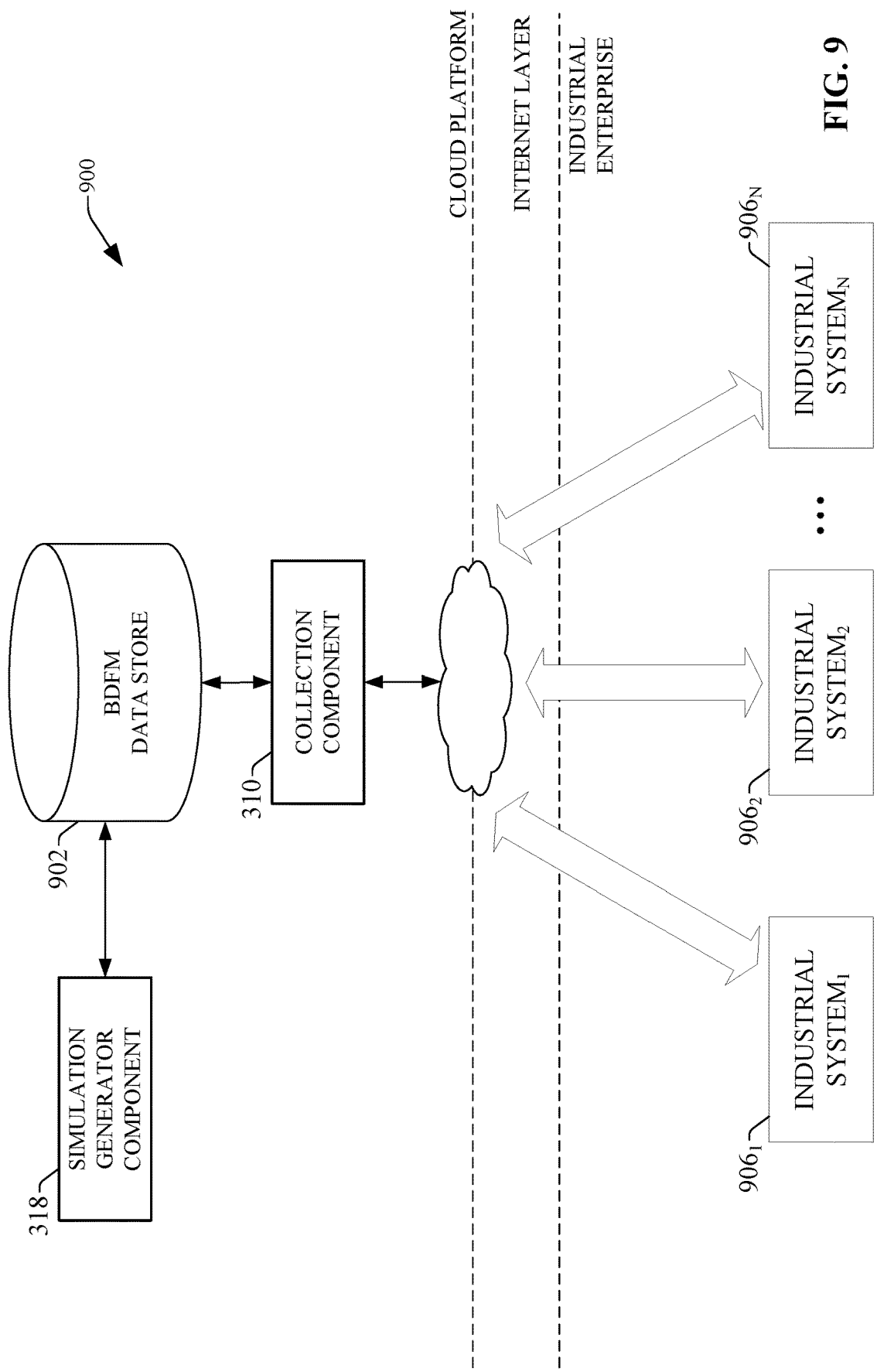
FIG. 9 presents a block diagram of an example system that can facilitate collection of data from devices and assets associated with respective industrial automation systems for storage in cloud-based data storage, in accordance with various aspects and implementations of the disclosed subject matter.

In addition to maintaining individual customer-specific data stores for each industrial enterprise, the simulation generation system (e.g., cloud-based simulation generation system) also can feed (e.g., transmit) sets of customer data to a global data storage (referred to herein as cloud-based data store or Big Data for Manufacturing (BDFM) data store) for collective big data analysis in the cloud platform (e.g., by the simulation generation system). FIG. 9 presents a block diagram of an example system 900 that can facilitate collection of data from devices and assets associated with respective industrial automation systems for storage in cloud-based data storage, in accordance with various aspects and implementations of the disclosed subject matter. As illustrated in FIG. 9, the collection component 310 of the simulation generation system (e.g., as facilitated by the interface component 312) can collect data from devices and assets comprising respective different industrial automation systems, such as industrial automation system$_1$ 906$_1$, industrial automation system$_2$ 906$_2$, and/or (up through) industrial automation system$_N$ 906$_N$, for storage in a cloud-based BDFM data store 902. In some embodiments, data maintained in the BDFM data store 902 can be collected anonymously with the consent of the respective customers. For example, customers can enter into a service agreement with a technical support entity whereby the customer can agree to have their device and asset data collected by the simulation generation system in exchange for simulation generation services or a credit towards simulation generation services. The data maintained in the BDFM data store 902 can include all or portions of the classified customer-specific data described in connection with FIG. 4, as well as additional data (e.g., derived, determined, or inferred data). The simulation generator component 318 or another component of the simulation generation system can organize the collected data stored in the BDFM data store 902 according to device type, system type, application type, applicable industry, or other relevant categories. The simulation generator component 318 can analyze data stored in the resulting multi-industry, multi-customer data store (e.g., BDFM data store 902) to facilitate learn, determine, or identify industry-specific, device-specific, and/or application-specific trends, patterns, thresholds (e.g., device-related thresholds, network-related thresholds, etc.), industrial-automation-system interrelationships between devices or assets, etc., associated with the industrial automation systems associated with the cloud platform. In general, the simulation generator component 318 can perform a data analysis (e.g., big data analysis) on data (e.g., the multi-industrial enterprise data) maintained (e.g., stored in) the BDFM data store 902 to learn, determine, identify, characterize, simulate, and/or emulate operational industrial-automation-system interrelationships, thresholds, trends, or patterns associated with industrial automation systems as a function of industry type, application type, equipment in use, asset configurations, device configuration settings, or other types of variables.

For example, it can be known that a given industrial asset (e.g., a device, a configuration of device, a machine, etc.) can be used across different industries for different types of industrial applications. Accordingly, the simulation generator component 318 can identify a subset of the global data stored in BDFM data storage 902 relating to the asset or asset type, and perform analysis on this subset of data to determine how the asset or asset type performs over time and under various types of operating conditions for each of multiple different industries or types of industrial applications. The simulation generator component 318 also can determine the operational behavior of the asset or asset type over time and under various types of operating conditions for each of different sets of operating constraints or parameters (e.g. different ranges of operating temperatures or pressures, different recipe ingredients or ingredient types, etc.). The simulation generator component 318 can leverage (e.g., use) a large amount of historical data relating to the asset or asset type that has been gathered (e.g., collected and/or aggregated) from many different industrial automation systems to facilitate learning or determining common operating characteristics of many diverse configurations of industrial assets or asset types at a relatively high degree of granularity and under many different operating contexts. The simulation generator component 318 can use the learned or determines operating characteristics relating to the industrial assets or asset types to facilitate simulating or emulating the industrial assets or asset types when employed in an industrial automation system.

Figure 10:
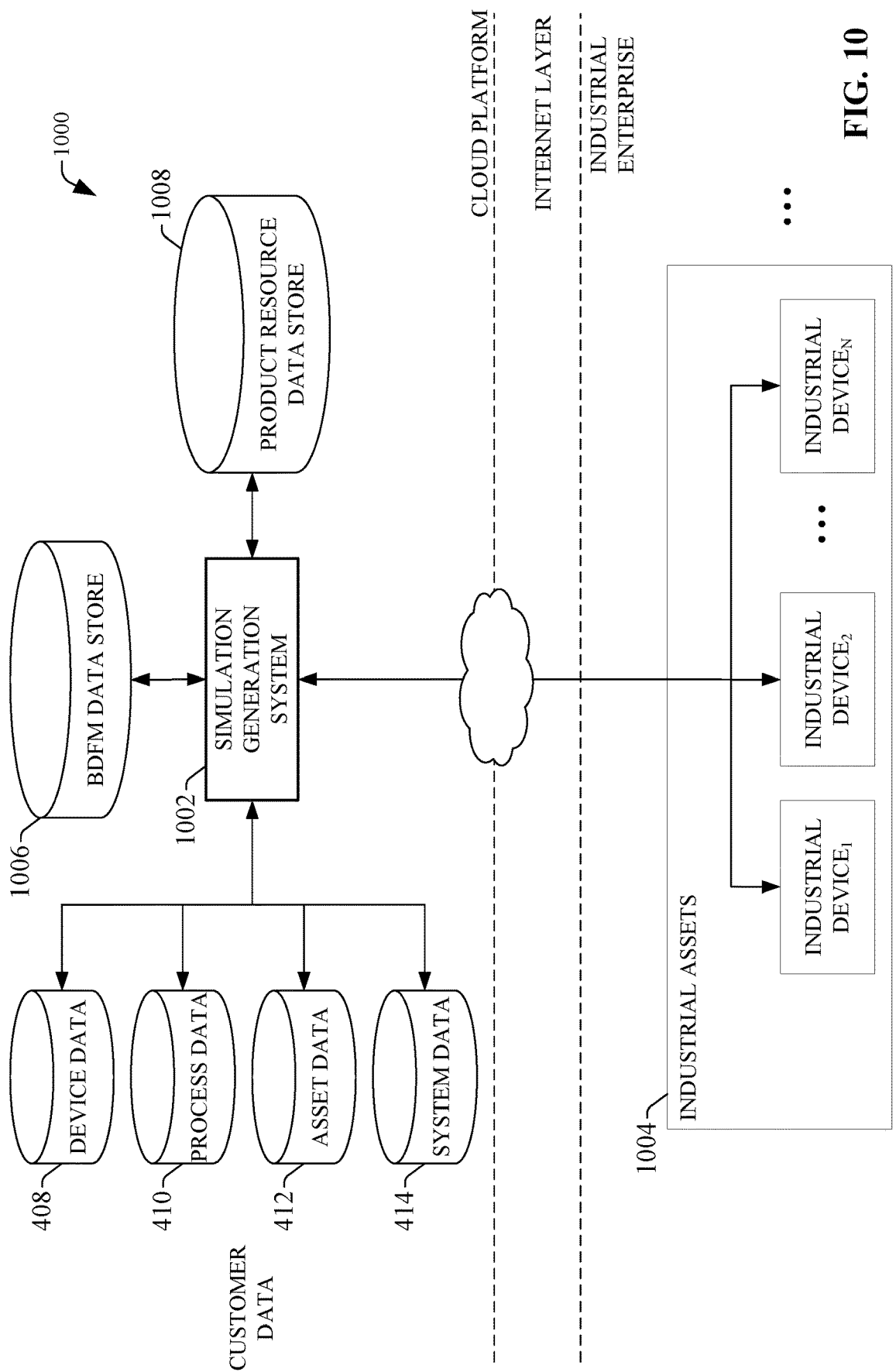
FIG. 10 illustrates a block diagram of a cloud-based system that can employ a simulation generation system to facilitate simulation generation services associated with industrial automation systems, in accordance with various aspects and embodiments of the disclosed subject matter.

FIG. 10 illustrates a block diagram of a cloud-based system 1000 that can employ a simulation generation system to facilitate simulation generation services associated with industrial automation systems, in accordance with various aspects and embodiments of the disclosed subject matter. As disclosed herein, the simulation generation system 1002 can collect, maintain, and monitor customer-specific data (e.g. device data 408, process data 410, asset data 412, and system data 414) relating to one or more industrial assets 1004 of an industrial enterprise. In addition, the simulation generation system 1002 can collect and organize industrial data anonymously (with customer consent) from multiple industrial enterprises, and can store such industrial data in a BDFM data store 1006 for collective analysis by the simulation generation system 1002, for example, as described herein.

The simulation generation system 1002 also can collect product resource information and maintain (e.g., store) the product resource information in the cloud-based product resource data store 1008. In general, the product resource data store 1008 can maintain up-to-date information relating to specific industrial devices or other vendor products in connection with industrial automation systems. Product data stored in the product resource data store 1008 can be administered by the simulation generation system 1002 and/or one or more product vendors or OEMs. Exemplary device-specific data maintained by the product resource data store 1008 can include product serial numbers, most recent firmware revisions, preferred device configuration settings and/or software for a given type of industrial application, or other such vendor-provided information.

The system depicted in FIG. 10 can provide simulation generation services to subscribing customers (e.g., owners of industrial assets 1004). For example, customers can enter an agreement with a product vendor or technical support entity to allow their system data to be gathered anonymously and fed into (e.g., communicated to and stored in) the BDFM data store 1006, and this thereby can expand the store of global data available for collective analysis by the simulation generation system 1002. In exchange, the vendor or technical support entity can agree to provide customized simulation generation services to the customer (e.g., real-time or near real-time system monitoring, evaluation of proposed modification to an industrial automation system, simulation and evaluation of a performance of an industrial automation system in connection with a work order, etc.). Alternatively, the customer can subscribe to one or more available simulation generation services that can be provided by the simulation generation system 1002, and optionally can allow their system data to be maintained in the BDFM data store 1006. In some embodiments, a customer can be given an option to subscribe to simulation generation services without permitting their data to be stored in the BDFM data store 1006 for collective analysis with data from other systems (e.g., industrial automation systems). In such cases, the customer's data will only be maintained as customer data (e.g., in customer data store 406) for the purposes of generating and evaluating simulations of an industrial automation system(s) relating to that particular customer, and the collected customer data will be analyzed in connection with data stored in the BDFM data store 1006 and the product resource data store 1008 without that customer data being migrated for storage in the BDFM data store 1006 for long-term storage and analysis. In another exemplary agreement, customers can be offered a discount on simulation generation services in exchange for allowing their system data to be anonymously migrated to the BDFM data store 1006 for collective analysis by the simulation generation system 1002.

In accordance with various aspects, the customer-specific data can include device and/or asset level faults and alarms, process variable values (e.g., temperatures, pressures, product counts, cycle times, etc.), calculated or anticipated key performance indicators for the customer's various assets, indicators of system behavior over time, and other such information. The customer-specific data also can include documentation of firmware versions, configuration settings, and software in use on respective devices of the customer's industrial assets. Moreover, the simulation generation system 1002 can take into consideration customer information encoded in customer model 416, which can have a bearing on inferences made by the simulation generation system 1002 based on the analysis (e.g., big data analysis) stored in the BDFM data store 1006. For example, customer model 416 may indicate a type of industry that is the focus of the customer's business (e.g., automotive, food and drug, oil and gas, fibers and textiles, power generation, marine, etc.). Knowledge of the customer's industry can facilitate enabling the simulation generation system 1002 to correlate the customer-specific data with data relating to similar systems and applications in the same industry, as documented by the data stored in the BDFM data storage 1006.

Taken together, customer-specific data and a customer model (e.g., 416) can facilitate accurately modeling the customer's industrial enterprise at a highly granular level, from high-level system behavior over time down to the device and software level. The analyzing (e.g., by the simulation generation system 1002) of this customer-specific data in view of global industry-specific and application-specific trends learned via analysis of data stored in the BDFM data storage 1006, as well as vendor-provided device information maintained in the product resource data storage 1008, can facilitate generation accurate simulation models of industrial automation systems.

The aforementioned systems and/or devices have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

FIGS. 11-17 illustrate various methods in accordance with one or more embodiments of the subject application. While, for purposes of simplicity of explanation, the one or more methods shown herein are shown and described as a series of acts, it is to be understood and appreciated that the disclosed subject matter is not limited by the order of acts, as some acts may, in accordance therewith, occur in a different order and/or concurrently with other acts from that shown and described herein. For example, those skilled in the art will understand and appreciate that a method could alternatively be represented as a series of interrelated states or events, such as in a state diagram. Moreover, not all illustrated acts may be required to implement a method in accordance with the disclosed subject matter. Furthermore, interaction diagram(s) may represent methods, in accordance with the subject disclosure when disparate entities enact disparate portions of the methods. Further yet, two or more of the disclosed example methods can be implemented in combination with each other, to accomplish one or more features or advantages described herein.

Figure 11:
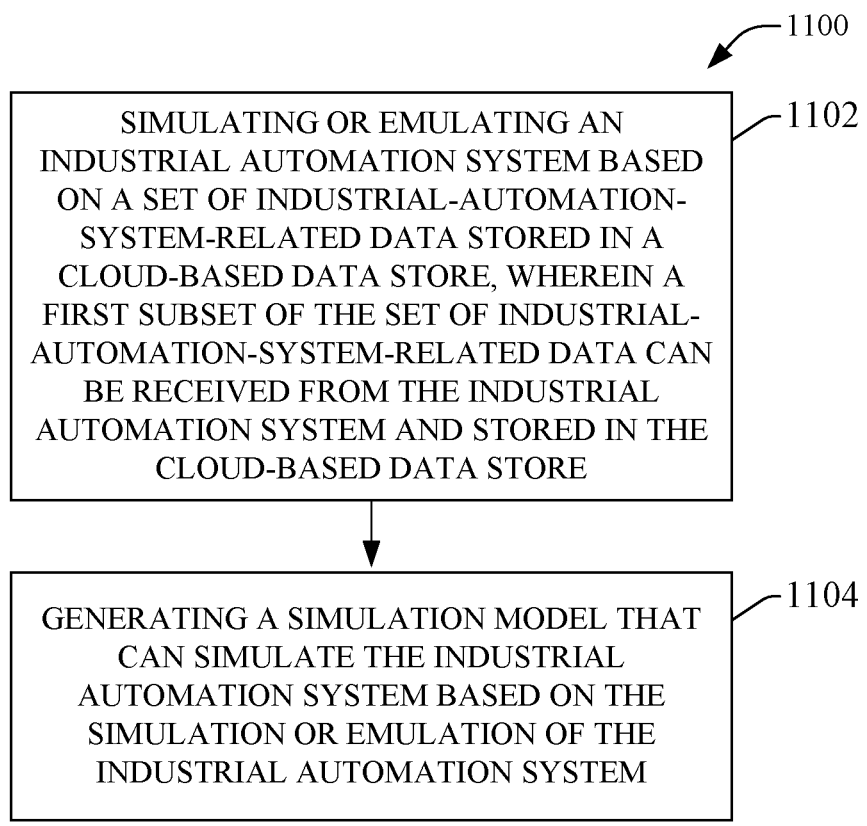
FIG. 11 illustrates a flow diagram of an example method that can facilitate simulating an industrial automation system based on cloud-based data relating to an industrial automation system, in accordance with various aspects and embodiments of the disclosed subject matter.

FIG. 11 illustrates a flow diagram of an example method 1100 that can facilitate simulating an industrial automation system based on cloud-based data relating to an industrial automation system, in accordance with various aspects and embodiments of the disclosed subject matter. The method 1100 can be implemented by a simulation generation system that can comprise a simulation generator component and/or another component(s) (e.g., a collection component, a cloud-based data store, etc.).

At 1102, an industrial automation system can be simulated or emulated based on a set of industrial-automation-system-related data stored in a cloud-based data store, wherein a first subset of the set of industrial-automation-system-related data can be received (e.g., collected, obtained, detected, etc.) from the industrial automation system and stored in the cloud-based data store. The set of industrial-automation-system-related data can comprise, for example, device-related data (e.g., industrial device-related data), asset-related data, process-related data (e.g., industrial-automation-process-related data), and/or other industrial-automation-system-related data associated with an industrial enterprise. The industrial-automation-system-related data can be migrated (e.g., communicated) to the cloud platform using one or more cloud gateways (e.g., communication gateway components) that can serve as uni-directional or bi-directional communication interfaces between industrial devices of the industrial automation system and the cloud platform. The device-related data, asset-related data, process-related data, and/or other industrial-automation-system-related data can be stored in the cloud-based data store in association with identification information, such as, for example, a customer identifier and other customer-specific information.

The collection component can facilitate collecting or obtaining the industrial-automation-system-related data, and can store the industrial-automation-system-related data in the cloud-based data store. The simulation generator component can access the cloud-based data store and can receive (e.g., collect, obtain, etc.) the set of industrial-automation-system-related data from the cloud-based data store. The simulation generator component can simulate or emulate the industrial automation system based on the set of industrial-automation-system-related data. For example, the simulation generator component can simulate or emulate industrial devices, software and/or firmware configurations (including software or firmware revisions or updates) associated with industrial devices and/or other components of the industrial automation system, network-related devices (e.g., communication devices, computers, routers, etc.) associated with the industrial automation system, functional and communicative relationships between industrial devices, industrial processes, network-related devices, etc. (e.g., communication connections or conditions between industrial devices, types of connections between industrial devices, communication connections between industrial devices and network-related devices, etc.), mechanical or process properties or characteristics associated with industrial devices (e.g., mechanical latency, process cycle times, operating schedules, etc., associated with industrial devices), human behavior or interaction in connection with the industrial automation system (e.g., maintenance schedules, shift-specific or operator-specific behavior or interaction of operators with the industrial automation system), production or process flows of the industrial automation system at particular times or in connection with particular projects, and/or other aspects or features of the industrial automation system.

At 1104, a simulation model that can simulate the industrial automation system can be generated based on the simulation or emulation of the industrial automation system. The simulation generator component can generate a simulation model that can simulate the industrial automation system based on the respective simulations or emulations of the various portions (e.g., industrial devices, software, firmware, etc.) of the industrial automation system. For example, the simulation generator component use the simulation or emulation of the industrial automation system, including the simulations or emulations of the respective industrial devices, software and/or firmware configurations, network devices, functional and communicative relationships between industrial devices or processes, mechanical or process properties or characteristics, human behavior or interaction in connection with the industrial automation system, production or process flows of the industrial automation system at particular times or in connection with particular projects, to facilitate generating the simulation model for the industrial automation system.

Figure 12:
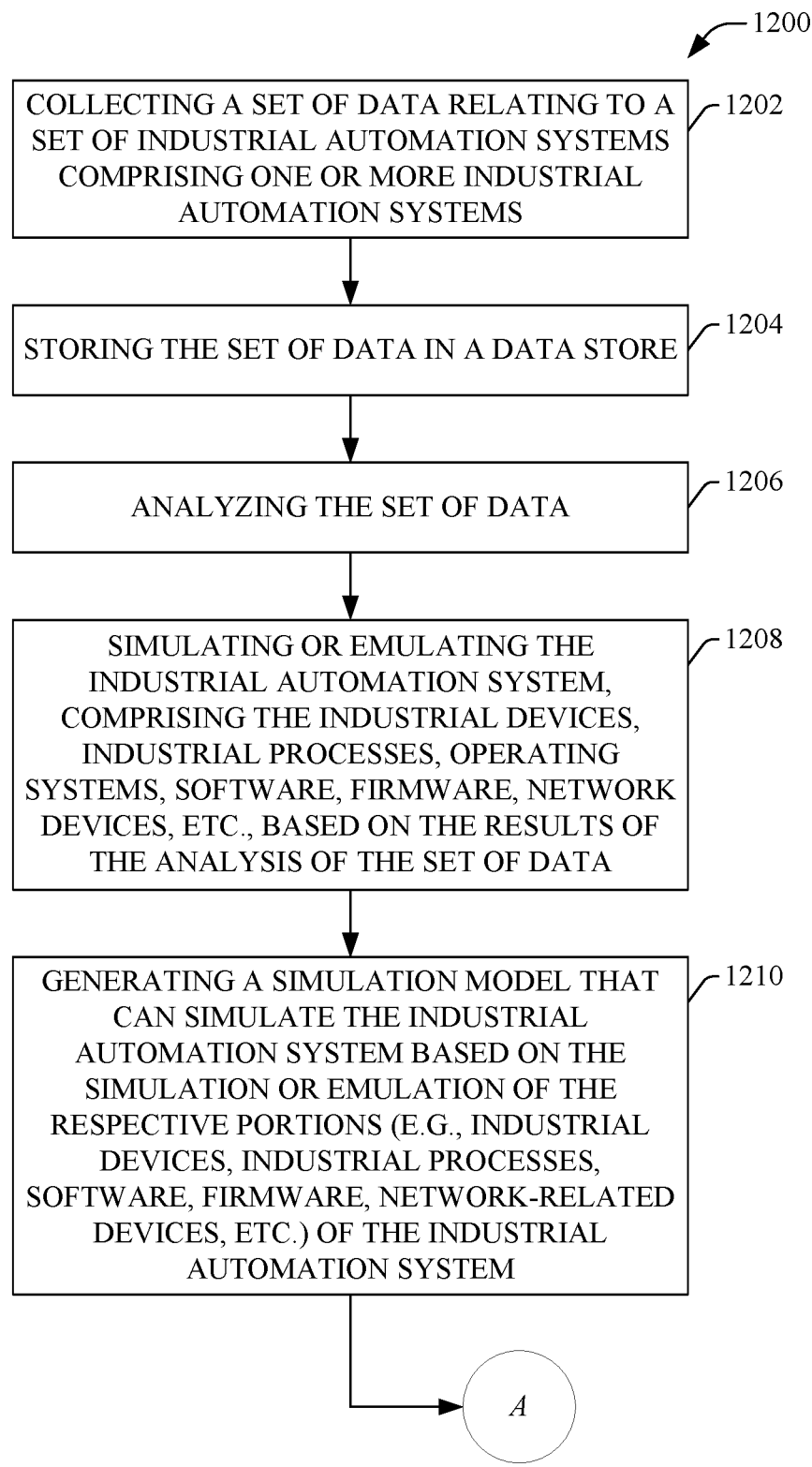
FIG. 12 depicts a flow diagram of an example method that can facilitate simulating an industrial automation system of a set of industrial automation systems based on cloud-based data relating to the set of industrial automation systems, in accordance with various aspects and embodiments of the disclosed subject matter.

FIG. 12 depicts a flow diagram of an example method 1200 that can facilitate simulating an industrial automation system of a set of industrial automation systems based on cloud-based data relating to the set of industrial automation systems, in accordance with various aspects and embodiments of the disclosed subject matter. The method 1200 can be implemented by a simulation generation system that can comprise a simulation generator component and/or another component(s) (e.g., a collection component, a cloud-based data store, etc.).

At 1202, a set of data relating to a set of industrial automation systems comprising one or more industrial automation systems can be collected. The simulation generation system can comprise a collection component that can collect the set of data relating to the set of industrial automation systems. The set of data can comprise data relating to industrial devices, assets, industrial processes, and network devices, associated with the one or more industrial automation systems of the set of industrial automation systems. The set of industrial automation systems can be associated with one or more industrial enterprises.

In some implementations, all or part of the simulation generation system can be located in a cloud platform. For example, simulation generator component, the collection component, data store (e.g., cloud-based data store), and/or another component(s) of the simulation generation system can be located in the cloud platform. In other implementations, certain components (e.g., simulation generator component or collection component) can be located outside of the cloud platform and can access the cloud platform (e.g., the data store in the cloud platform) to facilitate analyzing the data in the data store to facilitate simulating an industrial automation system of the set of industrial automation systems.

At 1204, the set of data can be stored in a data store. The collection component can facilitate storing the set of data in the data store, wherein the data store can be a cloud-based data store located in the cloud platform.

At 1206, the set of data can be analyzed. The simulation generator component can access the cloud-based data store and can retrieve, obtain, read the set of data from the cloud-based data store. The simulator generator component can analyze the set of data (e.g., perform big data analysis on the set of data) to facilitate simulating the industrial automation system. The simulation generator component can analyze the set of data to facilitate identifying or determining industrial devices, industrial processes, operating systems, software (e.g., software type, software version, software functions, software manufacturer, etc.), firmware (e.g., firmware type, firmware version, firmware functions, firmware manufacturer, etc.), network devices, etc., associated with the industrial automation system; identifying or determining configuration of the industrial devices, industrial processes, operating systems, software, firmware, and network devices, including the functional relationships or connections between respective industrial devices, industrial processes, operating systems, software, firmware, and network devices; respective properties or characteristics associated with the respective industrial devices, industrial processes, operating systems, software, firmware, and network devices; etc.

At 1208, the industrial automation system, comprising the industrial devices, industrial processes, operating systems, software, firmware, network devices, etc., can be simulated or emulated based on the results of the analysis of the set of data. The simulation generator component can simulate or emulate the industrial automation system, including simulating or emulating the industrial devices, software and/or firmware configurations (including software or firmware revisions or updates) associated with the industrial devices and/or other components of the industrial automation system, network-related devices (e.g., communication devices, computers, routers, etc.) associated with the industrial automation system, functional and communicative relationships between industrial devices, industrial processes, network-related devices, etc. (e.g., communication connections or conditions between industrial devices, types of connections between industrial devices, communication connections between industrial devices and network-related devices, etc.), mechanical or process properties or characteristics associated with industrial devices (e.g., mechanical latency, process cycle times, operating schedules, etc., associated with industrial devices), properties or characteristics associated with the network-related devices (e.g., communication conditions, total bandwidth, available bandwidth, wireless communications, wireline communications, etc., associated with the network-related devices), human behavior or interaction in connection with the industrial automation system (e.g., maintenance schedules, shift-specific or operator-specific behavior or interaction of operators with the industrial automation system), production or process flows of the industrial automation system at particular times or in connection with particular projects, and/or other aspects or features of the industrial automation system.

In some implementations, a subset of the data can relate to operation of a portion (e.g., industrial device, industrial process, software, firmware, network-related device, etc.) of a second industrial automation system of the set of industrial automation systems. The simulation generator component can analyze the subset of the data to facilitate simulating or emulating a same or similar portion of the industrial automation system. For example, the portion of the second industrial automation system can be an industrial device, wherein the industrial automation system can comprise a same or similar industrial device. The simulation generator component can analyze the subset of the data, and/or another subset of the set of data (e.g., data relating to the same or similar industrial device of the industrial automation system), and can simulate or emulate the industrial device based on the analysis of the subset of the data and/or the other subset of the data.

At 1210, a simulation model that can simulate the industrial automation system can be generated based on the simulation or emulation of the respective portions (e.g., industrial devices, industrial processes, software, firmware, network-related devices, etc.) of the industrial automation system. The simulation generator component can generate the simulation model, which can simulate the operation of the industrial automation system (e.g., in response to applied input data relating to operation of the industrial automation system) based on the simulation or emulation of the respective portions (e.g., industrial devices, industrial processes, software, firmware, network-related devices, etc.) associated with the industrial automation system.

At this point, the method 1200 can proceed to reference point A, wherein the generated simulation model can be used to facilitate evaluating modifications to the industrial automation system that are being considered, determining whether a modification is to be made to an industrial automation system, and/or other features or aspects of the disclosed subject matter, such as those features and aspects of the disclosed subject matter described herein with regard to method 1300, method 1400, method 1500, method 1600, and/or method 1700.

Information relating to the simulation model can be stored in the cloud-based data store or another desired data store, wherein the simulation generator component can access the simulation model from the cloud-based data store or other data store, and can use the simulation model to simulate operation of the associated industrial automation system, for example, in response to application of data, such as operational data relating to the industrial automation system, to the simulation model.

Figure 13:
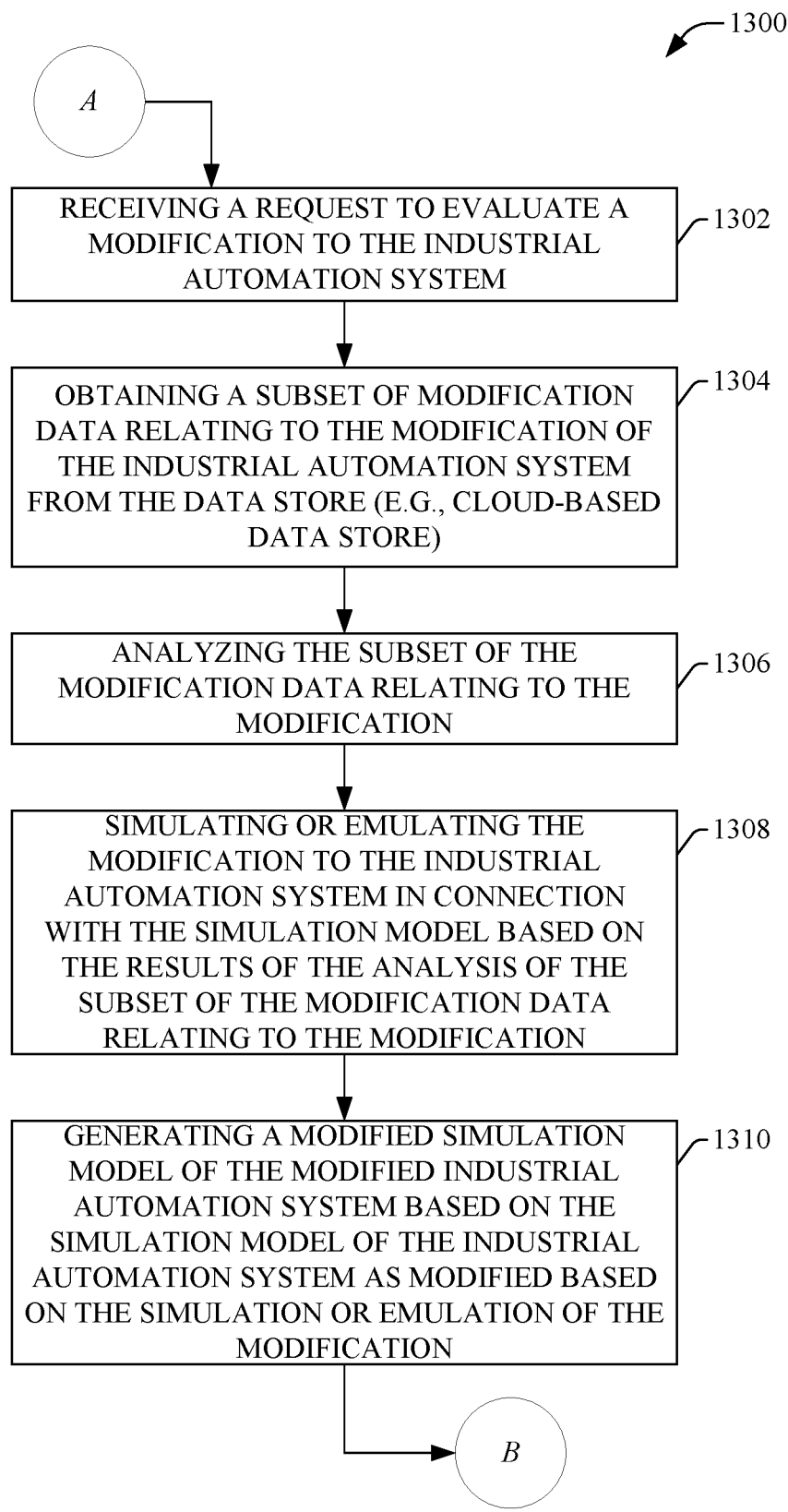
FIG. 13 presents a flow diagram of an example method that can facilitate simulating a modification to an industrial automation system of a set of industrial automation systems based on cloud-based data relating to the set of industrial automation systems, in accordance with various aspects and embodiments of the disclosed subject matter.

FIG. 13 presents a flow diagram of an example method 1300 that can facilitate simulating a modification to an industrial automation system of a set of industrial automation systems based on cloud-based data relating to the set of industrial automation systems, in accordance with various aspects and embodiments of the disclosed subject matter. The method 1300 can be implemented by a simulation generation system that can comprise a simulation generator component and/or another component(s) (e.g., a collection component, a cloud-based data store, etc.). In some implementations, the method 1300 can proceed from reference point A of method 1200, wherein a simulation model that can simulate an industrial automation system has been generated, in accordance with the method 1500.

At 1302, a request to evaluate a modification to the industrial automation system can be received. The simulation generator component can receive a request to evaluate a modification to the industrial automation system that is being considered. The modification can relate to a change of an industrial device or a change of a configuration of an industrial device, a change of an industrial process, a change or update of software, a change or update of firmware, and/or a change of a network-related device or a change of a configuration of a network-related device, etc., associated with the industrial automation system.

At 1304, a subset of modification data relating to the modification of the industrial automation system can be obtained from the data store (e.g., cloud-based data store). A subset of modification data relating to the modification can be stored in the cloud-based data store and/or the simulation generator component can generate a subset of modification data relating to the modification. The subset of modification data can comprise, for example, information relating to the functions, features, characteristics, properties, etc., of the object (e.g., industrial device, industrial process, software, firmware, network-related device, etc.) associated with the modification.

At 1306, the subset of the modification data relating to the modification can be analyzed. The simulation generator component can analyze the subset of the modification data in connection with the simulation model associated with the industrial automation system (e.g., as generated using the method 1200) to facilitate simulating or emulating the modification in connection with generating a modified simulation model of the industrial automation system as modified based on the modification.

At 1308, the modification to the industrial automation system can be simulated or emulated in connection with the simulation model based on the results of the analysis of the subset of the modification data relating to the modification. The simulation generator component can simulate or emulate the modification to the industrial automation system based on the results of the analysis of the subset of the modification data. For instance, the simulation generator component can simulate or emulate the modification to the industrial automation system, including simulating or emulating the interrelationship of the modification with the other portions of the industrial automation system.

At 1310, a modified simulation model of the modified industrial automation system can be generated based on the simulation model of the industrial automation system as modified based on the simulation or emulation of the modification. The simulation generator component can generate the modified simulation model of the industrial automation system as modified based on the simulation or emulation of the modification.

At this point, the method 1300 can proceed to reference point B, wherein, for example, the modified simulation model of the modified industrial automation system can be used to facilitate determining whether the modification is to be made to the industrial automation system (e.g., in accordance with method 1400, method 1500, or method 1600).

Figure 14:
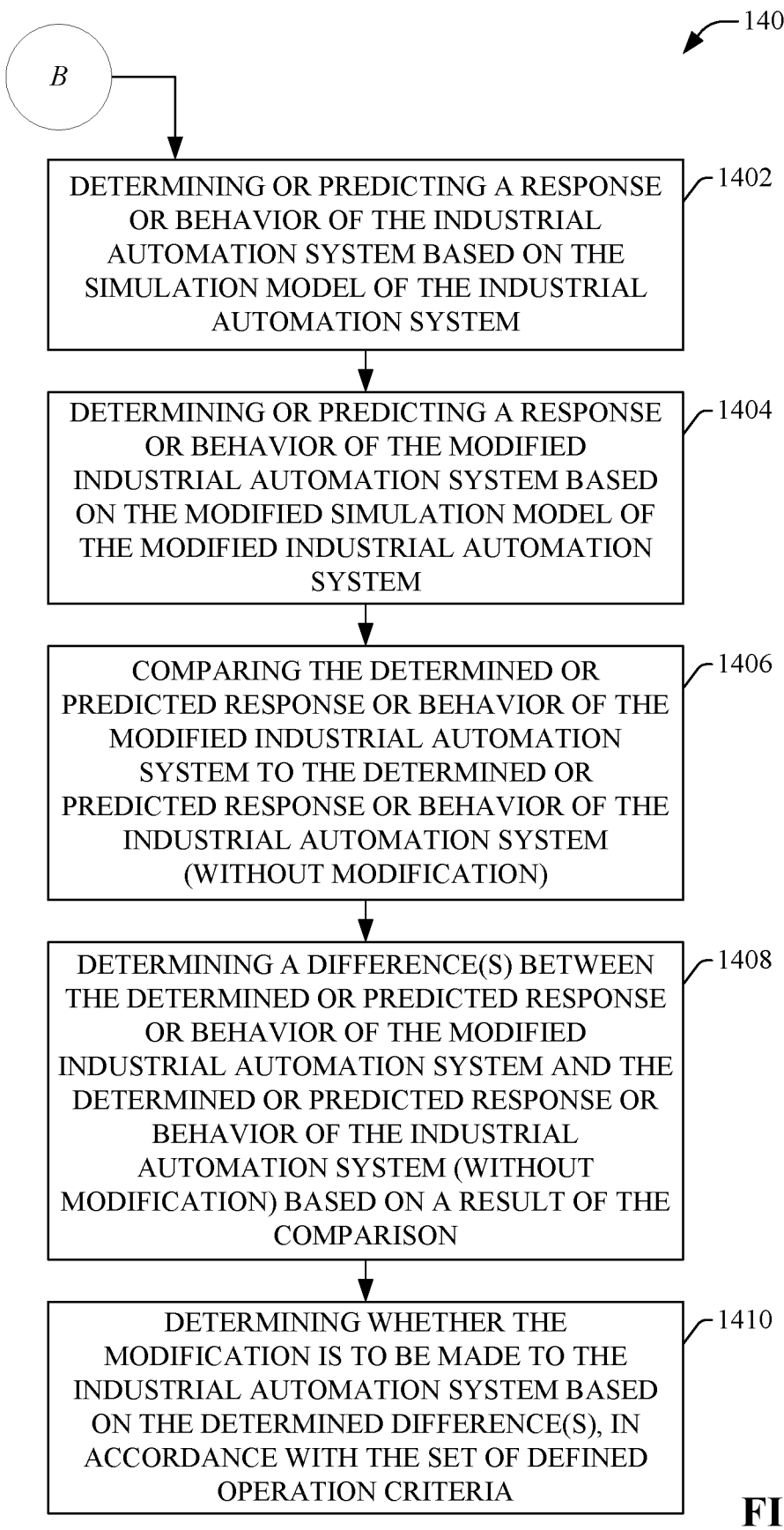
FIG. 14 presents a flow diagram of an example method that can facilitate determining whether to modify an industrial automation system based on the modified simulation model associated with the industrial automation system, in accordance with various aspects and embodiments of the disclosed subject matter.

FIG. 14 presents a flow diagram of an example method 1400 that can facilitate determining whether to modify an industrial automation system based on the modified simulation model associated with the industrial automation system, in accordance with various aspects and embodiments of the disclosed subject matter. The method 1400 can be implemented by a simulation generation system that can comprise a simulation generator component and/or another component(s) (e.g., a collection component, a cloud-based data store, etc.). In some implementations, the method 1400 can proceed from reference point B of method 1300, wherein a modified simulation model that can simulate a modified industrial automation system can be generated (e.g., based on the subset of modification data relating to the modification, which can be stored in the cloud-based data store), for example, in accordance with the method 1300.

At 1402, a response or behavior of the industrial automation system can be determined or predicted based on the simulation model of the industrial automation system. The simulation generator component can determine or predict a response or behavior of the industrial automation system, or a portion thereof, based on the simulation model (e.g., as generated in accordance with the method 1200). For example, the simulator generator component can apply a set of operation data (e.g., real or simulated operation data) relating to operation of the industrial automation system to the simulation model. The simulator generator component can analyze the simulated operation of the simulation model and can determine or predict the response or behavior of the industrial automation system, or a portion thereof, based on the simulated operation of the simulation model via application of the set of operation data to the simulation model.

At 1404, a response or behavior of the modified industrial automation system can be determined or predicted based on the modified simulation model of the modified industrial automation system. The simulation generator component can determine or predict the response or behavior of the modified industrial automation system, or a portion thereof, based on the modified simulation model. For example, the simulator generator component can apply the set of operation data relating to operation of the modified industrial automation system to the modified simulation model. The simulator generator component can analyze the simulated operation of the modified simulation model and can determine or predict the response or behavior of the modified industrial automation system, or a portion thereof, based on the simulated operation of the modified simulation model via application of the set of operation data to the modified simulation model.

At 1406, the determined or predicted response or behavior of the modified industrial automation system can be compared to the determined or predicted response or behavior of the industrial automation system (without modification). The simulator generator component can compare the determined or predicted response or behavior of the modified industrial automation system to the determined or predicted response or behavior of the industrial automation system (without modification).

At 1408, a difference(s) between the determined or predicted response or behavior of the modified industrial automation system and the determined or predicted response or behavior of the industrial automation system (without modification) can be determined based on a result of the comparison of the determined or predicted response or behavior of the modified industrial automation system to the determined or predicted response or behavior of the industrial automation system (without modification). The simulator generator component can determine or identify the difference(s) between the determined or predicted response or behavior of the modified industrial automation system and the determined or predicted response or behavior of the industrial automation system (without modification). For example, the simulator generator component can determine or identify an improvement in operation of the industrial automation system based on the modification, a diminution of the performance of the industrial automation system based on the modification as compared to the performance of the industrial automation system without the modification, or another difference(s) between the determined or predicted response or behavior of the modified industrial automation system and the determined or predicted response or behavior of the industrial automation system (without modification).

At 1410, it can be determined whether the modification is to be made to the industrial automation system based on the difference(s) between the determined or predicted response or behavior of the modified industrial automation system and the determined or predicted response or behavior of the industrial automation system (without modification), in accordance with the set of defined operation criteria. The simulator generator component can determine whether the modification is to be made to the industrial automation system based on the difference(s) between the determined or predicted response or behavior of the modified industrial automation system and the determined or predicted response or behavior of the industrial automation system (without modification), in accordance with the set of defined operation criteria. For example, in response to determining that the modification to the industrial automation system is determined or predicted to result in a defined level of improvement in performance over the unmodified industrial automation system, in accordance with the set of defined operation criteria, the simulation generator component can determine that the modification is to or should be made to the industrial automation system, and can generate a report indicating that the modification to the industrial automation system is appropriate and/or recommended.

Figure 15:
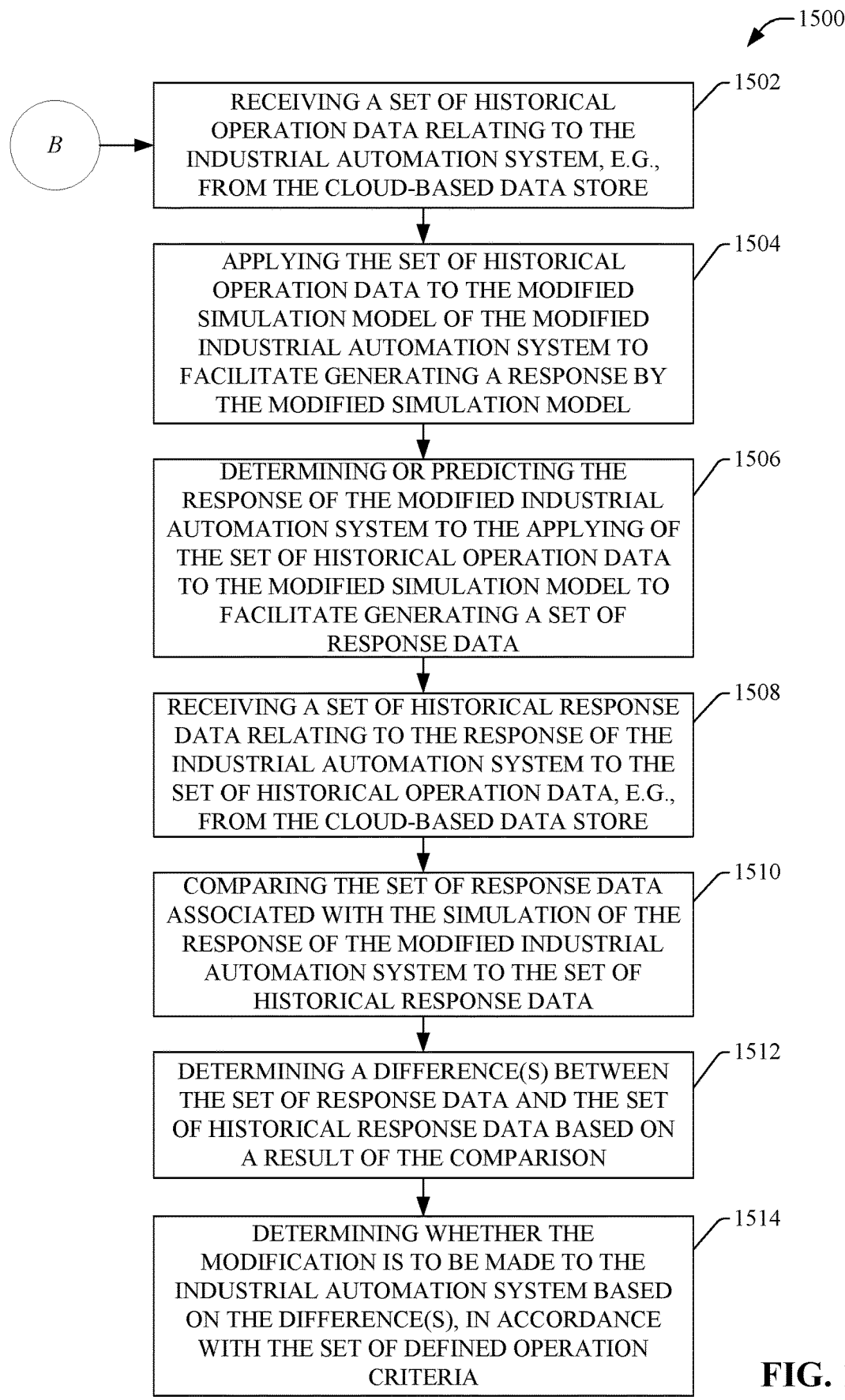
FIG. 15 illustrates a flow diagram of another example method that can facilitate determining whether to modify an industrial automation system based on the modified simulation model associated with the industrial automation system, in accordance with various aspects and embodiments of the disclosed subject matter.

FIG. 15 illustrates a flow diagram of another example method 1500 that can facilitate determining whether to modify an industrial automation system based on the modified simulation model associated with the industrial automation system, in accordance with various aspects and embodiments of the disclosed subject matter. The method 1500 can be implemented by a simulation generation system that can comprise a simulation generator component and/or another component(s) (e.g., a collection component, a cloud-based data store, etc.). In some implementations, the method 1500 can proceed from reference point B of method 1300, wherein a modified simulation model that can simulate a modified industrial automation system can be generated, in accordance with the method 1300.

At 1502, a set of historical operation data relating to the industrial automation system can be received, for example, from the cloud-based data store. The simulation generator component can access the cloud-based data store, and can obtain, retrieve, or read the set of historical operation data from the cloud-based data store.

At 1504, the set of historical operation data can be applied to the modified simulation model of the modified industrial automation system to facilitate generating a response by the modified simulation model based on (e.g., in response to application of) the set of historical operation data. The simulation generator component can apply the set of historical operation data to the modified simulation model. The modified simulation model can produce a response based on the applying of the set of historical operation data to the modified simulation model.

At 1506, the response of the modified industrial automation system to the applying of the set of historical operation data to the modified simulation model can be determined or predicted to facilitate generating a set of response data. The simulation generator component can determine or predict the response or behavior of the modified industrial automation system, or a portion thereof, based on the applying of the set of historical operation data to the modified simulation model. For example, the simulator generator component can analyze the simulated operation of the modified simulation model in response to the applying of the set of historical operation data to the modified simulation model. Based in part on the results of this analysis, the simulator generator component can determine or predict the response or behavior of the modified industrial automation system, or a portion thereof, based on the simulated operation of the modified simulation model.

At 1508, a set of historical response data relating to the response of the industrial automation system to the set of historical operation data can be received, for example, from the cloud-based data store. The simulation generator component can access the cloud-based data store, and can obtain, retrieve, or read the set of historical response data from the cloud-based data store. The set of historical response data can be data relating to the response of the industrial automation system or a prior version of the industrial automation system to the set of historical operation data, for example.

At 1510, the set of response data associated with the simulation of the response of the modified industrial automation system can be compared to the set of historical response data. The simulation generator component can compare the set of response data associated with the simulation of the response of the modified industrial automation system to the set of historical response data to facilitate determining the difference between the responses.

At 1512, a difference(s) between the set of response data and the set of historical response data can be determined based on a result of the comparison of the set of response data to the set of historical response data. The simulator generator component can determine or identify the difference(s) between the set of response data and the set of historical response data based on the comparison result. For example, the simulator generator component can determine or identify an improvement in operation or response of the industrial automation system in connection with the application of the set of historical operation data based on the modification, a diminution of the performance of the industrial automation system in connection with the application of the set of historical operation data based on the modification as compared to the performance of the industrial automation system (or a prior version thereof) in response to the application of the set of historical operation data, or another difference(s) between the determined or predicted operation or response of the modified industrial automation system and the operation or response of the industrial automation system (or a prior version thereof) in response to the application of the set of historical operation data.

At 1514, it can be determined whether the modification is to be made to the industrial automation system based on the difference(s) between the set of response data and the set of historical response data can be determined based on the difference(s) between the set of response data and the set of historical response data, in accordance with the set of defined operation criteria. The simulator generator component can determine whether the modification is to be made to the industrial automation system based on the difference(s) between the set of response data and the set of historical response data can be determined based on the difference(s) between the set of response data and the set of historical response data, in accordance with the set of defined operation criteria. For example, in response to determining that the modification to the industrial automation system is determined or predicted to result in a defined level of improvement in performance over the unmodified industrial automation system, in accordance with the set of defined operation criteria, the simulation generator component can determine that the modification is to or should be made to the industrial automation system, and can generate a report indicating that the modification to the industrial automation system is appropriate and/or recommended.

Figure 16:
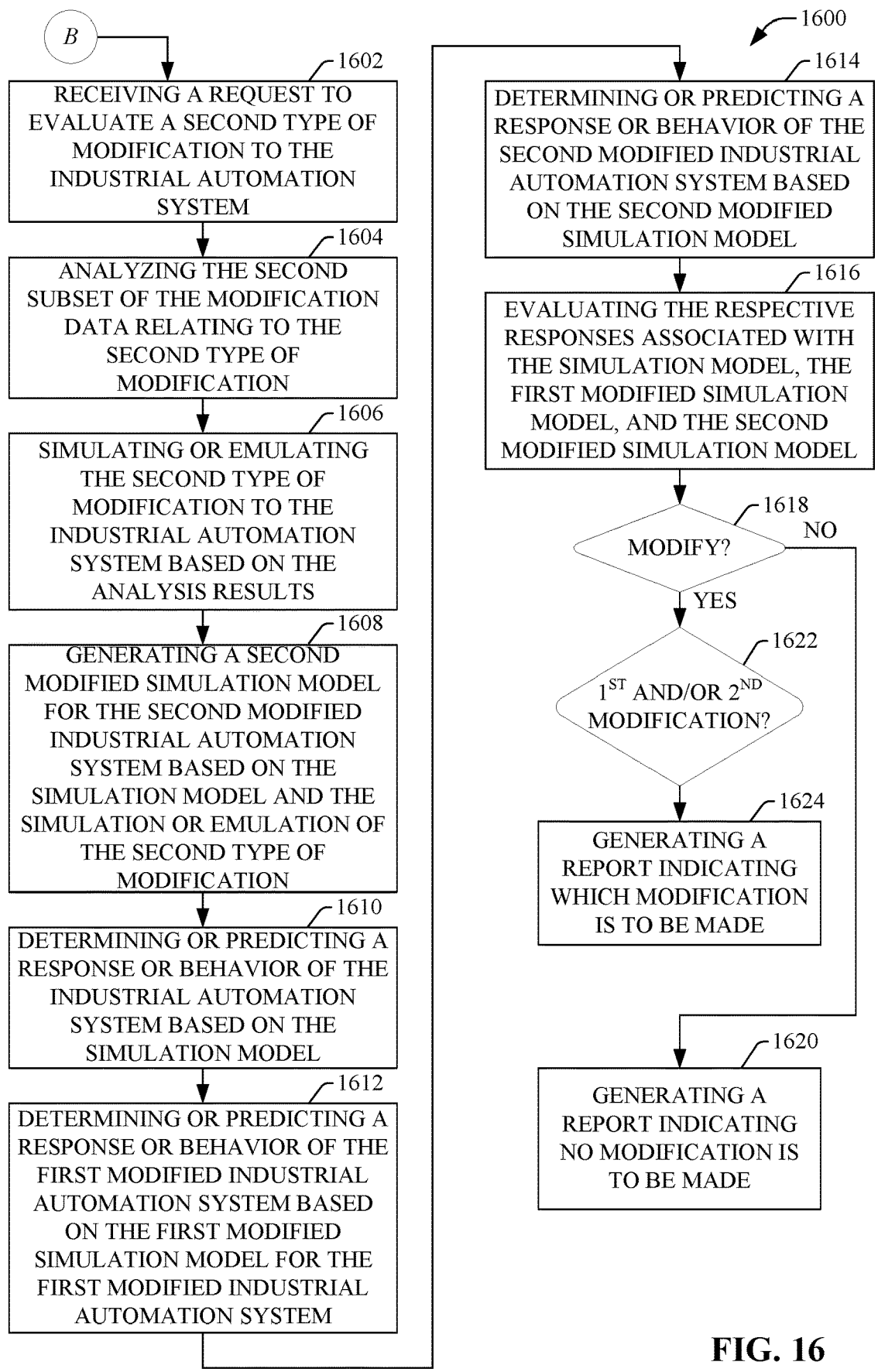
FIG. 16 depicts a flow diagram of another example method that can facilitate determining whether to modify an industrial automation system, and if so, which modification to implement, based on respective modified simulation models associated with the industrial automation system, in accordance with various aspects and embodiments of the disclosed subject matter.

FIG. 16 depicts a flow diagram of another example method 1600 that can facilitate determining whether to modify an industrial automation system, and if so, which modification to implement, based on respective modified simulation models associated with the industrial automation system, in accordance with various aspects and embodiments of the disclosed subject matter. The method 1600 can be implemented by a simulation generation system that can comprise a simulation generator component and/or another component(s) (e.g., a collection component, a cloud-based data store, etc.). In some implementations, the method 1600 can proceed from reference point B of method 1300, wherein a modified simulation model that can simulate a modified industrial automation system (e.g., based on a first modification) can be generated, in accordance with the method 1300. For instance, a first type of modification to the industrial automation system can be simulated or emulated and a first modified simulation model of the industrial automation system, if modified based on the first type of modification, can be generated, for example, in accordance with the method 1300.

At 1602, a request to evaluate a second type of modification to the industrial automation system can be received. The simulation generator component can receive a request to evaluate a second type of modification to the industrial automation system that is being considered. The request can be part of the same request as that associated with the first type of modification or can be a separate request. The second type of modification can relate to a change of an industrial device or a change of a configuration of an industrial device, a change of an industrial process, a change or update of software, a change or update of firmware, and/or a change of a network-related device or a change of a configuration of a network-related device, etc., associated with the industrial automation system. The second type of modification can be a different type of modification than that of the first type of modification.

A second subset of modification data relating to the second type of modification can be stored in the cloud-based data store and/or the simulation generator component can generate the second subset of modification data relating to the second type of modification. The second subset of modification data can comprise, for example, information relating to the functions, features, characteristics, properties, etc., of the object (e.g., industrial device, industrial process, software, firmware, network-related device, etc.) associated with the second type of modification.

At 1604, the second subset of the modification data relating to the second type of modification can be analyzed. The simulation generator component can analyze the second subset of the modification data in connection with the simulation model associated with the industrial automation system (e.g., as generated using the method 1200) to facilitate simulating or emulating the second type of modification in connection with generating a second modified simulation model of the industrial automation system as modified based on the second type of modification.

At 1606, the second type of modification to the industrial automation system can be simulated or emulated in connection with the simulation model based on the results of the analysis of the second subset of the modification data relating to the second type of modification. The simulation generator component can simulate or emulate the second type of modification to the industrial automation system based on the results of the analysis of the second subset of the modification data.

At 1608, a second modified simulation model for the second modified industrial automation system can be generated based on the simulation model of the industrial automation system as modified based on the simulation or emulation of the second type of modification. The simulation generator component can generate the second modified simulation model of the industrial automation system as modified based on the simulation or emulation of the second type of modification.

At 1610, a response or behavior of the industrial automation system can be determined or predicted based on the simulation model of the industrial automation system. The simulation generator component can determine or predict a response or behavior of the industrial automation system, or a portion thereof, based on the simulation model (e.g., as generated in accordance with the method 1200). For example, the simulator generator component can apply a set of operation data (e.g., real or simulated operation data) relating to operation of the industrial automation system to the simulation model. The simulator generator component can analyze the simulated operation of the simulation model and can determine or predict the response or behavior of the industrial automation system, or a portion thereof, based on the simulated operation of the simulation model via application of the set of operation data to the simulation model.

At 1612, a response or behavior of the first modified industrial automation system can be determined or predicted based on the first modified simulation model for the first modified industrial automation system being considered. The simulation generator component can determine or predict the response or behavior of the first modified industrial automation system, or a portion thereof, based on the first modified simulation model. For example, the simulator generator component can apply the set of operation data relating to operation of the first modified industrial automation system to the first modified simulation model. The simulator generator component can analyze the simulated operation of the first modified simulation model and can determine or predict the response or behavior of the first modified industrial automation system, or a portion thereof, based on the simulated operation of the first modified simulation model via application of the set of operation data to the first modified simulation model.

At 1614, a response or behavior of the second modified industrial automation system can be determined or predicted based on the second modified simulation model for the second modified industrial automation system being considered. The simulation generator component can determine or predict the response or behavior of the second modified industrial automation system, or a portion thereof, based on the second modified simulation model. For example, the simulator generator component can apply the set of operation data relating to operation of the second modified industrial automation system to the second modified simulation model. The simulator generator component can analyze the simulated operation of the second modified simulation model and can determine or predict the response or behavior of the second modified industrial automation system, or a portion thereof, based on the simulated operation of the second modified simulation model via application of the set of operation data to the second modified simulation model.

At 1616, the respective responses associated with the simulation model, the first modified simulation model, and the second modified simulation model can be evaluated (e.g., compared against each other). The simulator generator component can evaluate or compare the respective responses in relation to each other to facilitate determining whether any modification is to be made and/or determining which modification is to be made if a modification is to be made.

At 1618, a determination can be made regarding whether to modify the industrial automation system based on the results of the evaluation of the respective responses associated with the simulation model, the first modified simulation model, and the second modified simulation model, in accordance with the set of defined operation criteria. The simulator generator component can determine whether to modify the industrial automation system based on the results of the evaluation of the respective responses.

If it is determined that the industrial automation system is not to be or should not be modified, at 1620, a report can be generated, wherein the report can indicate that the industrial automation system is not to be or should not be modified. The simulator generator component can generate the report indicating that the industrial automation system is not to be or should not be modified in response to determining that the industrial automation system is not to be or should not be modified. For example, the simulator generator component can determine that neither the first type of modification or second type of modification satisfy the set of defined operation criteria relating to modifications of the industrial automation system, and, as a result, no modification of the industrial automation system is to be performed. The simulator generator component can generate and provide (e.g., communicate) a report that can indicate that the industrial automation system is not to be or should not be modified.

If, at 1618, it is determined that the industrial automation system is to be or should be modified, at 1622, a determination can be made regarding which of the first type of modification, the second type of modification, or a combination of the first type of modification and the second type of modification, is to be made or should be made to the industrial control system based on the evaluation results and the set of defined operation criteria. The simulator generator component can determine which of the first type of modification, the second type of modification, or the combination of the first type of modification and the second type of modification, is to be made or should be made to the industrial control system based on the evaluation results and the set of defined operation criteria.

At 1624, a report can be generated, wherein the report can indicate which of the first type of modification, the second type of modification, or the combination of the first type of modification and the second type of modification, is to be made or should be made to the industrial control system. The simulator generator component can generate the report indicating that the industrial automation system is to be or should be modified, and indicating which of the first type of modification, the second type of modification, or a combination of the first type of modification and the second type of modification, is to be made or should be made to the industrial control system. For example, the simulator generator component can determine that the first type of modification satisfies the set of defined operation criteria and the first type of modification is preferred over the second type of modification (e.g., the first type of modification is determined or predicted to result in better performance of the industrial automation system than if the second type of modification were to be made to the industrial automation system). In such instance, the simulator generator component can generate and provide (e.g., communicate) a report that can indicate that the industrial automation system is to be or should be modified based on the first type of modification.

In some implementations, when appropriate, a simulation model of the combination of the first type of modification and the second type of modification to the industrial automation system can be generated and evaluated (e.g., by the simulator generator component) in relation to the other simulation models. The simulator generator component can determine whether there is to be no modification, a modification based on the first type of modification, a modification based on the second type of modification, a modification based on a combination of the first type of modification and the second type of modification, or a modification based on a combination of a different subset of modifications, based on the results of the evaluation, in accordance with the set of defined operation criteria.

Figure 17:
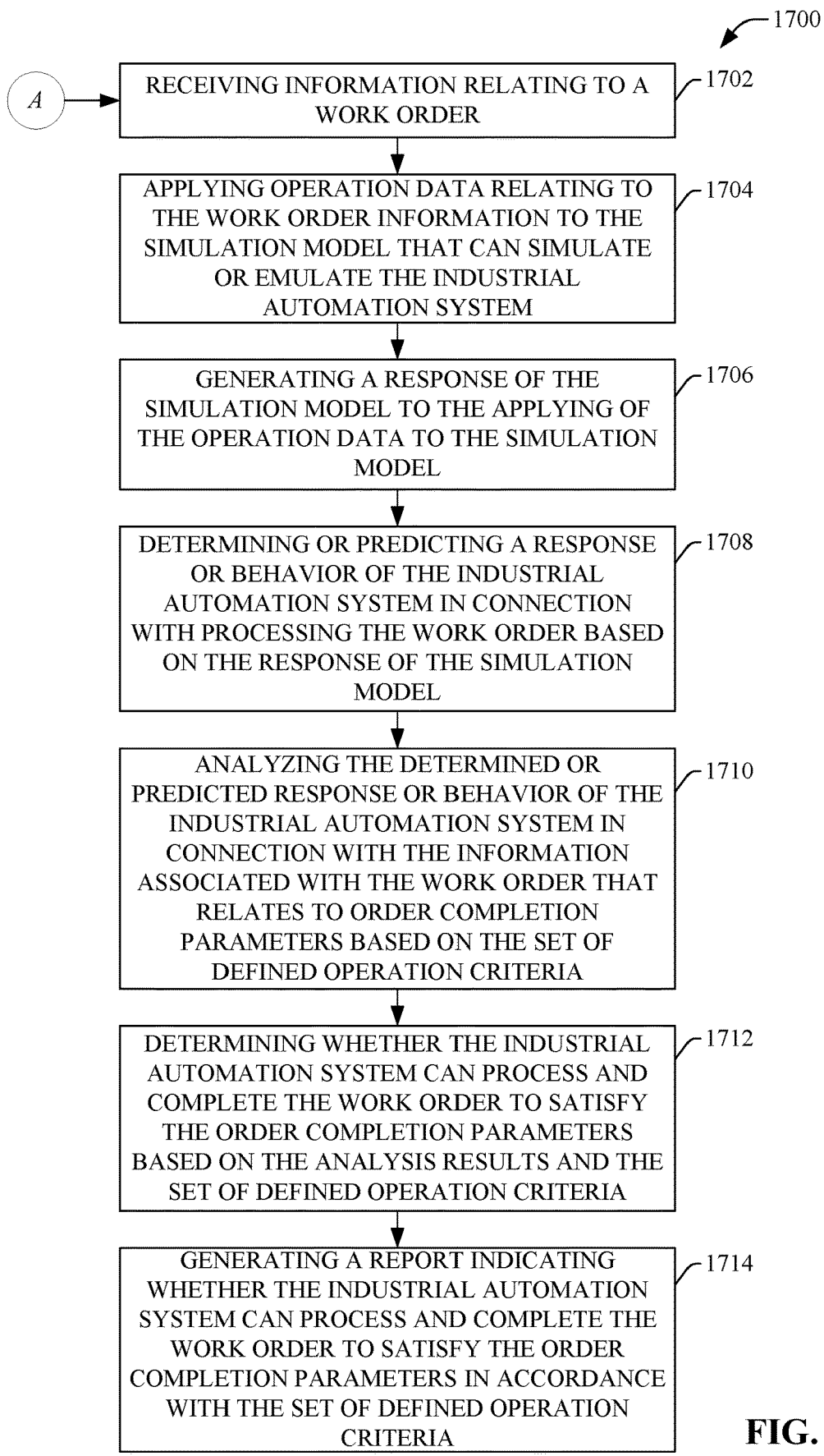
FIG. 17 presents a flow diagram of another example method that can simulate production associated with a work order, based on a simulation model of an industrial automation system, to facilitate determining or predicting a response of the industrial automation system during production associated with the work order, in accordance with various aspects and embodiments of the disclosed subject matter.

FIG. 17 presents a flow diagram of another example method 1700 that can simulate production associated with a work order, based on a simulation model of an industrial automation system, to facilitate determining or predicting a response of the industrial automation system during production associated with the work order, in accordance with various aspects and embodiments of the disclosed subject matter. The method 1700 can be implemented by a simulation generation system that can comprise a simulation generator component and/or another component(s) (e.g., a collection component, a cloud-based data store, etc.). In some implementations, the method 1700 can proceed from reference point A of method 1200, wherein a simulation model that can simulate the industrial automation system can be generated, in accordance with the method 1200.

At 1702, information relating to a work order can be received. The simulation generator component can receive a work order and/or information relating to the work order. The information can indicate various aspects or parameters relating to the work order, such as, for example, the type of product to be produced by the industrial automation system, the amount of product to be produced or number of pieces of the product to be produced, the start date or time for production of the product, the end date or time for completion of the production of the product, properties or characteristics associated with the product, components of the product, etc. If the information relating to the work order is not in condition for use to facilitate simulating operation of the industrial automation system using the corresponding simulation model, the simulator generator component can analyze and process the information relating to the work order (e.g., normalize or format work-order information, identify work-order parameters, etc.) to generate operation data relating to the work order that can be used with the simulation model to facilitate simulating processing of the work order by the industrial automation system.

At 1704, the operation data relating to the work order can be applied to the simulation model that can simulate or emulate the industrial automation system. The simulation generator component can apply the operation data relating to the work order to the simulation model to facilitate determining or predicting how the industrial automation system will respond if or when it processes the work order.

At 1706, a response of the simulation model to the applying of the operation data to the simulation model can be generated. The simulation generator component can generate a response (e.g., simulation response data) of the simulation model of the industrial automation system in response to the applying of the operation data to the simulation model.

At 1708, a response or behavior of the industrial automation system in connection with processing the work order can be determined or predicted based on the response of the simulation model. The simulation generator component can determine or predict a response or behavior of the industrial automation system in connection with processing the work order based on the response of the simulation model to the applying of the operation data relating to the work order.

At 1710, the determined or predicted response or behavior of the industrial automation system can be analyzed in connection with the information associated with the work order that relates to order completion parameters (e.g., time constraints (e.g., production start date, intermediate order deadline(s), order completion deadline, etc.), fiscal constraints (e.g., production cost constraints, profit constraints, constraints relating to the cost of operating the industrial automation system to process the work order, etc.), product quality constraints (e.g., product or material quality constraints, engineering or error tolerances, etc.), etc.) based on the set of defined operation criteria. The simulation generator component can analyze the determined or predicted response or behavior of the industrial automation system to facilitate determining whether the industrial automation system can satisfy the order completion parameters based on the set of defined operation criteria, wherein the criteria can comprise or relate to preferences or requirements of the purchaser and/or preferences or requirements of the industrial enterprise entity associated with the industrial automation system.

At 1712, a determination can be made regarding whether the industrial automation system can process and complete the work order to satisfy the order completion parameters based on the results of the analysis and the set of defined operation criteria. The simulation generator component can determine whether the industrial automation system can process and complete the work order to satisfy the order completion parameters based on the results of the analysis and the set of defined operation criteria. For example, the simulation generator component can determine that the industrial automation system can adequately or acceptably process and complete production relating to the work order if it is determined that the industrial automation system can satisfy the order completion parameters in processing and completing production on the work order in accordance with the set of defined operation criteria. If the simulator generator component determines that the industrial automation system is not able, or is not expected to be able, to satisfy the order completion parameters in processing and completing production on the work order, the simulator generator component can determine that the industrial automation system is not able to, or is not expected to be able to, adequately or acceptably process and complete production relating to the work order in accordance with the set of defined operation criteria.

At 1714, a report, which can indicate whether the industrial automation system can process and complete the work order to satisfy the order completion parameters in accordance with the set of defined operation criteria, can be generated. The simulation generator component can generate the report and can provide (e.g., transmit) the report as an output for review or analysis by another component associated with the industrial enterprise or by an operator or manager.

Embodiments, systems, and components described herein, as well as industrial control systems and industrial automation environments in which various aspects set forth in the subject specification can be carried out, can include computer or network components such as servers, clients, programmable logic controllers (PLCs), automation controllers, communications modules, mobile computers, wireless components, control components and so forth which are capable of interacting across a network. Computers and servers include one or more processors—electronic integrated circuits that perform logic operations employing electric signals—configured to execute instructions stored in media such as random access memory (RAM), read only memory (ROM), a hard drives, as well as removable memory devices, which can include memory sticks, memory cards, flash drives, external hard drives, and so on.

Similarly, the term PLC or automation controller as used herein can include functionality that can be shared across multiple components, systems, and/or networks. As an example, one or more PLCs or automation controllers can communicate and cooperate with various network devices across the network. This can include substantially any type of control, communications module, computer, Input/Output (I/O) device, sensor, actuator, and human machine interface (HMI) that communicate via the network, which includes control, automation, and/or public networks. The PLC or automation controller can also communicate to and control various other devices such as I/O modules including analog, digital, programmed/intelligent I/O modules, other programmable controllers, communications modules, sensors, actuators, output devices, and the like.

The network can include public networks such as the internet, intranets, and automation networks such as control and information protocol (CIP) networks including DeviceNet, ControlNet, and Ethernet/IP. Other networks include Ethernet, DH/DH+, Remote I/O, Fieldbus, Modbus, Profibus, CAN, wireless networks, serial protocols, and so forth. In addition, the network devices can include various possibilities (hardware and/or software components). These include components such as switches with virtual local area network (VLAN) capability, LANs, WANs, proxies, gateways, routers, firewalls, virtual private network (VPN) devices, servers, clients, computers, configuration tools, monitoring tools, and/or other devices.

Figure 18:
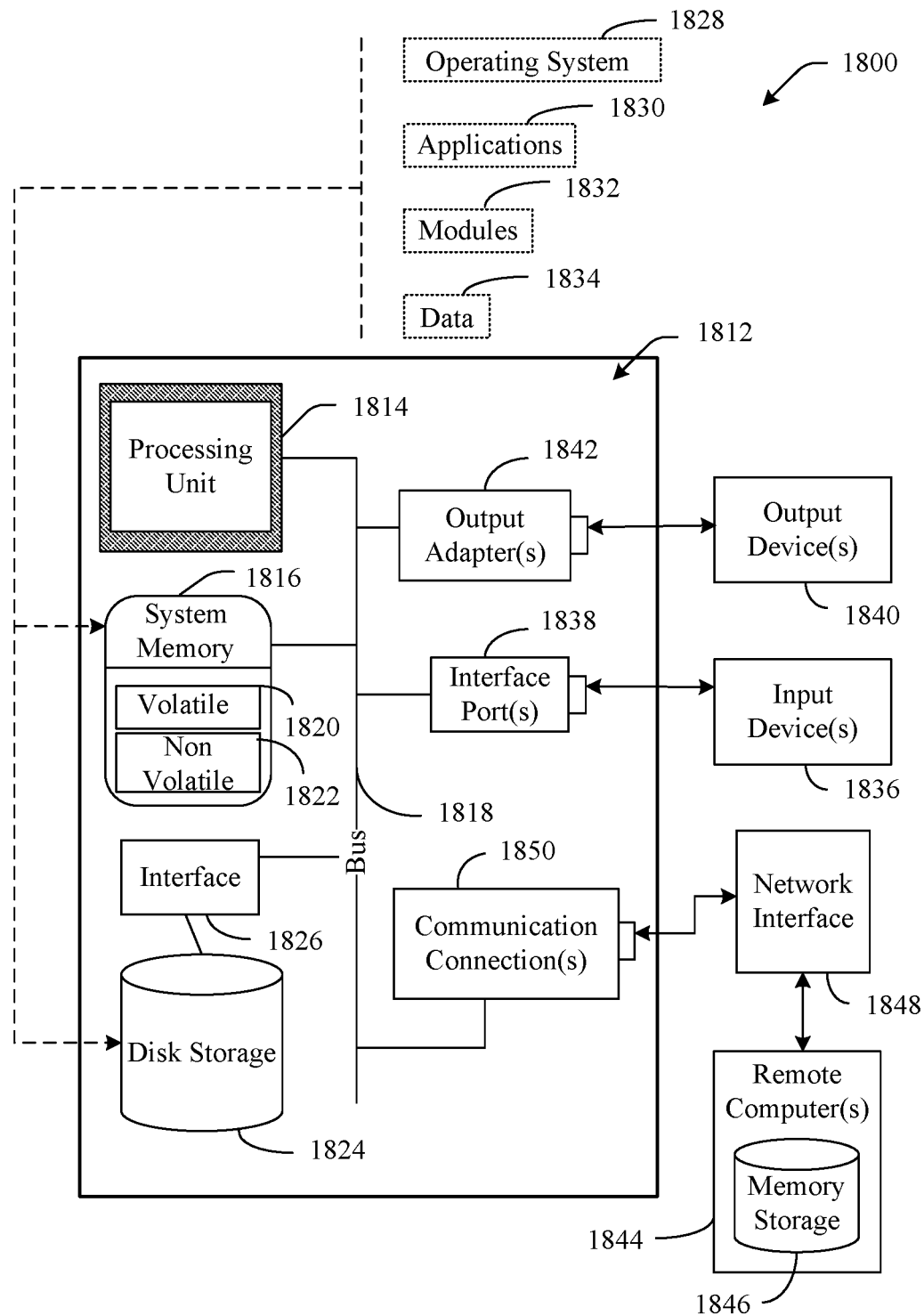
FIG. 18 is an example computing and/or operating environment.
Figure 19:
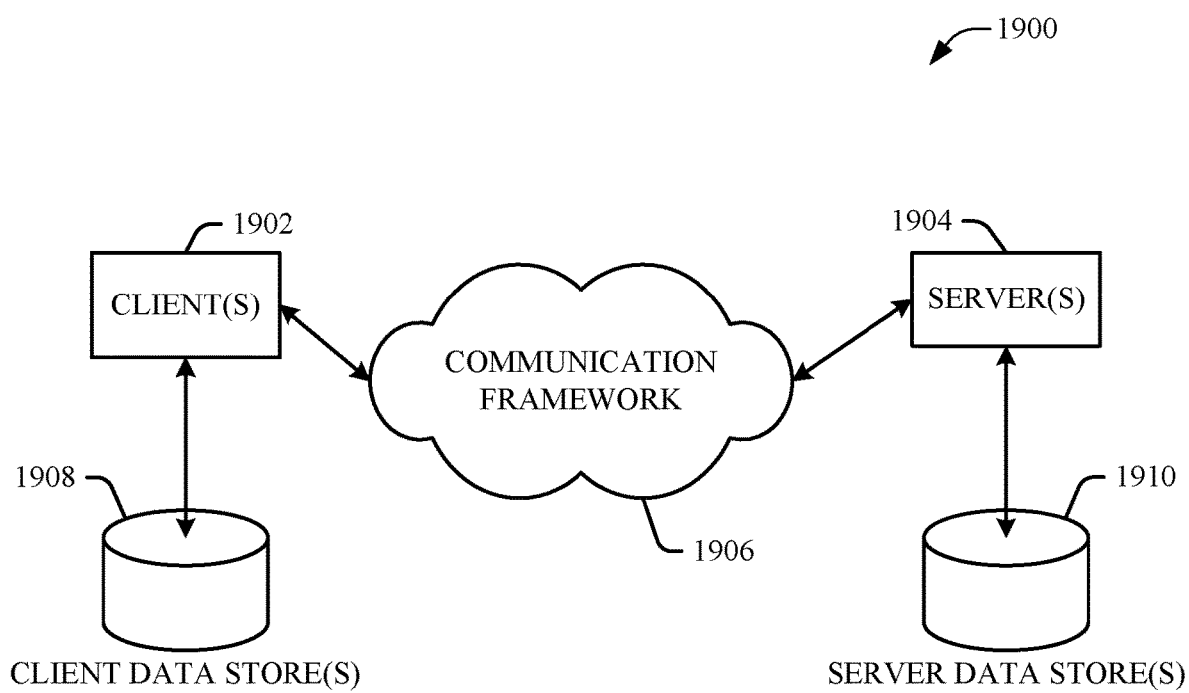
FIG. 19 is an example computing and/or networking environment.

In order to provide a context for the various aspects of the disclosed subject matter, FIGS. 18 and 19 as well as the following discussion are intended to provide a brief, general description of a suitable environment in which the various aspects of the disclosed subject matter can be implemented.

With reference to FIG. 18, an example environment 1800 for implementing various aspects of the aforementioned subject matter includes a computer 1812. The computer 1812 includes a processing unit 1814, a system memory 1816, and a system bus 1818. The system bus 1818 couples system components including, but not limited to, the system memory 1816 to the processing unit 1814. The processing unit 1814 can be any of various available processors. Multi-core microprocessors and other multiprocessor architectures also can be employed as the processing unit 1814.

The system bus 1818 can be any of several types of bus structure(s) including the memory bus or memory controller, a peripheral bus or external bus, and/or a local bus using any variety of available bus architectures including, but not limited to, 8-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

The system memory 1816 includes volatile memory 1820 and nonvolatile memory 1822. The basic input/output system (BIOS), containing the basic routines to transfer information between elements within the computer 1812, such as during start-up, is stored in nonvolatile memory 1822. By way of illustration, and not limitation, nonvolatile memory 1822 can include read only memory (ROM), programmable ROM (PROM), electrically programmable ROM (EPROM), electrically erasable PROM (EEPROM), or flash memory. Volatile memory 1820 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 1812 also includes removable/non-removable, volatile/non-volatile computer storage media. FIG. 18 illustrates, for example a disk storage 1824. Disk storage 1824 includes, but is not limited to, devices like a magnetic disk drive, floppy disk drive, tape drive, Jaz drive, Zip drive, LS-100 drive, flash memory card, or memory stick. In addition, disk storage 1824 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1824 to the system bus 1818, a removable or non-removable interface is typically used such as interface 1826.

It is to be appreciated that FIG. 18 describes software that acts as an intermediary between users and the basic computer resources described in suitable operating environment 1800. Such software includes an operating system 1828. Operating system 1828, which can be stored on disk storage 1824, acts to control and allocate resources of the computer 1812. System applications 1830 take advantage of the management of resources by operating system 1828 through program modules 1832 and program data 1834 stored either in system memory 1816 or on disk storage 1824. It is to be appreciated that one or more embodiments of the subject disclosure can be implemented with various operating systems or combinations of operating systems.

A user enters commands or information into the computer 1812 through input device(s) 1836. Input devices 1836 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1814 through the system bus 1818 via interface port(s) 1838. Interface port(s) 1838 include, for example, a serial port, a parallel port, a game port, and a universal serial bus (USB). Output device(s) 1840 use some of the same type of ports as input device(s) 1836. Thus, for example, a USB port may be used to provide input to computer 1812, and to output information from computer 1812 to an output device 1840. Output adapters 1842 are provided to illustrate that there are some output devices 1840 like monitors, speakers, and printers, among other output devices 1840, which require special adapters. The output adapters 1842 include, by way of illustration and not limitation, video and sound cards that provide a means of connection between the output device 1840 and the system bus 1818. It should be noted that other devices and/or systems of devices provide both input and output capabilities such as remote computer(s) 1844.

Computer 1812 can operate in a networked environment using logical connections to one or more remote computers, such as remote computer(s) 1844. The remote computer(s) 1844 can be a personal computer, a server, a router, a network PC, a workstation, a microprocessor based appliance, a peer device or other common network node and the like, and typically includes many or all of the elements described relative to computer 1812. For purposes of brevity, only a memory storage device 1846 is illustrated with remote computer(s) 1844. Remote computer(s) 1844 is logically connected to computer 1812 through a network interface 1848 and then physically connected via communication connection 1850. Network interface 1848 encompasses communication networks such as local-area networks (LAN) and wide-area networks (WAN). LAN technologies include Fiber Distributed Data Interface (FDDI), Copper Distributed Data Interface (CDDI), Ethernet/IEEE 802.3, Token Ring/IEEE 802.5 and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1850 refers to the hardware/software employed to connect the network interface 1848 to the system bus 1818. While communication connection 1850 is shown for illustrative clarity inside computer 1812, it can also be external to computer 1812. The hardware/software necessary for connection to the network interface 1848 includes, for exemplary purposes only, internal and external technologies such as, modems including regular telephone grade modems, cable modems and DSL modems, ISDN adapters, and Ethernet cards.

FIG. 19 is a schematic block diagram of a sample computing and/or networking environment 1900 with which the disclosed subject matter can interact. The computing and/or networking environment 1900 can include one or more clients 1902. The client(s) 1902 can be hardware and/or software (e.g., threads, processes, computing devices). The computing and/or networking environment 1900 also can include one or more servers 1904. The server(s) 1904 can also be hardware and/or software (e.g., threads, processes, computing devices). The servers 1904 can house threads to perform transformations by employing one or more embodiments as described herein, for example. One possible communication between a client 1902 and servers 1904 can be in the form of a data packet adapted to be transmitted between two or more computer processes. The computing and/or networking environment 1900 can include a communication framework 1906 that can be employed to facilitate communications between the client(s) 1902 and the server(s) 1904. The client(s) 1902 are operably connected to one or more client data stores 1908 that can be employed to store information local to the client(s) 1902. Similarly, the server(s) 1904 are operably connected to one or more server data stores 1910 that can be employed to store information local to the servers 1904.

What has been described above includes examples of the disclosed subject matter. It is, of course, not possible to describe every conceivable combination of components or methods for purposes of describing the disclosed subject matter, but one of ordinary skill in the art may recognize that many further combinations and permutations of the disclosed subject matter are possible. Accordingly, the disclosed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the disclosed subject matter. In this regard, it will also be recognized that the disclosed subject matter includes a system as well as a computer-readable medium having computer-executable instructions for performing the acts and/or events of the various methods of the disclosed subject matter.

In addition, while a particular feature of the disclosed subject matter may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

In this application, the word "exemplary" is used to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks [e.g., compact disk (CD), digital versatile disk (DVD) . . . ], smart cards, and flash memory devices (e.g., card, stick, key drive . . . ).

What is claimed is:
1. A system, comprising:
a memory that stores computer-executable components; and
a processor, operatively coupled to the memory, that executes computer-executable components, the computer-executable components comprising:
a simulation generator component configured to, based on an analysis of a subset of a set of industrial data relating to a set of devices of an industrial automation system, simulate at least one device of the set of devices to facilitate simulation of the industrial automation system, and generate a simulation model that corresponds to the industrial automation system based on the simulation of the at least one device, wherein the industrial automation system is managed based on the simulation model.

2. The system of claim 1, wherein the computer-executable components comprise a collection component configured to receive the set of industrial data associated with the set of devices and store the set of industrial data in a data store, and wherein at least one of the collection component, the simulation generator component, or the data store is part of a cloud platform.

3. The system of claim 1, wherein the simulation generator component is further configured to be associated with a cloud gateway component via a collection component or a data store, wherein the cloud gateway component is configured to communicate at least one device model that models the at least one device to the simulation generator component via the collection component or the data store, and wherein the simulator generator component is further configured to simulate the at least one device based on the at least one device model.

4. The system of claim 1, wherein the simulation generator component is further configured to be associated with a cloud gateway component via a collection component or a data store, and wherein the cloud gateway component is configured to obtain the subset of industrial data from the at least one device.

5. The system of claim 4, wherein the cloud gateway component is further configured to receive a portion of industrial data from the at least one device, process the portion of the industrial data to generate the subset of industrial data, and communicate the subset of industrial data to the simulation generator component via the collection component or the data store.

6. The system of claim 4, wherein the at least one device is an industrial device, wherein the cloud gateway component is further configured to be integrated with the industrial device, or
wherein the at least one device comprises multiple devices, and wherein the cloud gateway component is further configured to be associated with the multiple devices.

7. The system of claim 4, wherein the cloud gateway component is further configured to receive a portion of industrial data from the at least one device and, to facilitate generation of the subset of industrial data, at least one of filter the portion of the industrial data, timestamp the portion of the industrial data, format the portion of the industrial data, normalize the portion of the industrial data, summarize the portion of the industrial data, tag the portion of the industrial data with contextual metadata, or compress the portion of the industrial data, and wherein the contextual metadata relates to at least one of a time the portion of the industrial data was generated or at least one location of the at least one device within the industrial automation system.

8. The system of claim 4, wherein the cloud gateway component is further configured to determine a first location of the cloud gateway component or a second location of the at least one device associated with the cloud gateway component within a component topology associated with the industrial automation system and communicate location information indicating the first location of the cloud gateway component or the second location of the at least one device to the simulation generator component via the collection component or the data store.

9. The system of claim 4, wherein the cloud gateway component is further configured to detect a cloud component in the cloud platform, establish a communication channel between the cloud gateway component and the cloud component, and communicate the subset of industrial data to the cloud component via the communication channel, and wherein the cloud component is, or is associated with, the simulation generator component, the collection component, or the data store.

10. The system of claim 1, wherein the simulation generator component is further configured to evaluate a response of the simulation model to an application of a set of operation data relating to a work order to the simulation model, determine an industrial system response of the industrial automation system based on the response of the simulation model to the application of the set of operation data, and determine whether the industrial automation system is able to satisfy a set of conditions associated with processing or completion of the work order based on a result of an evaluation of the industrial system response of the industrial automation system.

11. The system of claim 1, wherein the simulation generator component is further configured to simulate a modification to the industrial automation system based on a set of data relating to the modification, generate a modified simulation model that corresponds to a modified industrial automation system that incorporates the modification to the industrial automation system based on the simulation of the modification, and determine whether the modification to the industrial automation system is to be performed based on the modified simulation model.

12. The system of claim 11, wherein the simulation generator component is further configured to evaluate at least one of a modification response of the modified simulation model or a response of the simulation model, based on an application of a set of operation data to at least one of the modified simulation model or the simulation model, and determine at least one of a modified industrial automation system response of the modified industrial automation system or an industrial automation system response of the industrial automation system based on the evaluation of at least one of the modification response of the modified simulation model or the response of the simulation model.

13. The system of claim 12, wherein the simulation generator component is further configured to evaluate at least one of the modified industrial automation system response of the modified industrial automation system or the industrial automation system response of the industrial automation system, and determine whether the modification to the industrial automation system is to be performed based on the evaluation of at least one of the modified industrial automation system response or the industrial automation system response.

14. A method, comprising:
simulating, by a system comprising a processor, at least one device of a set of devices of an industrial automation system, based on analyzing at least a portion of a set of industrial data associated with the set of devices, to facilitate generating a simulation model that corresponds to the industrial automation system; and managing, by the system, operation or configuration of the industrial automation system based on the simulation model.

15. The method of claim 14, further comprising:
interfacing, by the system, a cloud platform with the industrial automation system via at least one cloud gateway component associated with the set of devices, wherein the cloud platform comprises at least one of a collection component, a data store, or a simulation generator component;
monitoring, by the system, the industrial automation system via the interfacing; and
in response to the monitoring, receiving, by the system, the set of industrial data from the at least one cloud gateway component.

16. The method of claim 14, further comprising:
simulating, by the system, a modification to the industrial automation system based on a set of data relating to the modification to facilitate simulating a modified industrial automation system that comprises the modification; and
generating, by the system, a modified simulation model that corresponds to the modified industrial automation system based on the simulating of the modified industrial automation system.

17. The method of claim 16, further comprising:
evaluating, by the system, a modification response of the modified simulation model or a response of the simulation model in response to applying operation data to the modified simulation model or the simulation model; and
determining, by the system, whether to implement the modification to the industrial automation system based on the evaluating of the modification response or the response.

18. The method of claim 16, further comprising:
evaluating, by the system, modification response data relating to a modification response of the modified simulation model in response to applying historic operation data to the modified simulation model and historic response data relating to a historic response of the industrial automation system in response to applying the historic operation data to the industrial automation system; and
determining, by the system, whether to implement the modification to the industrial automation system based on the evaluating of the modification response data and the historic response data.

19. A non-transitory machine-readable storage medium storing computer-executable instructions that, in response to execution, cause a system comprising a processor to perform operations, comprising:
simulating at least one device of a set of devices of an industrial automation system, based on analyzing at least a subset of a set of industrial data associated with the set of devices, to facilitate generating a simulation model that simulates the industrial automation system, wherein the subset of industrial data relates to the at least one device; and
controlling operation or configuration of the industrial automation system based on the simulation model.

20. The non-transitory machine-readable medium of claim 19, wherein the operations further comprise:
interfacing a cloud platform with the industrial automation system via at least one cloud gateway component associated with the set of devices, wherein the cloud platform comprises at least one of a collection component, a data store, or a simulation generator component that facilitates the simulating, and wherein the set of industrial data is received from the at least one cloud gateway component.

* * * * *